United States Patent
Takahashi et al.

(10) Patent No.: US 8,279,519 B2
(45) Date of Patent: Oct. 2, 2012

(54) SEMICONDUCTOR OPTICAL MODULATOR, AN OPTICAL AMPLIFIER AND AN INTEGRATED SEMICONDUCTOR LIGHT-EMITTING DEVICE

(75) Inventors: Takashi Takahashi, Miyagi (JP); Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/882,315

(22) Filed: Sep. 15, 2010

(65) Prior Publication Data
US 2011/0026108 A1    Feb. 3, 2011

Related U.S. Application Data

(62) Division of application No. 10/935,628, filed on Sep. 8, 2004, now abandoned, which is a division of application No. 10/095,516, filed on Mar. 13, 2002, now Pat. No. 6,803,604.

(30) Foreign Application Priority Data

| Mar. 13, 2001 | (JP) | 2001-069816 |
| Mar. 13, 2001 | (JP) | 2001-070289 |
| Oct. 22, 2001 | (JP) | 2001-323209 |
| Jan. 18, 2002 | (JP) | 2002-009834 |
| Feb. 21, 2002 | (JP) | 2002-044303 |

(51) Int. Cl.
*H01S 3/00*    (2006.01)
*H01S 3/14*    (2006.01)

(52) U.S. Cl. ............... 359/344; 372/39; 372/43.01

(58) Field of Classification Search ............... 359/333, 359/342, 344; 372/39, 43.01
See application file for complete search history.

(56) References Cited

U.S. PATENT DOCUMENTS

| 5,537,634 A | * | 7/1996 | Fye ............................ 398/76 |
| 5,577,062 A | | 11/1996 | Takahashi |
| 5,583,878 A | * | 12/1996 | Shimizu et al. ............ 372/45.01 |
| 5,627,851 A | | 5/1997 | Takahashi |
| 5,684,523 A | | 11/1997 | Satoh et al. |
| 5,801,071 A | | 9/1998 | Takahashi |
| 5,805,624 A | | 9/1998 | Yang et al. |
| 5,881,079 A | | 3/1999 | Doerr et al. |
| 5,904,549 A | | 5/1999 | Sato |
| 5,923,691 A | | 7/1999 | Sato |
| 5,939,733 A | | 8/1999 | Sato |
| 6,002,700 A | | 12/1999 | Sato |
| 6,046,096 A | | 4/2000 | Ouchi |
| 6,049,556 A | | 4/2000 | Sato |
| 6,222,868 B1 | | 4/2001 | Ouchi et al. |
| 6,281,518 B1 | | 8/2001 | Sato |
| 6,300,650 B1 | | 10/2001 | Sato |
| 6,347,108 B2 | | 2/2002 | Jiang et al. |
| 6,348,698 B1 | | 2/2002 | Sato |
| 6,424,669 B1 | | 7/2002 | Jiang et al. |
| 6,449,299 B1 | | 9/2002 | Sato |
| 6,459,716 B1 | | 10/2002 | Lo et al. |

(Continued)

FOREIGN PATENT DOCUMENTS
JP    62-229891    10/1987
(Continued)

*Primary Examiner* — Jessica Stultz
*Assistant Examiner* — Phillip Nguyen
(74) *Attorney, Agent, or Firm* — Dickstein Shapiro LLP

(57) ABSTRACT

An integrated semiconductor optical-emitting device includes a surface-emission laser diode and an EA-type semiconductor optical modulator integrated commonly on a GaAs substrate in a direction perpendicular to the GaAs substrate.

4 Claims, 19 Drawing Sheets

U.S. PATENT DOCUMENTS

| | | |
|---|---|---|
| 6,535,541 B1 | 3/2003 | Boucart et al. |
| 6,542,286 B2 * | 4/2003 | Kuwatsuka ................... 359/332 |
| 6,556,610 B1 | 4/2003 | Jiang et al. |
| 6,563,851 B1 | 5/2003 | Jikutani et al. |
| 6,625,187 B1 | 9/2003 | Ikoma et al. |
| 6,697,404 B1 | 2/2004 | Sato |
| 6,859,474 B1 * | 2/2005 | Johnson et al. ............ 372/43.01 |
| 7,110,169 B1 * | 9/2006 | Walker et al. ................. 359/344 |

FOREIGN PATENT DOCUMENTS

| | | |
|---|---|---|
| JP | 04-359486 | 12/1992 |
| JP | 05-335551 | 12/1993 |
| JP | 06-021578 | 1/1994 |
| JP | 8-21932 | 1/1996 |
| JP | 8-88436 | 4/1996 |
| JP | 9-283836 | 10/1997 |
| JP | 11-46046 | 2/1999 |
| JP | 11-74607 | 3/1999 |
| JP | 11-186654 | 7/1999 |
| JP | 2000-4068 | 1/2000 |
| JP | 2000-138414 | 5/2000 |
| JP | 2000-305055 | 11/2000 |
| JP | 2000-312051 | 11/2000 |
| JP | 2001-148531 | 5/2001 |
| WO | WO 0133677 * | 5/2001 |

* cited by examiner

SEMICONDUCTOR OPTICAL MODULATOR, AN OPTICAL AMPLIFIER AND AN INTEGRATED SEMICONDUCTOR LIGHT-EMITTING DEVICE

CROSS-REFERENCE TO RELATED APPLICATIONS

This application is a divisional of application Ser. No. 10/935,628, filed Sep. 8, 2004, now abandoned which is a divisional of application Ser. No. 10/095,516, filed Mar. 13, 2002, now U.S. Pat. No. 6,803,604 issued Oct. 12, 2004, the disclosures of which are incorporated herein by reference in their entireties.

BACKGROUND OF THE INVENTION

The present invention generally relates to optical semiconductor devices. Especially, it related to optical semiconductor devices such as a semiconductor optical modulator, a semiconductor light-emitting device, a semiconductor optical amplifier, an optical source of amplitude spontaneous emission (ASE), an optical gate array; a tunable laser apparatus, a multi-wavelength laser apparatus, and also an optical transmission system that uses such an optical semiconductor device. Further, the present invention relates to the fabrication process of the optical semiconductor devices.

Japanese Laid-Open Patent Publication 10-22805 describes a semiconductor optical modulator that uses an InGaAsP multiple quantum well structure. In this reference, an InP/InGaAsP multiple quantum well structure is used as an optical modulator, and optical modulation is achieved by causing quantum confinement Stark effect in the multiple quantum well structure. In quantum confinement Stark effect, there occurs a decrease of energy bandgap between the electrons and holes forming excitons upon application of a voltage to the quantum well layer.

Thus, when a voltage is applied to a quantum well structure having zero optical absorption in the state that no voltage is applied thereto, there occurs an increase of optical absorption as a result of decreased bandgap in the quantum well layer, and there is caused optical absorption associated with such a decrease of bandgap. Thereby, there is formed an EA (electro absorption)-type optical modulator.

However, conventional EA-type semiconductor optical modulator that uses the InP/InGaAsP multiple quantum well structure has a drawback, due to the relatively small conduction band discontinuity between the InP barrier layer and the InGaAsP quantum well layer, in that the excitons are tend to be destroyed due to the leakage of electrons from the quantum well layer upon application of the voltage to the quantum well layer, wherein this problem becomes particularly serious when operating the EA modulator at high temperatures. In such a case, the magnitude of decrease of the bandgap, caused by the quantum-confinement Stark effect is reduced and hence the magnitude of change of the optical absorption. As a result, there arises a problem of severe degradation of S/N ratio of optical modulation.

Meanwhile, in the art of optical telecommunication, optical amplifiers are used extensively for compensating for the transmission loss occurring in optical fibers or for compensating for coupling loss of various optical components.

Conventionally, optical amplifiers of progressive wave type are used extensively. In an optical amplifier of progressive wave type, an optical beam incident to an end surface of the optical amplifier is amplified as it is propagated through an optical waveguide region in which a gain region, characterized by a gain with respect to optical radiation having a wavelength of the incident optical beam, is provided. Thereby, an amplified optical beam is obtained at an opposite end surface. In the gain region, holes injected from a p-side electrode and electrons injected from an n-side electrode form together a population inversion, and the incident optical beam induces stimulated emission as it is propagated through the gain region.

In the case of using a quartz optical fiber, the wavelength band of 1.2-1.6 $\mu$m is thought as the optimum wavelength for long distance optical telecommunication, in view of the minimum transmission loss at this wavelength. Japanese Laid-Open Patent Publication 9-105963 or 11-186654 describes a conventional propagating wave type semiconductor optical amplifier constructed on an InP substrate and having an InP cladding layer. According to these references, optical amplification at the wavelength of 1.3 $\mu$m or 1.5 $\mu$m is described by using a InGaAsP quantum well layer.

Thus, the conventional semiconductor optical amplifiers operable in the wavelength band of 1.2-1.6 $\mu$m have been constructed by growing a material layer of the InGaAsP system on the InP substrate. In such a system, however, there arises a problem similar to the case of the EA-type optical modulator in that, because of the relatively small conduction band discontinuity between the InGaAsP layer acting as the gain region and the InP layer acting as a carrier-blocking layer of 150-200 meV, and further in view of the Auger non-optical recombination effect, and the like, the electrons easily cause leakage from the gain region. The problem of electron leakage becomes particularly serious at high temperatures.

In the case of the InGaAsP laser diode operable at the wavelength of 1.3 $\mu$m, it should be noted that the characteristic temperature has a value of about 80K, while this value of characteristic temperature is about one-half the characteristic temperature of an AlGaAs laser diode operable at the wavelength band of 0.85 $\mu$m.

The same tendency applies also to the case of the semiconductor optical amplifier, and thus, there is a tendency that optical amplification causes saturation at high temperatures as a result of the leakage of carriers from the gain region. As a result of such a carrier leakage, it has been difficult to achieve a large optical amplification factor in the conventional semiconductor optical amplifiers particularly at high temperatures.

Thus, this problem has been a bottleneck when constructing a low-cost optical LAN system that requires semiconductor optical amplifiers without using an electronic cooling system.

SUMMARY OF THE INVENTION

Accordingly, it is a general object of the present invention to provide a novel and useful optical semiconductor device and a fabrication process thereof, as well as an optical transmission system that uses such an optical semiconductor device wherein the foregoing problems are eliminated.

Another and more specific object of the present invention is to provide a semiconductor optical device, such as an EA-type semiconductor optical modulator, a semiconductor light-emitting device, a tunable laser apparatus, a multi-wavelength laser apparatus, or an optical transmission system capable of maintaining a high S/N ratio at high temperatures and is capable of performing a high-speed modulation of 10 GHz or more.

Another object of the present invention is to provide an integrated semiconductor light-emitting device in which a surface-emission laser diode and a semiconductor optical modulator are integrated.

Another object of the present invention is to provide an integrated semiconductor light-emitting device in which a surface-emission laser diode and a semiconductor optical modulator are integrated monolithically.

Another object of the present invention is to provide an integrated semiconductor light-emitting device in which a surface-emission laser diode having a N-containing active layer and a semiconductor optical modulator having a N-containing optical absorption layer are integrated monolithically.

Another object of the present invention is to provide a semiconductor optical amplifier operable in the wavelength band of 1.2-1.6 μm and is substantially free form change of optical amplification factor with environmental temperature.

Further, the present invention provides an optical source for ASE that uses such a semiconductor optical amplifier. Furthermore, the present invention provides an optical gate array, a tunable laser apparatus, a multi-wavelength laser apparatus, and also an optical transmission system that uses such an optical semiconductor device.

Other objects and further features of the present invention will become apparent from the following detailed description when read in conjunction with the attached drawings.

DETAILED DESCRIPTION OF THE INVENTION

[First Mode of Invention]

Figure 1A:
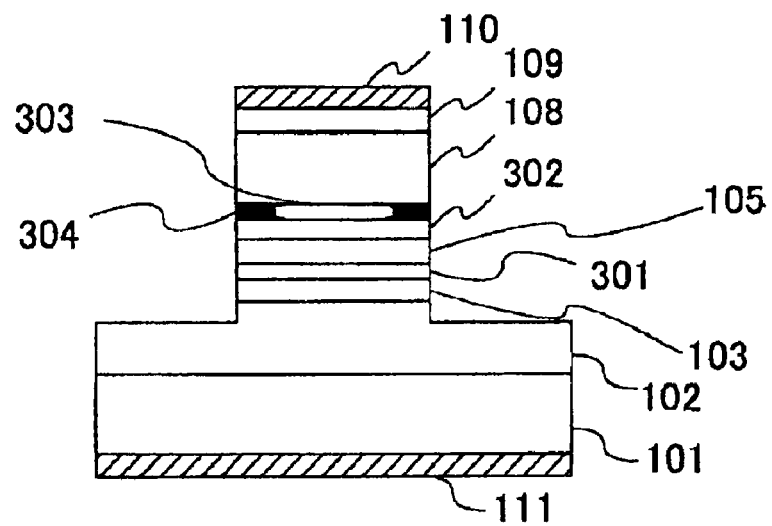
FIGS. 1A and 1B show the construction of an optical modulator according to an embodiment of the present invention.

In a first mode, the present invention provides an EA-type semiconductor optical modulator having an optical absorption layer of multiple quantum well structure and p-side and n-side electrodes applying an electric field to said optical absorption layer, wherein the multiple quantum well structure includes a quantum well layer of a material selected from the group consisting of: GaNAs, GaInNAs, GaNAsSb and GaInNAsSb and a barrier layer of a material selected from the group consisting of: GaAs, GaInP and GaInAsP.

In the mixed crystal of a III-V material containing As and N as the group V element, such as GaNAs, GaInNAs, GaNAsSb and GaInNAsSb, it is known that a large band discontinuity is achieved for the conduction band as compared with the valence band when the III-V mixed crystal is used to form a heterojunction with any of GaAs, GaInAsP or GaInP.

Further, in the present invention, it is possible to construct the semiconductor optical modulator on a GaAs substrate, and thus, it becomes possible to use a widegap material such as GaInASP or GaInP for the barrier layer. In the case of using a conventional InP substrate, InAlAs has been used as the material of the barrier layer that provides the largest bandgap and providing lattice matching with the InP substrate. According to the present invention, therefore, it is possible to improve the confinement of electrons into the quantum well layer as compared with the conventional device, and the problem of dissociation of excitons is effectively suppressed even when the semiconductor optical modulator is operated in a high temperature environment.

Because of the improved carrier confinement in the quantum well layer, a large change of bandgap is secured as a result of the quantum confinement Stark effect even when the optical modulator is operated under a high temperature environment. Thus, there occurs no decrease of S/N ratio at high temperatures in the semiconductor optical modulator of the present embodiment.

In the conventional semiconductor optical modulator constructed on an InP substrate, the large band discontinuity appearing at the valence band provides excessively strong confinement of holes and the holes having a large effective mass are tend to be accumulated in the quantum well layer. When this occurs there is caused degradation of the modulation performance.

In the case of using a mixed crystal such as GaNAs, GaInNAs, GaNAsSb, GaInNAsSb, and the like, that contains As and N as the group V element, it is known that there occurs a shift of valence band edge in the downward direction with increase of N content. Thus, in the case a heterojunction is formed with a barrier layer such as GaAs, GaInAsP or GaInP, it is possible to suppress the unwanted increase of the valence band discontinuity. Thereby, the problem of accumulation of holes in the quantum well layer is eliminated and high-speed modulation of 10 GHz or more becomes possible.

Meanwhile, it is known that N and Al are chemically reactive and there tends to occur segregation of N at the interface between the quantum well layer and the barrier layer in the case a quantum well layer containing N as a constituent element and a barrier layer containing Al as a constituent element are grown in direct contact with each other. Thus, the present invention avoids such a problem of N segregation by employing Al-free material such as GaAs, GaInAsP or GaInP for the barrier layer. Thereby, a high crystal quality is guaranteed for the active layer.

It should be noted that the barrier layer of GaAs, GaInAsP or GaInP may further contain other III-V element such as B, N or Sb.

<Embodiment 1>

Figure 1B:
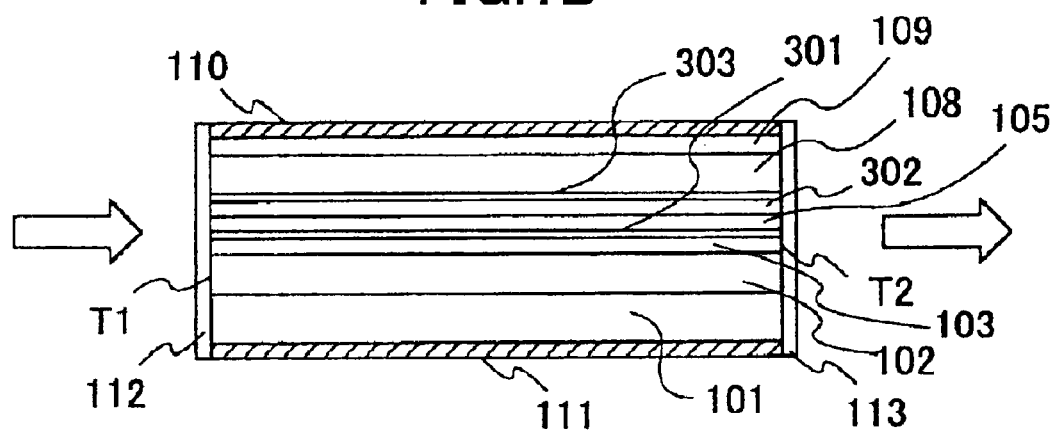

FIGS. 1A and 1B show the construction of a semiconductor optical modulator according to Embodiment 1 of the present invention, wherein FIG. 1A shows the semiconductor optical modulator in a front end view while FIG. 1B shows the semiconductor optical modulator in a longitudinal cross-sectional view.

Referring to FIGS. 1A and 1B, the semiconductor optical modulator is constructed on an n-type GaAs substrate 101 and includes a lower cladding layer 102 of n-type. AlGaAs having a composition of $Al_{0.4}Ga_{0.6}As$ and grown epitaxially on the substrate 101, a lower optical waveguide layer 103 of GaAs grown epitaxially on the cladding layer 102 and a multiple quantum well structure 301 grown epitaxially on the lower optical waveguide layer 103.

On the multiple quantum well structure 301, an upper optical waveguide layer 105 of GaAs is grown epitaxially, and a first upper cladding layer 302 of p-type AlGaAs having a composition represented as $Al_{0.4}Ga_{0.6}As$, a p-type AlAs selective-oxidation layer 303, a second cladding layer 304 of p-type AlGaAs having a composition represented as $Al_{0.4}Ga_{0.6}As$, and a cap layer 305 of p-type GaAs are grown consecutively and epitaxially.

In the structure of FIGS. 1A and 1B, the multiple quantum well layer 301 is formed of alternate stacking of a quantum well layer of GaInNAs and a barrier layer of GaInP repeated three times.

As represented in the front end view of FIG. 1A, there is formed a mesa stripe structure in the optical modulator of FIGS. 1A and 1B such that the mesa stripe structure extends in an axial direction of the optical modulator from an incident end surface T1 to an output end surface T2 of the optical modulator. As can be seen in the cross-sectional diagram of FIG. 1A, the mesa extends in the downward direction from the cap layer 109 until it reaches an intermediate position of the lower cladding layer 102, and thus, the mesa stripe structure forms a ridge waveguide structure. Further, there are formed a pair of oxide regions 304 of $AlO_x$ in the AlAs selective oxidation layer 303 by a selective oxidation process applied to the exposed lateral surface of the AlAs layer 303, such that the AlOx regions 304 sandwich the AlAs layer 303 therebetween.

On the p-type GaAs cap layer 109, there is provided a p-side electrode 110, and an n-side electrode 111 is provided on a bottom surface of the n-type GaAs substrate 101. Further, anti-reflection coatings 112 and 113 having reflectance of 0.2% or less are provided respectively on the end Surfaces T1 and T2 that are formed by a cleaving process.

In the semiconductor optical modulator, the laser beam incident to the end surface T1 experiences a modulation of optical intensity as it is guided through the optical waveguide including the multiple quantum well structure 301 that changes optical absorption coefficient upon the wavelength of the incident optical beam. The optical beam thus modulated exits from the opposing end surface T2.

In the vertical direction, it can be seen that the semiconductor optical modulator has an SCH structure characterized by the GaAs optical waveguide layers 103 and 105 vertically confined by the less-refractive cladding layers 102, 302 and 108. In the lateral direction, there occurs optical confinement into the ridge waveguide formed by the mesa etching process.

When a reverse bias voltage is applied to the multilayer quantum well structure 301 in such a semiconductor optical modulator, there occurs a decrease of energy bandgap in the multiple quantum well structure 301 as a result of the quantum confinement Stark effect, and the multiple quantum well structure, transparent to the incident optical beam in the state no bias voltage is applied thereto, starts to absorb the optical beam upon application of the bias voltage. Thus, the optical semiconductor device of FIGS. 1A and 1B function as an EA-type optical modulator.

By providing the anti-reflection coatings 112 and 113 on the end surfaces T1 and T2 in the semiconductor optical modulator of FIGS. 1A and 1B, the reflection loss of the optical beam when entering the device and when exiting from the device is successfully minimized. Further, by providing the AlOx regions 304 by the selective oxidation process of the AlAs layer 303, the current path in the semiconductor optical modulator is confined away from the mesa walls particularly in the vicinity of the multiple quantum wall structure 301, and it becomes possible to suppress the surface leakage current at the exposed lateral surface of the multiple quantum well structure 301.

It should be noted that the EA-type semiconductor optical modulator of FIGS. 1A and 1B use the GaInNAs quantum well layer on the GaAs substrate 101 as the optical absorption layer. Thus, the semiconductor optical modulator is suitable for operation in the wavelength band of 1.3-1.55 µm used commonly in optical fiber telecommunication system.

It should be noted that the GaInNAs film constituting the quantum well layer in the multiple quantum well structure 301 can be grown on the GaAs substrate 101 in the form of single-crystal film.

Thus, it is possible to use a GaInP layer for the barrier layer, and the degree of electron confinement into the GaInNAs quantum well layer is improved. As a result, dissociation of excitons in the quantum well layer is suppressed successfully even when the semiconductor optical modulator is operated at high temperatures, and a large quantum confinement Stark effect is guaranteed. Thereby, the problem of degradation of the S/N ratio is successfully avoided.

In the case of using a mixed crystal such as GaNAs, GaInNAs, GaNAsSb, GaInNAsSb, and the like, that contains As and N as the group V element for the quantum well layer in the multiple quantum well structure 301, there occurs a shift of valence band edge in the downward direction with increase of the N content. Thus, in the case a heterojunction is formed with a barrier layer such as GaAs, GaInAsP or GaInP in the multiple quantum well structure 301, it is possible to suppress the unwanted increase of the valence band discontinuity. Thereby, the problem of accumulation of holes in the quantum well layer is eliminated and high-speed modulation of 10-50 GHz becomes possible.

It is known that N and Al are chemically reactive and there tends to occur segregation of N at the interface between the quantum well layer and the barrier layer in the multiple quantum well structure 301 in the case the quantum well layer containing N as a constituent element and the barrier layer containing Al as a constituent element are grown in direct contact with each other. Thus, the present invention avoids the problem of N segregation by employing Al-free material such as GaInP for the barrier layer. Thereby, a high crystal quality is guaranteed for the active layer. It should be noted that the barrier layer of GaAs or GaInAsP may be used in addition to GaInP. Further, it is possible to use GaNAs, GaInNAs, GaNAsSb, GaInNAsSb for the quantum well layer in addition to GaInNAs.

FIGS. 1A and 1B show the semiconductor optical modulator as a discrete device. However, it is also possible to form a number of such semiconductor optical modulators on a common substrate in the form of monolithic array, by forming a number of ridge stripe structures.

Further, it is possible to construct a planar EA-optical modulator that emits an optical beam in the direction perpendicular to the substrate by using the foregoing multilayer quantum well structure 301.

[Second Mode of Invention]

In a second mode, the present invention provides an EA-type semiconductor optical modulator including an optical absorption layer of multiple quantum well structure and p-type and n-type electrodes for applying an electric field to the multiple quantum well structure, wherein the multiple quantum well structure comprises a quantum well layer, a barrier layer, and an intermediate layer disposed between said quantum well layer and said barrier layer, said quantum well layer being formed of a material selected from the group consisting of: GaNAs, GaInNAs, GaNAsSb and GaInNAsSb; said barrier layer being formed of a material selected from the group consisting of: $Al_aGa_{1-a}As$ ($0<a\leq1$), $(Al_bGa_{1-b})InP$ ($0<b\leq1$), $(Al_cGa_{1-c})InAsP$ ($0<c\leq1$), said intermediate layer comprising a material selected from the group consisting of: GaAs, GaInP and GaInAsP.

According to the second embodiment of the present invention, the material such as $Al_aGa_{1-a}As$ ($0<a\leq1$), $(Al_bGa_{1-b})InP$ ($0<b\leq1$) or $(Al_cGa_{1-c})InAsP$ ($0<c\leq1$) is used for the barrier layer, wherein it should be noted that the foregoing materials have a bandgap larger than that of GaAs, GaInAs or GaInP. Thus, by using these materials for the barrier layer, it becomes possible to increase the degree of electron confinement into the quantum well layer, and the semiconductor optical modulator can operate stably even under an elevated temperature environment.

In the present embodiment, it should be noted that a material containing Al is used for the barrier layer. In this case, however, the barrier layer is separated from the quantum well layer by the intermediate layer of GaAs, GaInAsP or GaInP, which is free from N and Al. By providing such an intermediate layer, the problem of segregation of N at the interface between the barrier layer and the quantum well layer is effectively suppressed, and high quality quantum well structure is formed.

It is noted that Japanese Laid-Open Patent Publication 2000-89180 describes a quantum well modulator that uses a quantum well layer of GaInNAs and a barrier layer of wide-gap II-VI material such as ZnCdS or ZnMgSSe. Contrary to this prior art, the present invention forms the barrier layer by a III-V material, which belongs to the same family as the material constituting the quantum well layer. Thus, the problem of mutual diffusion of elements at the interface between the quantum well layer and the barrier layer is effectively suppressed and excellent interface is guaranteed.

Further, it should be noted that the intermediate layer formed of any of GaAs, GaInP and GaInAsP may contain B and Sb. What is important with the intermediate layer is that it should not contain N and Al.

[Third Mode of Invention]

In a third mode, the present invention provides an integrated semiconductor light emitting device in which a semiconductor optical modulator as noted in any of the first and second mode of the invention is integrated on a common GaAs substrate (GaAs single crystal substrate) with a laser diode having an active layer of any of GaNAs, GaInNAs, GaNAsSb and GaInNAsSb.

It should be noted that the laser diode having the active layer of any of GaNAs, GaInNAs, GaNAsSb, GaInNAsSb can be constructed on a GaAs substrate so as to oscillate at the wavelength band of 1.2-1.6 µm. It is already verified that the laser diode having such a construction has excellent temperature performance as being characterized by the characteristic temperature of 150-200K.

It should be noted that the semiconductor optical modulator of the first and second modes of the invention can also be formed on the GaAs substrate, and thus, it becomes possible to modulate the laser diode with a speed of 10 GHz or more, which substantially exceeds the direct modulation speed of the laser diode.

Thus, by constructing an integrated semiconductor light-emitting device such that a laser diode having an active layer formed of any of GaNAs, GaInNAs, GaNAsSb and GaInNAsSb, is integrated with a semiconductor optical modulator of any of the First and Second Embodiments on a common GaAs substrate, it is possible to construct a laser diode device having a large characteristic temperature and operable in the wavelength band of 1.2-1.6 µm with a high modulation speed of 10 GHz or more.

[Fourth Mode of Invention]

In a fourth mode, the present invention provides an integrated semiconductor light-emitting device in which a semiconductor optical modulator as noted in any of the first and second modes is monolithically integrated on a common GaAs substrate (GaAs single crystal substrate) with a laser diode having an active layer of any of GaNAs, GaInNAs, GaNAsSb and GaInNAsSb.

It should be noted that the laser diode having the active layer of any of GaNAs, GaInNAs, GaNAsSb, GaInNAsSb can be constructed on a GaAs substrate so as to oscillate at the wavelength band of 1.2-1.6 μm. It is already verified that the laser diode having such a construction has excellent temperature performance as being characterized by the characteristic temperature of 150-200K.

It should be noted that the semiconductor optical modulator of the first and second modes of invention can also be formed on the GaAs substrate, and thus, it becomes possible to modulate the laser diode with a speed of 10 GHz or more, which substantially exceeds the direct modulation speed of the laser diode.

Thus, by constructing the integrated semiconductor light-emitting device such that a laser diode having an active layer formed of any of GaNAs, GaInNAs, GaNAsSb and GaInNAsSb, is integrated monolithically with a semiconductor optical modulator of any of the first and second mode of the invention on a common GaAs substrate, it is possible to construct a laser diode device having a large characteristic temperature and operable in the wavelength band of 1.2-1.6 μm with a high modulation speed of 10 GHz or more.

<Embodiment 2>

Figure 2:
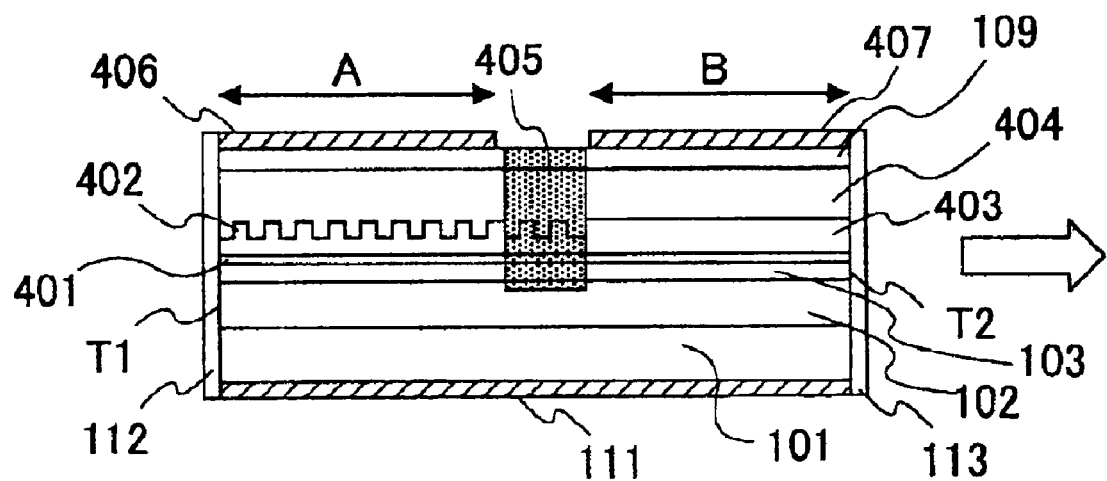
FIG. 2 is a diagram showing the construction of an integrated semiconductor light-emitting device according to another embodiment of the present invention.

FIG. 2 shows the construction of an integrated semiconductor light-emitting device according to Embodiment 2 of the present invention.

Referring to FIG. 2, the integrated semiconductor light-emitting device is a laser diode device having an integral optical modulator, and includes a laser diode part A that produces a laser beam and an EA-type semiconductor optical modulator B that modulates the intensity of the optical beam produced by the laser diode part A, such that the laser diode part A and the semiconductor optical modulator B are integrated on the n-type GaAs substrate 101 commonly and monolithically.

Here, it should be noted that the laser diode part A includes the n-type AlGaAs layer 102 having the composition of $Al_{0.4}Ga_{0.6}As$ as a cladding layer, the GaAs layer 103 as a lower optical waveguide layer, and a multiple quantum well structure 401 is formed on the lower optical waveguide layer 103. Further, a diffraction grating layer 402 and a p-type cladding layer 404 of AlGaAs having the composition of $Al_{0.4}Ga_{0.6}As$ are formed consecutively on the multiple quantum well structure 401. Further, the GaAs layer 103 is provided on the cladding layer 104 as a cap layer. In the present example, the multiple quantum well structure 401 is formed of an alternate repetition of a quantum well of GaInNAs and a barrier layer of GaAs.

On the other hand, the EA-type semiconductor optical modulator B includes the foregoing cladding layer 102 of n-type $Al_{0.4}Ga_{0.6}As$, the lower optical waveguide layer 103 of GaAs and the multiple quantum well structure 401 on the n-type GaAs layer 103, wherein an upper optical waveguide layer 403 of GaAsP is formed on the multiple quantum well structure 401 and a p-type cladding layer 404 of AlGaAs having the composition of $Al_{0.4}Ga_{0.6}As$ is formed on the upper optical waveguide layer 403. Further, the p-type GaAs layer 109 is formed on the cladding layer 404 as a cap layer. It should be noted that the upper optical waveguide layer 403 of GaAsP has a lattice constant smaller than that of GaAs and accumulates a tensile strain of about 0.5%.

At the region between the laser diode part A and the EA-type semiconductor optical modulator, there is provided a high-resistance region 405 doped with proton such that the high-resistance region 405 extends up to the n-type cladding layer 102. By providing the high-resistance region 405, the laser diode part A and the EA-type semiconductor optical modulator B are electrically separated from each other.

Further, there is provided a p-side electrode 406 on the p-type GaAs cap layer 109 in the laser diode part A, while a p-type electrode 407 is provided on the p-type GaAs cap layer 109 in the EA-type semiconductor optical modulator B. Further, the electrode 111 is provided on the bottom surface of the n-type GaAs substrate 101 as a common electrode.

The device of FIG. 2 is cleaved at the both end surfaces and the end surfaces thus formed are covered with the anti-reflection coatings 112 and 113 having a reflectance of 0.2% or less, similarly to the device of FIG. 1B.

In the integral optical semiconductor device of FIG. 2, carrier injection is made into the multiple quantum well active layer 401 by applying a forward bias across the p-side electrode 406 and the n-side electrode 111, and in response thereto, there occurs recombination of carriers in the GaInNAs quantum well layer. As a result, optical radiation having a wavelength of the 1.3 μm band corresponding to the bandgap energy of the GaInNAs quantum well layer is produced. The optical radiation thus produced in the multiple quantum well active layer 401 is amplified as it is guided back and forth through the optical waveguide including the GaAsP diffraction grating layer 402 and there occurs a laser oscillation at the wavelength that satisfies the Bragg condition.

The laser beam thus formed in the laser diode part A is then guided through the GaAs lower optical waveguide layer 103 and the GaAsP diffraction grating layer 402 and enters into the EA-type semiconductor optical modulator B, wherein it should be noted that the bandgap wavelength of the multiple quantum well structure 401 in the semiconductor optical modulator B is shifted in the shorter wavelength side as a result of the tensile strain caused in the multiple quantum well structure 401 by the adjacent GaAsP upper optical waveguide layer 403. In the laser diode part A, it should be noted that this tensile strain is relaxed due to the formation of minute projections and depressions of the diffraction grating formed in the GaAsP layer 402. Thus, the multiple quantum well structure 401 of the laser diode part A is not affected with the strain of the GaAsP layer 402 with regard to the bandgap energy.

Thus, in the EA-type semiconductor optical modulator B, the bandgap of the multiple quantum well structure 401 is set larger than the bandgap of the multiple quantum well structure 401 of the laser diode part A by about several ten millielectron volts (meV), and the multiple quantum well structure 401 of the EA-type semiconductor optical modulator B is transparent with regard to the laser beam produced by the laser diode part A in the state that no bias voltage is applied across the p-side electrode 407 and the n-side electrode 411.

Upon application of a reverse bias voltage across the p-side electrode 407 and the n-side electrode 111, on the other hand, the foregoing bandgap of the multiple quantum well structure 401 is reduced as a result of the quantum confinement Stark effect, and there occurs absorption of the laser beam produced by the laser diode part A. Thus, it becomes possible to conduct a modulation of laser beam intensity by causing on and off of the bias voltage applied across the p-side electrode 407 and the n-side electrode 111.

It should be noted that the anti-reflection coatings 112 and 113 on the edge surfaces function to suppress the laser diode to oscillate in the Fabry-Perot mode.

As the laser diode part A of the integrated device of FIG. 2 uses a GaInNAs quantum well layer tuned to the wavelength of 1.3 μm band for the active layer, it is possible to use AlGaAs having the composition of $Al_{0.4}Ga_{0.6}As$, a typical widegap material, for the cladding layer. Thus, it becomes possible to secure a large barrier height between the active layer and the cladding layer for confining the electrons, and it becomes possible to suppress the electron overflow from the quantum well layer to the cladding layer. With this, the characteristic temperature of the laser diode part A is increased to 150K or more and the threshold current of the laser diode is suppressed effectively even when the integrated semiconductor light-emitting device is operated in an elevated temperature environment.

In the EA-type semiconductor optical modulator B, it should be noted that GaInNAs is used for the quantum well layer and GaAs is used for the barrier layer in the multiple quantum well structure 401. It is known that a large band discontinuity is secured when a GaInNAs layer is used to form a heterojunction together with a GaAs layer. Thus, the laser diode part A in the integrated semiconductor light-emitting device of the present example has an improved degree of electron confinement in the GaInNAs quantum well layer as compared with the case of using a conventional InP/InGaAsP quantum well structure, and the problem of dissociation of excitons at high temperatures is successfully eliminated. In other words, the semiconductor optical modulator B of the present example can provide a large bandgap change caused by the quantum confinement Stark effect even when the integrated semiconductor light-emitting device is operated in a high temperature environment, and an high S/N ratio is guaranteed.

Thus, the present example provides an ideal integrated laser-diode/optical-modulator semiconductor device.

In the case of applying electric field to the semiconductor optical modulator, it is possible to achieve the optical modulation with a frequency much higher than the frequency possible when modulating a laser diode directly by way of modulating the current injection. Thus, by integrating the EA-type semiconductor optical modulator with the laser diode as set forth in FIG. 2, it becomes possible to modulate the laser beam with a frequency of 10-50 GHz, which is much higher than the frequency possible when modulating a laser diode directly by way of modulating the current injection. Further, the integrated device of FIG. 2 has an advantageous feature of compact size as a result of monolithic integration of the laser diode and semiconductor optical modulator on the same substrate.

[Fifth Mode of Invention]

In a fifth mode, the present invention provides an integrated semiconductor light-emitting device in which a laser diode and a semiconductor optical modulator are integrated, in the form of a surface-emission type device.

When conducting the modulation of a laser beam by using an optical modulator rather than modulating the laser diode directly, the laser diode has to be driven continuously. Thus, in such a construction, it is important to reduce the threshold current of laser oscillation for suppressing the power consumption and heat generation. In the present embodiment, it is possible to reduce the threshold current of laser oscillation to 5 mA or less by using a surface-emission laser diode.

The surface-emission laser diode used in the present embodiment includes an active layer formed on a GaAs substrate wherein the active layer is formed of any of the material such as GaNAs, GaInNAs, GaNAsSb and GaInNAsSb. Thus, it is possible to use the material system of GaAs/AlGaAs for the distributed Bragg reflector, such that GaAs is used for the high refractive index layer and AlAs or AlGaAs is used for the low refractive index layer of the distributed Bragg reflector. In the distributed Bragg reflector, the high refractive index layer and the low refractive index layer are repeated alternately. In the case of using a conventional system of InP/InGaAsP for the distributed Bragg reflector, it is necessary to use the quaternary mixed crystal of InGaAsP for the high refractive index layer and the thermal resistance of the distributed Bragg reflector is increased inevitably.

In addition, the conventional distributed Bragg reflector based on the InP/InGaAsP system has a drawback, due to the small refractive index difference between the low refractive index layer and the high refractive index layer, in that a large number of repetitions is necessary for achieving necessary high reflectance. Contrary to the conventional distributed Bragg reflector, the present invention has an advantageous feature, due to the large refractive index difference between the high refractive index layer and the low refractive index layer, in that a high reflectance is achieved with reduced number of repetition in the distributed Bragg reflector. Thereby, the Bragg reflector of the present embodiment is advantageous for efficient heat dissipation, and the integrated semiconductor light-emitting device of the present embodiment operates stably in an elevated temperature environment.

<Embodiment 3>

Figure 3A:
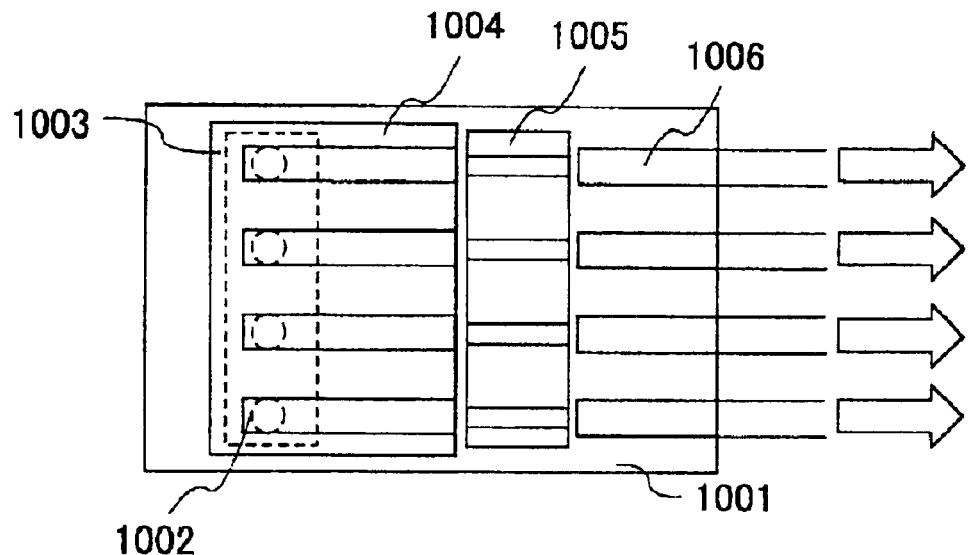
FIGS. 3A and 3B are diagrams showing the construction of a semiconductor light-emitting device according to another embodiment of the present invention.
Figure 3B:
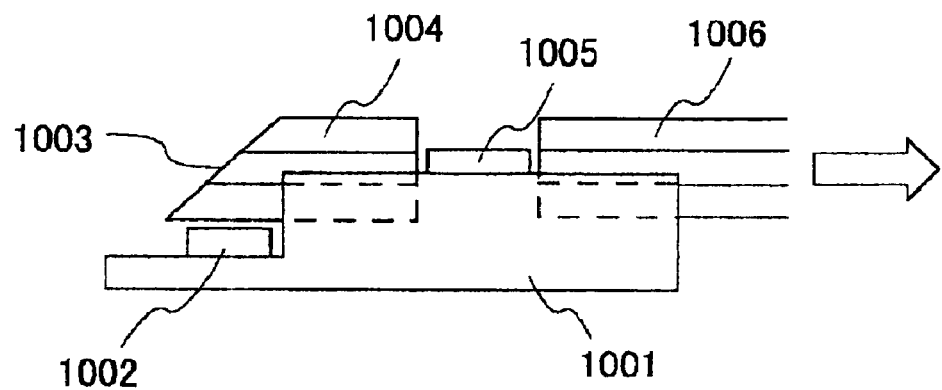

FIGS. 3A and 3B show another construction of the integrated semiconductor light-emitting device according to Embodiment 3 of the present invention, wherein FIG. 3A shows the device in a plan view while FIG. 3B shows the device in a longitudinal cross-sectional view.

Referring to FIGS. 3A and 3B, the integrated semiconductor light-emitting device is constructed on a Si substrate 1001 and includes a vertical-cavity surface-emission laser diode 1002 formed on the Si substrate 1001, wherein there are, provided four such laser diodes 1002 on the substrate 1001 in the form of an array. Further, the Si substrate 1001 carries thereon an optical waveguide 1004 having a 45° mirror 1003 at an end thereof, and an EA-type semiconductor optical modulator 1005 is provided further on the Si substrate 1001 in optical coupling with the other end of the optical waveguide 1004. The EA-type semiconductor optical modulator 1005 includes four channels, and optical fibers 1006 are coupled to respective channels of the semiconductor optical modulator 1005. In each channel, the EA-type semiconductor optical modulator 1005 has a structure explained already with reference to FIG. 1.

It should be noted that each of the surface-emission laser diodes in the array includes a GaAs substrate carrying thereon a lower distributed Bragg reflector of the GaAs/AlGaAs structure, and an active layer of GaInNAs is formed on the lower distributed Bragg reflector. Further, an upper distributed Bragg reflector of the GaAs/AlGaAs structure is formed on the active layer and there is formed a vertical cavity between the upper and lower distributed Bragg reflectors. The laser diode oscillates at the wavelength of 1.3 μm band.

Referring to FIG. 3B, the laser beam emitted in the upward direction from the surface-emission laser diode 1002 is deflected by the mirror 1003 by an angle of 45° and impinges into the optical waveguide 1004. The laser beam thus entered into the optical waveguide 1004 is guided to the semiconductor optical modulator 1005. It should be noted that each channel in the optical modulator 1005 corresponds to one of the laser diodes 1002.

The laser beam thus entered into the semiconductor optical modulator 1005 undergoes optical modulation. After modulation, the laser beam is injected into corresponding one of the optical fibers 1006.

In the integrated semiconductor light-emitting device of FIGS. 3A and 3B, it is possible to transmit the optical signals with a bit rate of 40 Gbps in the maximum by using all the four channels and by modulating the optical signal at the frequency of 10 GHz by using the semiconductor optical modulator 1005.

In the construction of FIGS. 3A and 3B, it should be noted that the surface-emission laser diode 1002 has a construction of including the active layer of GaInNAs on the GaAs substrate. Thus, in this laser diode, it is possible to use a distributed Bragg reflector constructed by alternately stacking a GaAs high refractive index layer and an AlGaAs law refractive index layer.

In the case of using a conventional system of InP/InGaAsP for the distributed Bragg reflector, it has been necessary to use the quaternary mixed crystal of InGaAsP for the high refractive index layer and the thermal resistance of the distributed Bragg reflector has increased inevitably.

In addition, the conventional distributed Bragg reflector based on the InP/InGaAsP system has a drawback, due to the small refractive index difference between the low refractive index layer and the high refractive index layer, in that a large number of repetitions is necessary for achieving necessary high reflectance. Contrary to the conventional distributed Bragg reflector, the present invention has an advantageous feature, due to the large refractive index difference between the high refractive index layer and the low refractive index layer, in that a high reflectance is achieved with reduced number of repetition in the distributed Bragg reflector. Thereby, the Bragg reflector of the present embodiment is advantageous for efficient heat dissipation, and the integrated semiconductor light-emitting device of the present embodiment operates stably in an elevated temperature environment.

When conducting the modulation of a laser beam by using an optical modulator rather than modulating the laser diode directly, the laser diode has to be driven continuously. Thus, in such a construction, it is important to reduce the threshold current of laser oscillation for suppressing the power consumption and heat generation. In the present embodiment, it is possible to reduce the threshold current of laser oscillation to 5 mA or less by using a surface-emission laser diode.

By constructing the multiple quantum well structure forming the optical absorption layer of the EA-type semiconductor optical modulator 1005 by using a GaInNAs layer for the quantum well layer and an AlGaAs layer having a composition of $Al_{0.2}Ga_{0.8}As$ for the barrier layer, it is possible to increase the degree of electron confinement into the GaInNAs quantum well layer. Thereby, the dissociation of excitons is suppressed effectively also when the device is operated in an elevated temperature environment and the degradation of S/N ratio is avoided successfully.

Thus, in the construction of FIGS. 3A and 3B, it becomes possible to realize an integrated semiconductor light-emitting device operable stably at the wavelength band of 1.3 µm even in elevated temperature environment such that the optical semiconductor device is capable of being driven at a high speed of 10 GHz or more, by integrating a surface-emission laser diode having an active layer of GaInNAs and an EA-type semiconductor optical modulator having an absorption layer of GaInNAs quantum well layer commonly on the Si substrate 1001.

[Sixth Mode of Invention]

In a sixth mode of the present invention, it is possible to construct a monolithic integrated semiconductor light-emitting device by using a surface-emission laser diode for the laser diode such that the surface-emission laser diode and the EA-mode semiconductor optical device are stacked in a direction perpendicular to the plane of the semiconductor layers.

In this case, the laser diode emits the laser beam in the direction perpendicular to the principal surface of the GaAs single crystal substrate and there is no need of forming the optical input/output surfaces by a cleaving process. Such a surface-emission laser diode can be integrated on the GaAs single crystal substrate with high density in the form of two-dimensional array.

As the laser diode is thus formed on a GaAs single crystal substrate, the laser diode can use a distributed Bragg reflector in which the high refractive index layer of GaAs and the low-refractive index layer of AlGaAs or AlAs are stacked alternately.

In the case of using a conventional system of InP/InGaAsP for the distributed Bragg reflector, it has been necessary to use the quaternary mixed crystal of InGaAsP for the high refractive index layer and the thermal resistance of the distributed Bragg reflector has increased inevitably.

In addition, the conventional distributed Bragg reflector based on the InP/InGaAsP system has a drawback, due to the small refractive index difference between the low refractive index layer and the high refractive index layer, in that a large number of repetitions is necessary for achieving necessary high reflectance. Contrary to the conventional distributed Bragg reflector, the present invention has an advantageous feature, due to the large refractive index difference between the high refractive index layer and the low refractive index layer, in that a high reflectance is achieved with reduced number of repetition in the distributed Bragg reflector. Thereby, the Bragg reflector of the present embodiment is advantageous for efficient heat dissipation, and the integrated semiconductor light-emitting device of the present embodiment operates stably in an elevated temperature environment.

<Embodiment 4>

Figure 4A:
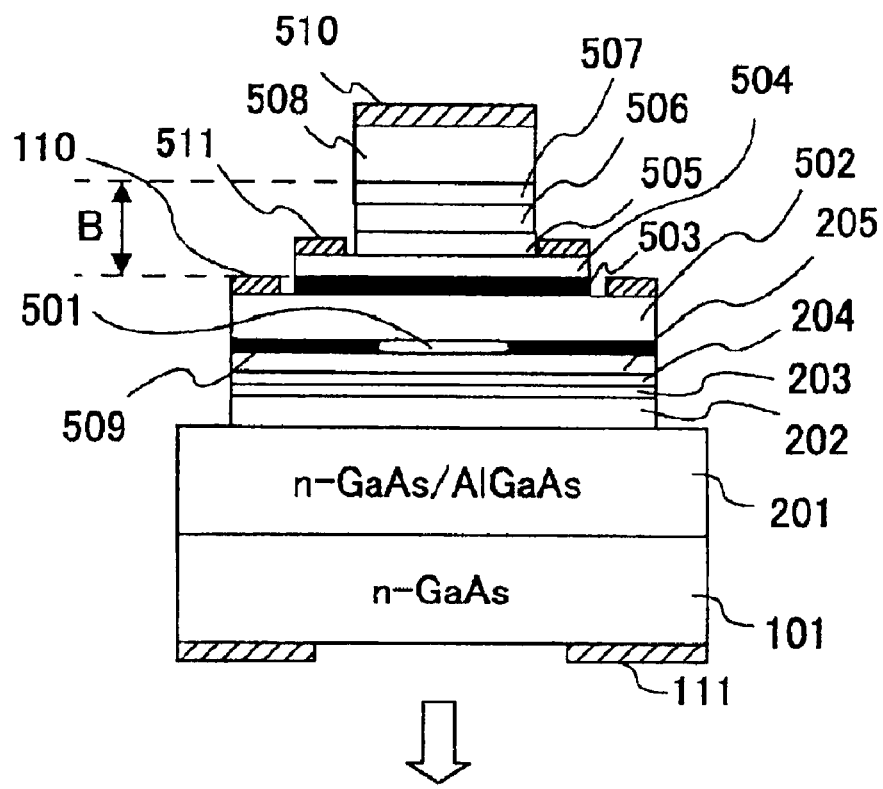
FIGS. 4A and 4B are diagrams showing the construction of an integrated semiconductor light-emitting device according to another embodiment of the present invention.

FIG. 4A shows the construction of an integrated semiconductor light-emitting device according to Embodiment 4 of the present invention.

Referring to FIG. 4A, the integrated semiconductor light-emitting device is based on a surface-emission laser diode and includes a semiconductor optical modulator integrated on the surface-emission laser diode such that the semiconductor optical modulator is formed inside the p-side distributed Bragg reflector of the surface-emission laser diode.

More specifically, the integrated semiconductor light-emitting device is constructed on the n-type GaAs substrate 101 and includes a distributed Bragg reflector 201 of n-type $GaAs/Al_{0.8}Ga_{0.2}As$ structure formed on the substrate 101, Wherein there is provided a lower spacer layer 202 on the distributed Bragg reflector 201 and a multiple quantum well active layer 203 having the GaInNAs/GaAs structure is formed on the lower spacer layer 202. On the multiple quantum well layer 203, there is formed a carrier blocking layer 204 of p-type AlGaAs having a composition of $Al_{0.2}Ga_{0.8}As$, and a p-type GaAs upper spacer layer 205 is grown on the carrier blocking layer 204.

Further, a selective-oxidation layer 501 of p-type AlAs is grown on the upper spacer layer 205 and a first p-type distributed Bragg reflector 502 having the $GaAs/Al_{0.8}Ga_{0.2}As$ stacked structure is formed on the selective-oxidation layer 501.

On the first p-type distributed Bragg reflector 502, there is formed an insulation layer 503 of AlO$_x$, and a contact layer 504 of n-type GaAs constituting a part of the EA-type semiconductor optical modulator B is formed on the insulation layer 503. Further, a cladding layer 505 of n-type AlGaAs having the composition of Al$_{0.4}$Ga$_{0.6}$As, a multiple quantum well structure 506 and a contact layer 507 of p-type AlGaAs having the composition of Al$_{0.4}$Ga$_{0.6}$As are formed consecutively on the contact layer 504. Here, it should be noted that the AlOx insulation layer 503 provides an electrical-insulation between the surface-emission laser diode and the EA-type semiconductor optical modulator B.

Figure 4B:
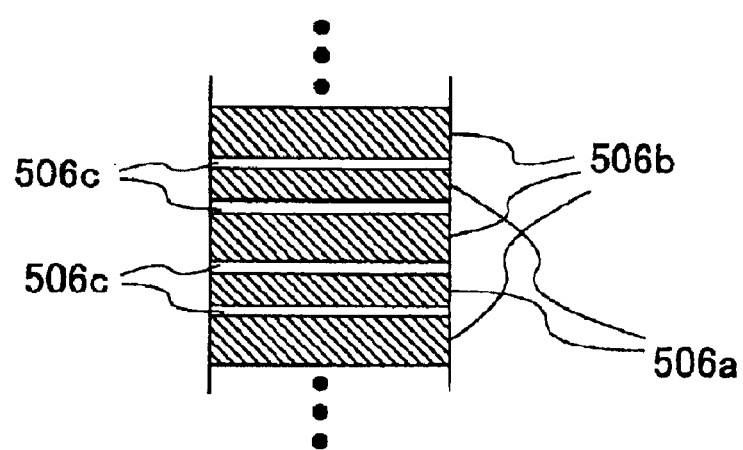

FIG. 4B shows the construction of the multiple quantum well structure 506.

Referring to FIG. 4B, the multiple quantum well structure 506 is formed of an alternate repetition of a GaInNAs quantum well layer 506a and a barrier layer 506b of Al$_{0.2}$Ga$_{0.8}$As, and there is formed an intermediate layer 506c of GaAs between the layers 506a and 506b with a thickness of 2 nm.

By providing such an intermediate layer 506c of GaAs, which is free from N and Al, between the GaInNAs quantum well layer 506a that contains N as the constituent element and the barrier layer of Al$_{0.2}$Ga$_{0.8}$As that contains Al, the problem of segregation of N at the layer interface is effectively suppressed and a high quality quantum well structure is obtained.

It should be noted that the thickness of the AlOx insulation layer 503, the thickness of the n-type GaAs contact layer 504, and the total thickness of the cladding layer 505, the multiple quantum well layer 506 and the cladding layer 507 are set so as to satisfy the phase matching condition at the laser oscillation wavelength. In other words, the optical thickness of the foregoing layers is chosen to be a multiple integer of one-quarter of the laser oscillation wavelength.

Further, a second p-type distributed Bragg reflector 508 having the structure of GaAs/Al$_{0.8}$Ga$_{0.2}$As is formed on the p-type Al$_{0.4}$Ga$_{0.6}$As cladding layer 507.

Referring back to FIG. 4A, the layered structure thus formed is then subjected to a dry etching process to form a three-step pillar structure, wherein the first pillar structure is formed so as to expose the top surface of the n-type GaAs contact layer 504 while the second pillar structure is formed so as to expose the top surface of the first p-type distributed Bragg reflector 502 of the GaAs/Al$_{0.8}$Ga$_{0.2}$As structure. Further, the third pillar is formed by conducting the dry etching process such that the dry etching reaches the distributed Bragg reflector 201 of the n-type GaAs/Al$_{0.8}$Ga$_{0.2}$As structure.

In the structure of FIG. 4A, it should be noted that the marginal part of the p-type AlAs layer 501 exposed at the sidewall surface of the third pillar structure is subjected to a lateral oxidation process, and there is formed an AlOx insulation region 509 in the AlAs layer 501 such that the insulation region 509 surrounds laterally the core part of the AlAs layer 501. It should be noted that this oxidation process for forming the AlOx insulation region 509 can be conducted simultaneously to the oxidation process used for oxidizing an AlAs layer to form the AlOx layer 503. In the step of forming the AlOx layer 503, the lateral oxidation process is conducted until the entire AlAs layer is converted to AlOx in the layer 503.

In the step of FIG. 4A, it should be noted that there is formed a p-side electrode 510 on the surface of the second p-type distributed Bragg reflector 508 locating at the top part of the first pillar for modulation, and an n-side electrode 511 is formed on the exposed top surface of the n-type GaAs contact layer 504, wherein the electrodes 510 and 511 are used for driving the semiconductor optical modulator B.

On the exposed surface of the first p-type distributed Bragg reflector 502 located at the top part of the third pillar, a p-side electrode is provided as the electrode 110, and a bottom electrode is provided on the bottom surface of the GaAs substrate 101 except for the opening for emitting the laser beam as the electrode 111. The electrodes 110 and 111 are used for driving the surface-emission laser diode.

In the construction of FIG. 4A, there occurs carrier injection into the GaInNAs/GaAs multiple quantum well active layer 203 of the surface-emission laser diode by applying a forward bias across the p-side electrode 110 and the n-side electrode, wherein the carriers (holes) thus injected are confined into the narrow AlAs region 501 surrounded by the AlOx region 509 narrower than the diameter of the first pillar. As a result of such a confinement of the carriers, the threshold current of laser oscillation is reduced effectively. As a recombination of the carriers thus injected in the GaInNAs/GaAs multiple quantum well active layer 203, there is produced optical radiation with a wavelength of 1.3 μm in correspondence to the bandgap energy of the GaInNAs quantum well layer. The optical radiation thus produced is amplified as it is reflected back and forth between the n-type distributed Bragg reflector 201 and the p-type distributed Bragg reflector 502 or 508, and the laser oscillation takes place with the wavelength thus causing resonance with the optical cavity thus formed by the distributed Bragg reflectors 201, 502 and 508.

In the EA-type semiconductor optical modulator B, it should be noted that the multiple quantum well structure 506 is transparent with regard to the laser beam in the state in which no bias is applied across the p-side electrode 510 and the n-side electrode 511. Thus, in this state, not only the reflection from the first p-type distributed Bragg reflector 502 but also the reflection from the second p-type distributed Bragg reflector contributes to the optical feedback, and a high reflectance exceeding 99% is achieved. With this very high reflectance, there occurs a laser oscillation in the surface-emission laser diode.

When a reverse bias voltage is applied across the p-side electrode 510 and the n-side electrode 511, on the other hand, the bandgap of the multiple quantum well structure 506 is decreased as a result of the quantum confinement Stark effect, and there occurs absorption of the laser beam in the quantum well structure 506. As a result, the effective reflectance of the p-type distributed Bragg reflector is reduced and the laser oscillation is interrupted. Thus, the intensity of the laser beam is modulated in response to the modulation signal applied to the electrodes 510 and 511 of the semiconductor optical modulator B.

In the integrated semiconductor light-emitting device of FIGS. 4A and 4B, it is possible to increase the conduction band discontinuity at the interface between the GaInNAs quantum well layer and the p-type Al$_{0.4}$Ga$_{0.6}$As carrier blocking layer 204 to 200 meV or more in the GaInNAs surface-emission laser diode constructed on the GaAs substrate 101 and operating at the wavelength band of 1.3 μm. Thus, it is possible to suppress the electron overflow even in the case the laser diode is operated in an elevated temperature environment. The laser diode has a reduced thermal resistance as a result of reduced number of repetition in the p-side distributed Bragg reflectors 502 and 508, wherein such a reduction of number of repetition in the distributed Bragg reflector has become possible in the present invention by using the material system of GaAs/AlGaAs, which enables the reflectance of 99% or more with a small number of layers in the distributed Bragg reflector.

Further, by constructing the multiple quantum well structure 506 forming the absorption layer of the EA-type semiconductor optical modulator B by using the quantum well layer of GaInNAs and the barrier layer of $Al_{0.2}Ga_{0.8}As$, it is possible to enhance the electron confinement effect in the GaInNAs quantum well layer, and thus, the dissociation of excitons is effectively suppressed even when the optical semiconductor device is operated in an elevated temperature environment. As a result, a large quantum confinement Stark effect is achieved and a large bandgap change is guaranteed. Thus, the S/N ratio of optical modulation is successfully suppressed even when the semiconductor optical modulator is operated in an elevated temperature environment.

Thus, according to the integrated semiconductor light-emitting device of FIGS. 4A and 4B, it becomes possible to achieve a high-speed optical modulation of an optical beam having the wavelength of 1.3 µm at the speed of 10 GHz or more.

In the surface-emission type optical semiconductor device of FIGS. 4A and 4B, the threshold current of laser oscillation is reduced as a result of use of the surface-emission laser diode. In such an integrated semiconductor light-emitting device, it is further possible to arrange the laser diodes and the semiconductor optical modulators in the form of high-density two-dimensional array.

[Seventh Mode of Invention]

In a seventh mode, the present invention provides an integrated semiconductor light-emitting device in which a semiconductor optical modulator is integrated on a surface-emission laser diode such that the semiconductor optical modulator is located inside the cavity of the laser diode. In the present mode of invention, the multiple quantum well structure constituting the optical absorption layer in the semiconductor optical modulator is transparent in the state no bias voltage is applied to the semiconductor optical modulator. Because of the small optical loss in the optical cavity, the surface-emission laser diode oscillates at a low threshold current.

When a reverse bias voltage is applied to the semiconductor optical modulator, the bandgap of the multiple quantum well structure constituting the optical absorption layer of the semiconductor optical modulator is reduced as a result of the quantum confinement Stark effect, and there occurs optical absorption in the optical absorption layer. Thereby, there is caused an optical loss in the optical cavity and the threshold current of laser oscillation is increased.

Thus, in the eight mode of the present invention, too, it is possible to switch the state of the laser diode between the oscillating state and the non-active state in which there is no laser oscillation. According to the present invention, it is possible to control the laser output over a wide range even in such a case the optical absorption layer of the semiconductor optical modulator is small such as 1 µm and the change of optical absorption coefficient is small. With this, it is possible to improve the S/N ratio at the time of the optical modulation.

By using any of GaNAs, GaInNAs, GaNAsSb, GaInNAsSb for the active layer, it is possible to construct a laser diode operable in the wavelength band of 1.2-1.6 µm, which is suitable for the optical transmission over a quartz optical fiber. By using the foregoing materials for the active layer, it is known that the temperature characteristic of the laser diode is improved significantly as is demonstrated by the characteristic temperature of 150-200K. Further, such a laser diode has an improved electron confinement into the quantum confinement layer.

Thus, according to the present invention, it is possible to provide a surface-emission type integrated semiconductor light-emitting device characterized by a high-speed optical modulation exceeding the speed of 10 GHz.

<Embodiment 5>

Figure 5:
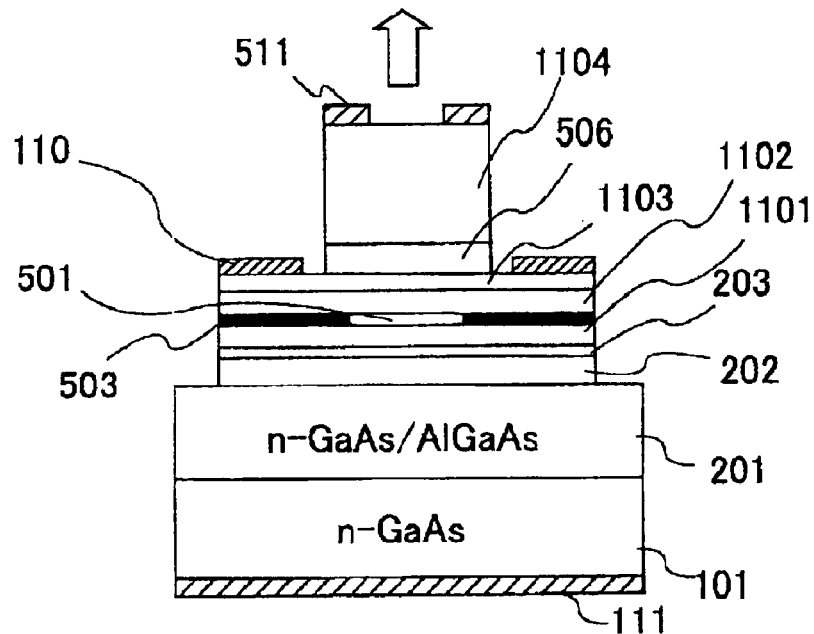
FIG. 5 is a diagram showing the construction of an integrated semiconductor light-emitting device according to another embodiment of the present invention.

FIG. 5 shows another embodiment of the integrated semiconductor light-emitting device according to the present invention wherein the integrated semiconductor light-emitting device includes an EA-type semiconductor optical modulator provided monolithically on a surface-emission laser diode to form an integral circuit. In the present embodiment, the EA-type semiconductor optical modulator is formed inside an optical cavity the surface-emission-laser diode located at the side of the substrate.

Referring to FIG. 5, the n-type GaAs substrate 101 carries thereon the n-type distributed Bragg reflector 201 of the $GaAs/Al_{0.8}Ga_{0.2}As$ structure, and the lower spacer layer 202 of n-type GaAs and the multiple quantum well active layer 203 having the GaInNAs/GaAs structure are formed consecutively on the distributed Bragg reflector 201.

On the multiple quantum well active layer 203, there is provided a first upper spacer layer 1101 of GaAs, the p-type AlAs selective oxidation layer 501 is formed on the GaAs spacer layer 1101.

Further, a second upper spacer layer 1102 of GaAs is formed on the p-type AlAs layer 501 and a contact layer 1103 of p-type GaAs is formed further thereon.

The contact layer 1103 carries thereon the multiple quantum well structure 506, and an upper distributed Bragg reflector 1104 having the $GaAs/Al_{0.8}Ga_{0.2}As$ structure is formed thereon.

The multiple quantum well structure 506 has a construction similar to the one described with reference to FIG. 4B.

Referring to FIG. 4B again, the multiple quantum well structure 506 includes an alternate and repetitive stacking of the GaInNAs active layer 506a and the barrier layer 506b of $Al_{0.2}Ga_{0.8}As$, wherein it can be seen that the intermediate layer 506c of GaAs is provided at the interface between the active layer 506a and the barrier layer 506b with a thickness of 2 nm.

By providing such an intermediate layer 506c of GaAs, which is free from N and Al, between the GaInNAs quantum well layer 506a that contains N as the constituent element and the barrier layer of $Al_{0.2}Ga_{0.8}As$ that contains Al, the problem of segregation of N at the layer interface is effectively suppressed and a high quality quantum well structure is obtained.

In the construction of FIG. 5, it should be noted that the region located between the n-type distributed Bragg reflector 201 and the n-type upper distributed Bragg reflector 1104 forms the optical cavity of the surface-emission laser diode. Thereby, the total thickness of the GaAs lower spacer layer 202, the GaInNAs/GaAs multiple quantum well active layer 203, the first GaAs spacer layer 1101, the p-type AlAs layer 501, the second GaAs spacer layer 1102, the p-type GaAs contact layer 1103 and the multiple quantum well structure 506 is set so as to be equal to an integer multiple of the half-wavelength of laser oscillation.

The layered structure thus formed is subjected to a dry etching process to form a two-step pillar structure as represented in FIG. 5, wherein the upper pillar forming the first, upper stepped part is formed so as to expose the top surface of the p-type GaAs contact layer 1103, while the second step is formed so as to reach the n-type distributed Bragg reflector 201 of the $GaAs/Al_{0.8}Ga_{0.2}As$ structure.

Further, the p-type AlAs selective oxidation layer 501 is oxidized selectively from the exposed lateral surface thereof, and the AlOx insulating region 503 is formed so as to surround the core part of AlAs. According to such a construction, it becomes possible to confine the injected electric current to a region having a size smaller than the size of the pillar, and the threshold current of laser oscillation is reduced.

In the construction of FIG. 5, it can be seen that an n-type electrode 511 is formed on the top part of the n-type distributed Bragg reflector 1104 except for the region used for an optical window from which the laser beam is emitted. Further, a p-side common electrode 110 is formed on the exposed terrace surface of the p-type GaAs contact layer 110. Furthermore, the n-type electrode 111 is provided on the bottom surface of the n-type GaAs substrate 101.

In the construction of FIG. 5, the surface-emission laser diode is driven by applying a forward bias voltage across the p-side electrode 110 and the n-side electrode 111, such that there occurs carrier injection into the GaInNAs/GaAs quantum well active layer 203. The carriers thus injected are confined into a small area of the active layer 203 smaller than the size of the pillar, as a result of the action of the AlOx insulating region 503 formed in the AlAs layer 501 by the lateral oxidizing process. The carriers thus injected into the active layer 203 cause a recombination, and there is produced an optical radiation having a wavelength of 1.3 μm in correspondence to the bandgap energy of the GaInNAs quantum well layer. The optical radiation thus produced in the GaInNAs/GaAs multiple quantum well active layer 203 is then amplified as it is reflected back and forth between the n-type distributed Bragg reflector 201 and the n-type upper distributed Bragg reflector 1104, and there occurs a laser oscillation. The laser beam thus formed is then emitted from the optical window in the electrode 511 in the upward direction with respect to the GaAs substrate 101.

In the EA-type semiconductor optical modulator, the multiple quantum well structure 506 is transparent in the state in which no bias voltage is applied across the p-side electrode 110 and the n-side electrode 511. Because of the absence of optical absorption in the laser cavity, the surface-emission laser diode causes the laser oscillation.

When a reverse bias voltage is applied across the p-side electrode 110 and the n-side electrode 511, on the other hand, there occurs a decrease of bandgap energy in the multiple quantum well structure 506 as a result of the quantum confinement Stark effect, and there occurs optical absorption in the multiple quantum well structure 506. Thereby, the laser oscillation halts because of the increased optical loss in the cavity. Thus, the present embodiment can provide a large S/N ratio for the optical, modulation.

In the construction of FIG. 5, it should be noted that the GaInNAs surface-emission laser diode of 1.3 μm band formed on the GaAs substrate 101 uses the distributed Bragg reflector of the GaAs/AlGaAs material system, which is characterized by a small thermal resistance. Further, the distributed Bragg reflector of the foregoing system can provide a high reflectance of 99% or more while reducing the number of repetition therein. As a result, it is possible to construct a surface-emission laser diode having excellent temperature characteristics. Further, it becomes possible to reduce the threshold current of laser oscillation by using the laser diode of the present embodiment as compared with the case of using an edge-emission type laser diode.

In the multiple quantum well structure 506 constituting the optical absorption layer of the EA-type semiconductor optical modulator, it is possible to increase the degree of electron confinement into the GaInNAs quantum well layer by using $Al_{0.2}Ga_{0.8}As$ for the barrier layer. Thus, it becomes possible to suppress the dissociation of excitons even when the optical modulator is operated in an elevated temperature environment, and a large bandgap change caused by the quantum confinement Stark effect is guaranteed. Thereby, the problem of S/N degradation at high temperatures is successfully eliminated.

In the embodiment of FIG. 5, it is possible to realize a high-speed optical semiconductor device operable in the wavelength band of 1.3 μm with a speed of 10 GHz or more even at high temperatures, by integrating a surface-emission laser diode having a GaInNAs active layer and an EA-type optical modulator that uses a GaInNAs quantum well layer monolithically on a GaAs substrate.

[Eighth Mode of Invention]

In an eighth mode, the present invention provides an integrated semiconductor light-emitting device similar to that of the sixth mode, except that the semiconductor optical modulator is provided inside the distributed Bragg reflector of the surface-emission laser diode. In the present mode of invention, the semiconductor optical modulator is constructed as a surface-emission type device that receives and emits the optical beam in a direction perpendicular to the substrate.

In the case the semiconductor optical modulator is located inside the distributed Bragg reflector of the surface-emission laser diode, the multiple quantum well structure constituting the optical absorption layer of the optical modulator is transparent with regard to the laser beam produced by the surface-emission laser diode. Thus, the active region of the surface-emission laser diode receives sufficient optical feedback of 99% or more from the distributed Brag reflector located away from the semiconductor optical modulator, and the laser oscillation takes place efficiently.

When a reverse bias voltage is applied to the semiconductor optical modulator, on the other hand, the bandgap energy of the multiple quantum well structure of the optical modulator is reduced as a result of the quantum confinement Stark effect, and thus, the multiple quantum well layer starts to absorb the optical beam. Thereby, the effective reflectance of the distributed Bragg reflector is decreased and there occurs an increase of laser oscillation threshold. Thus, the laser oscillation is no longer sustainable and the laser oscillation is stopped. Thus, in the case of the present invention, it is possible to modulate the intensity of the optical beam widely even in the case the optical absorption layer has a small thickness of only 1 μm in the semiconductor optical modulator. Thereby, the S/N ratio of optical modulation is improved.

Preferably, the semiconductor optical modulator is provided at the location where the optical intensity is strongest in the distributed Bragg reflector. In other words, it is preferable to provide the optical modulator in the distributed Bragg reflector in correspondence to the anti-node such that the optical absorption layer is located in the vicinity of the optical cavity in correspondence to the anti-node. By doing so, the modulation of optical beam is achieved most effectively, and the laser beam can be modulated with a smaller change of absorption coefficient.

In the case the semiconductor optical modulator is provided inside the optical cavity, it is necessary to provide one electrode for the laser diode and one electrode for the optical modulator in the optical cavity. Thus, the carriers, which have caused overflow in the active layer and reached the optical cavity, are collected by the electrode and the efficiency of carrier confinement in the active layer is degraded. In the case the semiconductor optical modulator is provided inside the distributed Bragg reflector, on the other hand, the carriers overflowed from the active layer to the cavity are blocked by the low refractive index layer of the distributed Bragg reflector that has a large bandgap. Thus, there occurs no degradation of carrier confinement into the active layer.

[Ninth Mode of Invention]

In a ninth mode, the present invention provides an integrated semiconductor light-emitting device similar to the one described in relation to the seventh mode of the invention, except that the semiconductor optical modulator is provided inside the distributed Bragg reflector located at the side of the substrate with respect to the active layer.

As the process of forming a current confinement structure of a surface-emission laser diode, it is generally practiced to conduct a selective oxidation process of an AlAs layer to form an AlOx insulating region in the AlAs layer by applying water vapor from a lateral surface thereof.

In the case of providing the semiconductor optical modulator in the distributed Bragg reflector located away from the substrate as compared with the active layer of the surface-emission laser diode, it is necessary to provide the lower electrode of the semiconductor optical modulator and the upper electrode of the surface-emission laser diode on a terrace surface formed in a part of the upper distributed Bragg reflector, while formation of forming such a terrace electrode requires the process of forming a two-step pillar structure as represented in FIG. 5. Thereby, the diameter of the lower pillar or mesa in which the AlAs layer is provided is increased inevitably, and it is necessary to conduct the selective oxidation process for forming the AlOx insulation region over a long time in order to obtain a satisfactorily small current path region in the current confinement structure. Thereby, there is a substantial risk that the obtained AlAs current path region may be varied device by device due to minute variation of oxidation rate in the AlAs layer.

In the case the semiconductor optical modulator is provided inside the lower distributed Bragg reflector located at the side of the substrate with respect to the active layer of the surface-emission laser diode, it is possible to provide the upper electrode of the semiconductor optical modulator and the lower electrode of the surface-emission laser diode on the terrace surface' formed blow the level of the active layer and the AlAs selective oxidation layer. Thereby, the size of the mesa structure or pillar structure including the active layer and the AlAs selective oxidation layer is reduced as compared with the case of the device of FIG. 5.

According to the present invention, the selective oxidation process for forming the AlOx insulating region in the AlAs layer is controlled because of the reduced length of the selective oxidation process, and the variation of threshold current caused by the variation of the AlAs current path region in the current confinement structure is effectively eliminated.

It should be noted that the foregoing effect of the present mode of the invention is valid also in the case the substrate is doped to n-type, similarly to the case of the p-type substrate. Further, the foregoing effect of the present mode of the invention is valid also in the case the integral optical semiconductor device is a three-terminal device or a four-terminal device. What is important in the present mode of the invention is that the semiconductor optical modulator is provided in the distributed Bragg reflector located at the side of the substrate, and the terrace surface, on which an electrode of the semiconductor optical modulator and an electrode of the surface-emission laser diode are provided, is located at a level below the level of the active layer and the AlAs layer. In the present mode of the invention, it should be noted that the AlAs layer has to be provided at the p-side region with regard to the active layer.

<Embodiment 6>

Figure 6:
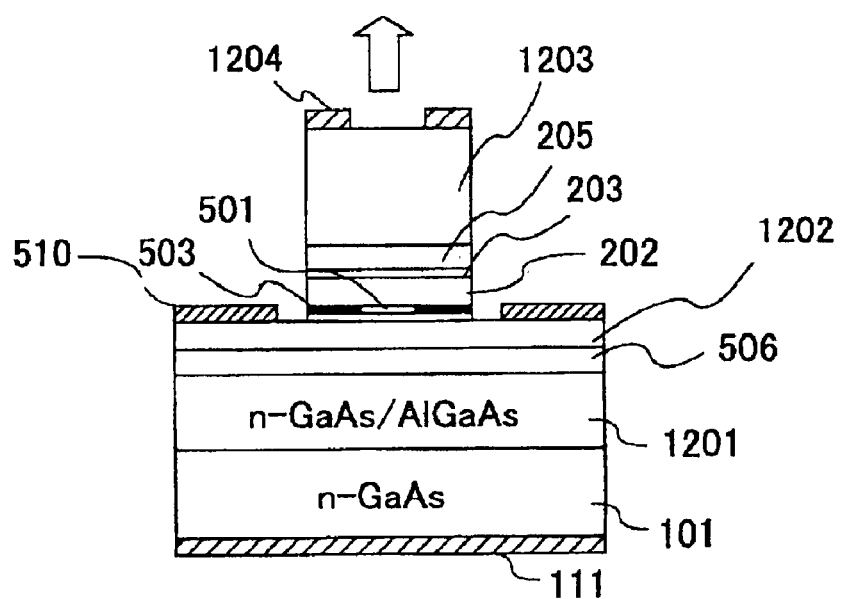
FIG. 6 is a diagram showing the construction of an integrated semiconductor light-emitting device according to another embodiment of the present invention.

FIG. 6 shows another embodiment of the integrated semiconductor light-emitting device according to the present invention wherein the integrated semiconductor light-emitting device includes an EA-type semiconductor optical modulator provided monolithically on a surface-emission laser diode to form an integral circuit. In the present embodiment, the EA-type semiconductor optical modulator is formed inside a distributed Bragg reflector of the surface-emission laser diode located at the side of the substrate.

Referring to FIG. 6, the n-type GaAs to substrate 101 carries thereon an n-type distributed Bragg reflector 1201 of the GaAs/Al$_{0.8}$Ga$_{0.2}$As structure, and the multiple quantum well structure 506 is provided on the distributed Bragg reflector 1201. Further, a lower p-type distributed Bragg reflector 1202 of the GaAs/Al$_{0.8}$Ga$_{0.2}$As structure is formed on the multiple quantum well structure 506, and the p-type AlAs layer 501, the GaAs lower spacer layer 202, the multiple quantum well active layer 203 having the GaInNAs/GaAs structure, the GaAs upper spacer layer 205, and an upper n-type distributed Bragg reflector of the GaAS/Al$_{0.8}$Ga$_{0.2}$As structure are formed consecutively on the distributed Bragg reflector 1201.

The multiple quantum well structure 506 has a construction similar to the one described with reference to FIG. 4B.

Referring to FIG. 4B again, the multiple quantum well structure 506 includes an alternate and repetitive stacking of the GaInNAs active layer 506a and the barrier layer 506b of Al$_{0.2}$Ga$_{0.8}$As, wherein it can be seen that the intermediate layer 506c of GaAs is provided at the interface between the active layer 506a and the barrier layer 506b with a thickness of 2 nm.

By providing such an intermediate layer 506c of GaAs, which is free from N and Al, between the GaInNAs quantum well layer 506a that contains N as the constituent element and the barrier layer of Al$_{0.2}$Ga$_{0.8}$As that contains Al, the problem of segregation of N at the layer interface is effectively suppressed and a high quality quantum well structure is obtained.

In the construction of FIG. 6, it should be noted that the multiple quantum well structure 506 is formed to have an optical thickness equal to an integer multiple of the quarter-wavelength of the laser oscillation wavelength.

The layered structure thus formed is subjected to a dry etching process to form a pillar structure as represented in FIG. 6, wherein the pillar is formed so as to expose the top surface of the p-type lower distributed Bragg reflector 1201 of the GaAs/Al$_{0.8}$Ga$_{0.2}$As structure.

Further, the p-type AlAs selective-oxidation layer 501 is oxidized selectively from the exposed lateral surface thereof, and the AlOx insulating region 503 is formed so as to surround the core part of AlAs.

In the construction of FIG. 6, it can be seen that an n-type electrode 1204 is formed on the top part of the n-type distributed Bragg reflector 1203 except for the region used for an optical window from which the laser beam is emitted. Further, a p-side common electrode 110 is formed on the exposed terrace surface of the p-type lower distributed Bragg reflector 1202. Furthermore, the n-type electrode 111 is provided on the bottom surface of the n-type GaAs substrate 101. The electrode 1204 is used for driving the laser diode while the electrode 111 is used for driving the semiconductor optical modulator. Further, the common electrode 510 is used by both of the laser diode and the semiconductor optical modulator.

In the construction of FIG. 6, the surface-emission laser diode is driven by applying a forward bias voltage across the p-side electrode 510 and the n-side electrode 1204, such that there occurs carrier injection into the GaInNAs/GaAs quantum well active layer 203. The carriers thus injected are confined into a small area of the active layer 203 smaller than the size of the pillar, as a result of the action of the AlOx insulating region 503 formed in the AlAs layer 501 by the lateral oxidizing process. With this, the threshold current of laser oscillation is reduced.

The carriers thus injected into the active layer 203 cause a recombination, and there is produced an optical radiation having a wavelength of 1.3 μm in correspondence to the bandgap energy of the GaInNAs quantum well layer. The optical radiation thus produced in the GaInNAs/GaAs multiple quantum well active layer 203 is then amplified as it is reflected back and forth between the n-type upper distributed Bragg reflector 1203 and the p-type lower distributed Bragg reflector 1202 as well as the n-type lower distributed Bragg reflector 1201, and there is caused a laser oscillation. The laser beam thus formed is then emitted from the optical window in the electrode 1204 in the upward direction with respect to the GaAs substrate 101.

In the EA-type semiconductor optical modulator, the multiple quantum well structure 506 is transparent in the state in which no bias voltage is applied across the p-side electrode 510 and the n-side electrode 111. Because of the absence of optical absorption in the laser cavity, reflected optical beams are fed back to the active region of the surface-emission laser diode by the p-type distributed Bragg reflector 1202 and also by the n-type lower distributed Bragg reflector 1201, and a reflectance of 99% or more, which is needed for causing laser oscillation, is successfully achieved.

When a reverse bias voltage is applied across the p-side electrode 510 and the n-side electrode 111, on the other hand, there occurs a decrease of bandgap energy in the multiple quantum well structure 506 as a result of the quantum confinement Stark effect, and there occurs optical absorption in the multiple quantum well structure 506. Thereby, the laser oscillation halts because of the decreased effective reflectance of the lower distributed Bragg reflector located at the side of the substrate 101 with regard to the active layer 203. With this, modulation of the laser beam is achieved.

In the construction of FIG. 6, it should be noted that the semiconductor optical modulator is provided inside the distributed Bragg reflector at the side of the substrate, and thus, it is possible to form the p-side electrode 510 used commonly by the semiconductor optical modulator and also by the surface-emission laser diode, on the terrace surface located below the level of the active layer 203 and the AlAs layer 501. Thereby, it is possible to reduce the lateral size or diameter of the pillar structure or mesa structure a the time of mesa etching process of the active layer 203 and the AlAs layer 501.

In the case the semiconductor optical modulator is provided in the distributed Bragg reflector at the side away from the substrate, it is necessary to increase the distance of selective oxidation as noted with reference to the structure of FIG. 5. In such a case, there is a possibility of variation in the side of the current confinement structure due to the possible variation of oxidation rate in the AlAs layer, while such a variation of the size of the current confinement structure results in a variation of threshold current of the surface-emission laser diode.

By providing the semiconductor optical modulator inside the distributed Bragg reflector located at the side of the substrate (lower distributed Bragg reflector), it becomes possible to reduce the size of the pillar structure and hence the distance needed for oxidizing the AlAs layer 501.

[Tenth Mode of Invention]

In a tenth mode, the present invention provides an integrated semiconductor light-emitting device in which a surface-emission laser diode and a semiconductor optical modulator having a multiple quantum well layer as an optical absorption layer are integrated on a single crystal semiconductor substrate such that the laser diode and the optical modulator are stacked in a thickness direction of the semiconductor layers. Further, in the present mode of the invention, the semiconductor optical modulator is provided inside the optical cavity of the surface-emission laser diode or inside the distributed Bragg reflector of the surface-emission laser diode.

In the case of integrating a semiconductor optical modulator on a surface-emission laser diode as explained in the pervious embodiment, a thickness of several ten microns is necessary for the semiconductor optical modulator so as to absorb the laser beam produced by the surface-emission laser diode, while the fabrication of a device having such a large thickness is difficult. When the thickness is insufficient, on the other hand, the difference of optical beam strength becomes small between the transparent state and absorption state, and the SN ratio of the optical modulation is deteriorated.

In the present embodiment, the semiconductor optical modulator is provided inside the optical cavity or the distributed Bragg reflector of the surface-emission laser diode. Thus, in the event no bias voltage is applied to the semiconductor optical modulator, it is transparent to the laser beam produced by the surface-emission laser diode, and there occurs a laser oscillation in the laser diode with a low threshold current. In the event a reverse bias voltage is applied to the semiconductor optical modulator, the bandgap of the multiple quantum well structure is decreased as a result of the quantum confinement Stark effect, and there occurs optical absorption. With this, there occurs an increase of optical loss in the surface-emission laser diode and the threshold current laser oscillation is increased.

Thus, it becomes possible to achieve an ON/OFF control of the laser oscillation in the integrated semiconductor light-emitting device of the present invention by applying or removing a reverse bias voltage to the semiconductor optical modulator while driving the surface-emission laser diode with a constant drive current. In this case, it is possible to change the intensity of the output laser beam significantly even in the case the thickness of the semiconductor optical modulator is 1 μm or less. With this, it is possible to increase the S/N ratio of the optical intensity modulation.

In the present embodiment, it should be noted that interruption of laser oscillation is not always required in the state that the reverse bias voltage is applied to the semiconductor optical modulator. Only an increase of threshold current level is sufficient. In such a case, there occurs a significant drop of the optical output power upon application of the reverse bias voltage to the semiconductor optical modulator although the laser oscillation itself is not interrupted.

In the Japanese Laid-Open Patent Publication 5-152674, there is a disclosure about the structure in which a semiconductor optical modulator and a surface-emission laser diode are stacked monolithically. In this prior art, however, the laser beam produced by the laser diode is modulated externally by the semiconductor optical modulator provided outside the laser diode. Thus, the forgoing prior art suffers from the problem of degradation of the S/N ratio in the case the thickness of the optical absorption layer is small.

Contrary to the foregoing prior art, the present invention can achieve a large change of optical output with a small change of optical absorption, by modulating the internal loss of the laser diode.

[Embodiment 7]

Figure 14:
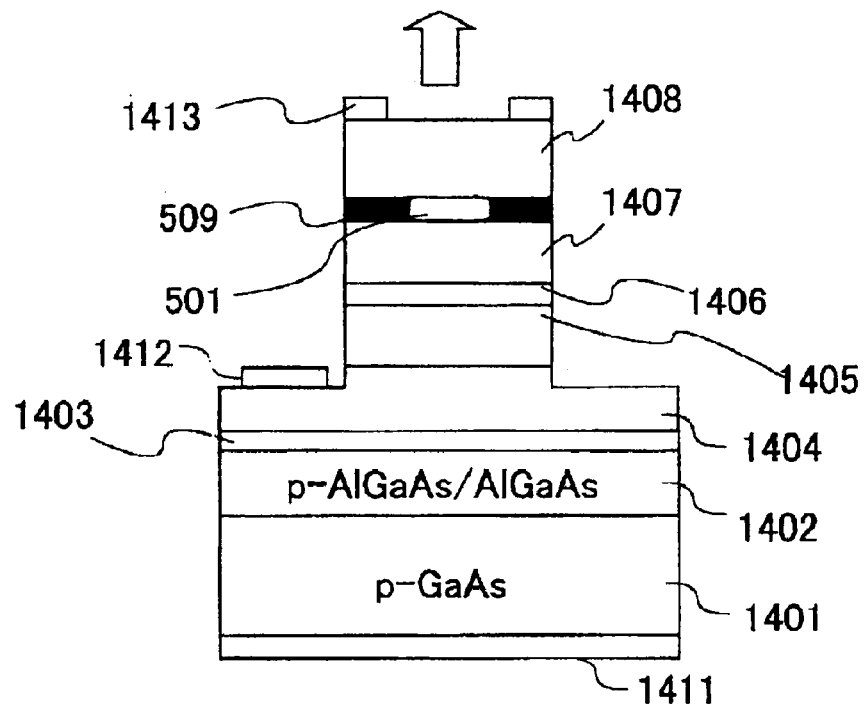
FIG. 14 is a diagram showing the construction of an integrated semiconductor light-emitting device according to another embodiment of the present invention.

FIG. 14 shows the construction of an integrated semiconductor light-emitting device according to the present invention.

Referring to FIG. 14, the integrated semiconductor light-emitting device is constructed on a p-type GaAs substrate 1401 and includes a lower distributed Bragg reflector 1402 of p-type having the construction of $Al_{0.2}Ga_{0.8}As/Al_{0.9}Ga_{0.1}As$ is formed on the GaAs substrate 1401, wherein a multiple quantum well layer 1403 of GaAs/Al$_{0.2}$Ga$_{0.8}$As structure is formed on the lower distributed Bragg reflector 1401. Further, an n-type distributed Bragg reflector 1404 of the Al$_{0.2}$Ga$_{0.8}$As/Al$_{0.9}$Ga$_{0.1}$As structure, a lower spacer layer 1405 of Al$_{0.2}$Ga$_{0.8}$As, a multiple quantum well layer 1406 of GaAs/Al$_{0.2}$Ga$_{0.8}$As structure, an upper spacer layer 1407 of Al$_{0.2}$Ga$_{0.8}$As, a p-type AlAs layer 501, and an upper distributed Bragg reflector 1408 of p-type Al$_{0.2}$Ga$_{0.8}$As/Al$_{0.9}$Ga$_{0.1}$As structure, are formed consecutively on the multiple quantum well layer 1403.

In the construction of FIG. 14, the layered structure thus formed is then subjected to a dry etching process to form a pillar structure, wherein the dry etching process for forming the pillar structure is conducted such that the dry etching reaches the distributed Bragg reflector 1404 of the n-type Al$_{0.2}$Ga$_{0.8}$As/Al$_{0.9}$Ga$_{0.1}$As structure.

In the structure of FIG. 5, it should be noted that the marginal part of the p-type AlAs layer 501 exposed at the sidewall surface of the pillar structure is subjected to a lateral oxidation process, and there is formed an AlOx insulation region 509 in the AlAs layer 501 such that the insulation region 509 surrounds laterally the core part of the AlAs layer 501.

In the structure of FIG. 14, it should be noted that there is formed a p-side electrode 1413 on the surface of the p-type distributed Bragg reflector 1408 locating at the top part of the pillar except for the region from which the output optical beam is emitted. Further, an n-side common electrode 1412 is formed on the exposed terrace surface of the distributed Bragg reflector 1404 formed as a result of the dry etching process, and a bottom electrode 1411 is provided on the bottom surface of the GaAs substrate 1401.

In the construction of FIG. 14, there occurs carrier injection into the GaAs/Al$_{0.2}$Ga$_{0.8}$As multiple quantum well active layer 1406 by applying a forward bias across the p-side electrode 1413 and the n-side electrode 1412, wherein the carriers (holes) thus injected from the electrode 1413 are confined into the narrow AlAs region 501 surrounded by the AlOx region 509 narrower than the diameter of the pillar. As a result of recombination of the carriers thus injected in the GaAs/Al$_{0.2}$Ga$_{0.8}$As multiple quantum well active layer 1406, there is produced an optical radiation with a wavelength of 0.85 μm. The optical radiation thus produced is amplified as it is reflected back and forth between the lower distributed Bragg reflector including the p-type reflector 1402 and the n-type reflector 1404 and the upper distributed Bragg reflector 1408, and the laser oscillation takes place. The laser beam thus formed as a result of the laser oscillation is emitted from the optical window formed in the electrode 1413 in the upward direction.

It should be noted that the multiple quantum well layer 1403 of the GaAs/Al$_{0.2}$Ga$_{0.8}$As structure has a band structure designed such that the multiple quantum well layer 1403 is transparent with regard to the laser beam produced by the multiple quantum well active layer 1406 of the GaAs/Al$_{0.2}$Ga$_{0.8}$As structure in the state in which no bias is applied across the p-side electrode 1411 and the n-side electrode 1412. Thus, in this state, the GaAs/Al$_{0.2}$Ga$_{0.8}$As multiple quantum well optical absorption layer 1403 does not cause optical absorption, and there occurs a laser oscillation with a low threshold current.

When a reverse bias voltage is applied across the p-side electrode 1411 and the n-side electrode 1412, on the other hand, the bandgap of the multiple quantum well layer 1403 of the GaAs/Al$_{0.2}$Ga$_{0.8}$As structure is decreased as a result of the quantum confinement Stark effect, and there occurs absorption of the laser beam in the quantum well structure 1403 produced by the multiple quantum well active layer 1406 of the GaAs/Al$_{0.2}$Ga$_{0.8}$As structure. As a result, the optical loss inside the surface-emission laser diode is increased and there occurs an increase of the threshold current of laser oscillation.

Thus, by setting the electric current injected from the p-side electrode 1413 and the n-side electrode 1412 into the GaAs/Al$_{0.2}$Ga$_{0.8}$As multiple quantum well active layer 1406 of the GaAS/Al$_{0.2}$Ga$_{0.8}$As structure between the threshold current for the case in which no bias is applied across the p-side electrode 1411 and the n-side electrode 1412 and the threshold current for the case in which the reverse bias voltage is applied across the p-side electrode 1411 and the n-side electrode 1412, it is possible to operate the integrated semiconductor optical device such that there occurs a laser oscillation in the state no bias voltage is applied across the electrodes 1411 and 1412 and the laser oscillation stops in the case the bias voltage is applied across the electrodes 1411 and 1412. With this, it becomes possible to cause a large change in the output power of the laser diode.

In the present embodiment, it is possible to induce a large change of output power by a small change of absorption coefficient in the optical absorption layer, and the S/N ratio of optical modulation is improved substantially as compared with the case of modulating the laser beam produced by the laser diode by an external optical modulator.

Further, according to the present invention, it is possible to carry out the desired optical modulation of the laser beam with a speed much higher than the speed achieved by directly modulating the laser dive current as a result of the use of the EA modulation conducted by applying an electric field to the GaAs/Al$_{0.2}$Ga$_{0.8}$As multiple quantum well optical absorption layer 1403.

According to the present invention it is possible to achieve an optical modulation with a speed of 20-50 GHz, which substantially exceeds the upper limit modulation speed of 10 GHz for the case of direct modulation of the laser diode. By using the integrated semiconductor light-emitting device of the present invention, it is possible to construct a broadband optical transmission system carrying a very large amount of signal traffic.

In the present embodiment, it is also possible to use the material system of InGaAs/AlGaAs, GaInP/AlGaInP, InGaN/AlGaN, GaInNAsSb/AlGaAs, and the like, in addition to the material system of GaAs/AlGaAs for constructing the surface-emission laser diode of the 0.85 μm band.

[Eleventh Mode of the Invention]

In an eleventh mode, the present invention provides an integrated semiconductor light-emitting device in which a surface-emission laser diode and a semiconductor optical modulator having as an optical absorption layer are integrated on a single crystal semiconductor substrate such that the laser diode and the optical modulator are stacked in a thickness direction of the semiconductor layers. In the present mode of the invention, the semiconductor optical modulator is provided inside the distributed Bragg reflector of the surface-emission laser diode located at the opposite side of the optical emission surface of the surface-emission laser diode from which the laser beam is emitted.

In a surface-emission laser diode, the distributed Bragg reflector used therein is generally designed to have a reflectance of 99% or more for reducing the threshold current. Particularly, the distributed Bragg reflector located at the side away: from the optical emission surface of the laser diode is usually designed to have a very high reflectance of 99.9% or more in view of the fact that there is no need of taking out optical beam through such a distributed Bragg reflector. On the other hand, it is practiced to reduce the reflectance of the distributed Bragg reflector located at the side of the optical emission surface so as to facilitate optical emission of the laser beam.

In the eleventh mode of the present invention, the semiconductor optical modulator is located inside the distributed Bragg reflector at the far side from the optical emission surface, wherein the distributed Bragg reflector located at the for side of the optical emission surface is designed to provide a higher reflectance as compared with the distributed Bragg reflector located near the optical emission surface. By providing the semiconductor optical modulator in the distributed Bragg reflector having such a higher reflectance, it becomes possible in the present mode of the invention to increase the magnitude of change of the threshold current by the semiconductor optical modulator.

[Twelfth Mode of the Invention]

In a twelfth mode, the present invention provides an integrated semiconductor light-emitting device in which a surface-emission laser diode and a semiconductor optical modulator having as an optical absorption layer are integrated on a single crystal semiconductor substrate such that the laser diode and the optical modulator are stacked in a thickness direction of the semiconductor layers. In the present mode of the invention, the semiconductor optical modulator is provided inside the distributed Bragg reflector of the surface-emission laser diode. Thereby, at least one of the electrodes of the semiconductor optical modulator is provided at a position within one period of the distributed Bragg reflector adjacent to the semiconductor optical modulator.

A semiconductor distributed Bragg reflector is constructed by stacking a high refractive index layer having a small bandgap and a low refractive index layer having a large bandgap alternately. Thus, there is caused a heterospike formation at the interface between the high refractive index layer and the low refractive index layer, and injection of carriers is prevented by the existence of a such heterospike. Further, the existence of depletion layer formed at the heterointerface increases the capacitance component of the distributed Bragg reflector. Thereby, the high-frequency transmission characteristics of the distributed Bragg reflector are deteriorated as a result of the increased resistance and capacitance.

In the twelfth mode of the present invention, the electrode of the semiconductor optical modulator used for modulating the optical absorption coefficient of the optical absorption layer is provided within one period from the distributed Bragg reflector adjacent to the semiconductor optical modulator. Thus, the electric field is applied to the optical absorption layer with minimum distance, and the effect of delay caused by resistance and capacitance is reduced. Thereby, a higher operational speed becomes possible.

<Embodiment 8>

Figure 15:
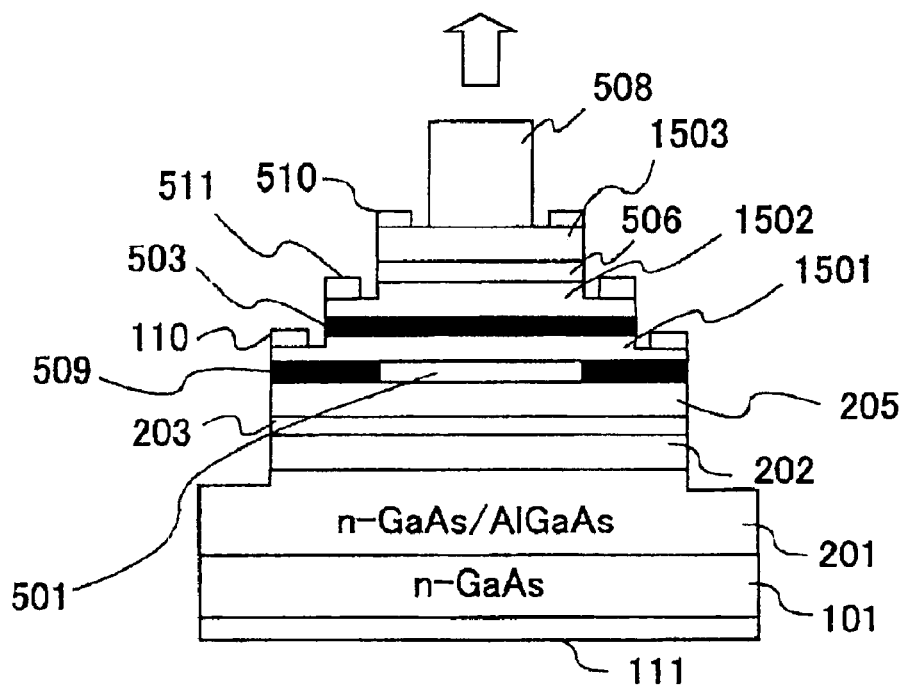
FIG. 15 is a diagram showing the construction of an integrated semiconductor light-emitting device according to another embodiment of the present invention.

FIG. 15 shows another example of the integrated semiconductor light-emitting device according to the present invention.

Referring to FIG. 15, the n-type GaAs substrate 101 carries thereon the n-type distributed Bragg reflector 201 of the GaAs/$Al_{0.8}Ga_{0.2}$As structure, and the lower spacer layer 202 of n-type GaAS and the multiple quantum well active layer 203 having the GaInNAs/GaAs structure are formed consecutively on the distributed Bragg reflector 201.

On the multiple quantum well active layer 203, there is provided the first upper spacer layer 205 of GaAs, and the p-type AlAs selective oxidation layer 501 is formed on the GaAs spacer layer 205. Further, the p-type AlAs layer 501 and a p-type GaAs layer 1501 are formed consecutively thereon.

The p-type GaAs layer 1501 carries thereon an AlOx insulation layer 503, and an n-type GaAs layer 1502 constituting a part of the EA-type semiconductor optical modulator is provided on the GaAs layer 1501. Further, the multiple quantum well structure 506 is formed on the layer 1502 and a p-type GaAs layer 1502 is formed on the multiple quantum well structure 506.

Here, the AlOx layer 503 is provided for insulating the surface-emission laser diode from the EA-mode semiconductor optical modulator.

The multiple quantum well structure 506 has a construction similar to the one described with reference to FIG. 4B.

Referring to FIG. 4B again, the multiple quantum well structure 506 includes an alternate and repetitive stacking of the GaInNAs active layer 506a and the barrier layer 506b of $Al_{0.2}Ga_{0.8}$As, wherein it can be seen that the intermediate layer 506c of GaAs is provided at the interface between the active layer 506a and the barrier layer 506b with a thickness of 2 nm.

In the construction of FIG. 15, it is further noted that the p-type GaAs layer 1503 carries thereon the p-type distributed Bragg reflector 503 of the GaAs/$Al_{0.8}Ga_{0.2}$As structure.

In the construction of FIG. 15, the layered structure thus formed is subjected to a dry etching process to form a four-step pillar structure, wherein the uppermost pillar is formed so as to expose a terrace surface of the p-type GaAs layer 1503, while the second pillar is formed so as to expose the terrace surface of the n-type GaAs layer 1502. Further, the third pillar is formed so as to expose the terrace surface of the p-type GaAs layer 1501, and fourth pillar is formed so as to expose the terrace surface of the distributed Bragg reflector 201.

Further, the p-type AlAs selective oxidation layer 501 is oxidized selectively from the exposed lateral surface thereof, and the AlOx insulating region 509 is formed so as to surround the core part of AlAs. On the other hand, the AlOx layer 503 electrically separating the surface emission laser diode and the semiconductor optical modulator is formed by oxidizing the AlAs layer totally from the lateral surface thereof. This oxidation process of forming the AlOx layer 503 can be conducted simultaneously to the step of forming the AlOx region 509.

In the construction of FIG. 15, it can be seen that the p-side electrode 510 of the optical modulator is formed on the exposed surface of the p-type GaAs layer 1503, and the n-side electrode 511 is formed on the second terrace surface formed in the n-type GaAs layer 1502. Furthermore, the p-type electrode 110 of the laser diode is provided on the third terrace surface formed in the p-type GaAs layer 1501, and the n-side electrode 111 of the laser diode is provided on the rear surface of the n-type GaAs substrate 101.

In the construction of FIG. 15, the surface-emission laser diode is driven by applying a forward bias voltage across the p-side electrode 110 and the n-side electrode 111, such that there occurs carrier injection into the GaInNAs/GaAs quantum well active layer 203. The carriers thus injected are confined into a small area of the active layer 203 smaller than the size of the pillar, as a result of the action of the AlOx insulating region 509 formed in the AlAs layer 501 by the lateral oxidizing process. The carriers thus injected into the active layer 203 cause a recombination, and there is produced an optical radiation having a wavelength of 1.3 μm in correspondence to the bandgap energy of the GaInNAs quantum well layer. The optical radiation thus produced in the GaIn- NAs/GaAs multiple quantum well active layer 203 is then amplified as it is reflected back and forth between the n-type distributed Bragg reflector 201 and the n-type upper distributed Bragg reflector 508, and there occurs a laser oscillation. The laser beam thus formed is then emitted from the optical window in the electrode 511 in the upward direction with respect to the GaAs substrate 101.

In the EA-type semiconductor optical modulator, the multiple quantum well structure 506 is transparent in the state in which no bias voltage is applied across the p-side electrode 510 and the n-side electrode 511. Because of the absence of optical absorption in the laser cavity, the surface-emission laser diode causes the laser oscillation with a small threshold current.

When a reverse bias voltage is applied across the p-side electrode 510 and the n-side electrode 511, on the other hand, there occurs a decrease of bandgap energy in the multiple quantum well structure 506 as a result of the quantum confinement Stark effect, and there occurs optical absorption in the multiple quantum well structure 506. Thereby, the laser oscillation halts because of the increased optical loss in the cavity. Thus, the present embodiment can achieve an optical modulation of the laser beam produced by the surface-emission laser diode.

In the integrated semiconductor light-emitting device of FIG. 15, the electrodes 510 and 511 of the semiconductor optical modulator used for modulating the optical absorption coefficient of the multiple quantum well structure 506 are provided on the GaAs layers 1502 and 1503 adjacent to the semiconductor optical modulator. Thus, the electric filed is induced, in response to the application of the reverse bias voltage across the electrodes 510 and 506, directly in the multiple quantum well optical absorption layer 506 without propagating through the distributed Bragg reflector, and the delay caused by the resistance and capacitance of the distributed Bragg reflector is eliminated. Thereby, the integrated semiconductor optical device of the present invention can function at a very high speed.

[Thirteenth Mode of Invention]

In a thirteenth mode, the present invention uses, in an integrated semiconductor light-emitting device, an insulation layer formed by selective oxidation of an AlAs layer or an AlGaAs layer for the insulation between the semiconductor optical modulator and the surface-emission laser diode.

Generally, the electrical insulation between a semiconductor optical modulator and the laser diode has been achieved by applying a reverse bias voltage to a pn junction. However, the electrical insulation using such a reverse biased pn junction is not always reliable due to the possibility of tunneling or breakdown associated with crystal defects, and there is a risk that the device may be damaged due to the large current flowing through the active layer of the laser diode.

The insulation film formed as a result of oxidation of AlAs or AlGaAs is an excellent insulation film. Thus, by using such an insulation film formed by the selective oxidation process of AlAs or AlGaAs for the insulation film, it is possible to increase the breakdown voltage of the insulation film separating the semiconductor optical modulator from the laser diode to 20V or more.

Further, it should be noted that the insulation film thus formed by the selective oxidation of AlAs or AlGaAs is used also for forming the current confinement structure. Thereby, it becomes possible to conduct the selective oxidation process for forming the current confinement structure of the surface-emission laser diode and the oxidation process for forming the insulation layer between the semiconductor optical modulator and the surface-emission laser diode simultaneously in a common oxidation step.

Thereby, it is possible to adjust the oxidation rate in correspondence to the distance of selective oxidation by changing the thickness or Al content between the layer used for the current confinement structure and the insulation layer. By reducing the thickness of the AlAs or AlGaAs layer, for example, it is possible to reduce the oxidation rate. Further, the oxidation rate is reduced also by reducing the Al content in the AlGaAs layer.

It should be noted that foregoing explanation, based on the structure constructed on an n-type substrate, is applicable also to the case of using a p-type substrate. Further, it is possible to provide a tunneling layer in the surface emission laser diode in the vicinity of the active layer and inject the carries through such a tunneling layer.

[Fourteenth Mode of Invention]

In a fourteenth mode, the present invention uses, in an integrated semiconductor light-emitting device of any of the sixth through twelfth mode of the invention, a compositional gradation layer between a high refractive index layer and a low refractive index layer constituting the distributed Bragg reflector of the surface-emission laser diode, such that the compositional gradation layer has a thickness of 30-50 nm.

Figure 16:
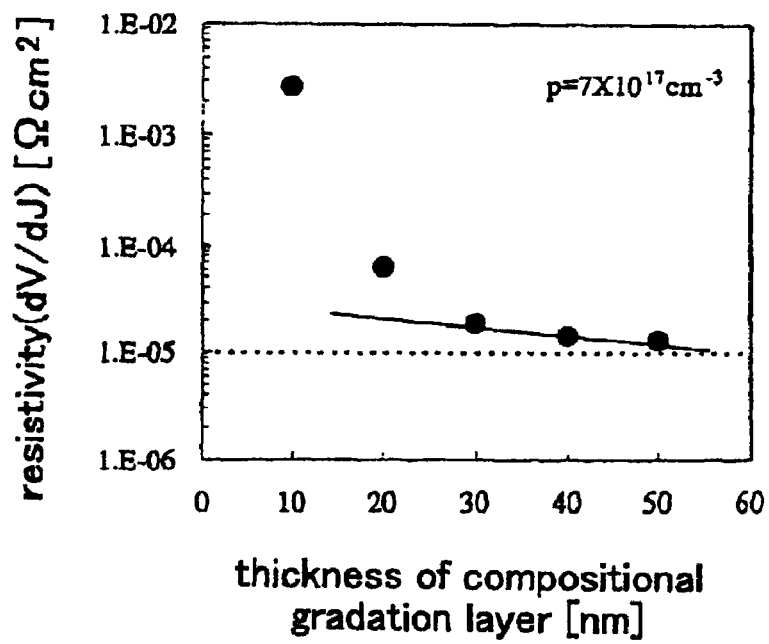
FIG. 16 is a diagram showing the relationship between the resistivity of the distributed Bragg reflector and the thickness of a compositional gradation layer.

FIG. 16 shows the result of calculation of resistance of the distributed Bragg reflector having the GaAs/AlAs structure (repeated four times) while changing the thickness of the compositional gradation layer variously. In the calculation of FIG. 16, each of the layers constituting the distributed Bragg reflector was doped to the carrier density of $7 \times 10^{17}$ cm$^{-3}$.

From the result of FIG. 16, it can be seen that the resistance of the distributed Bragg reflector drops sharply when the thickness of the compositional gradation layer has exceeded 30 nm and the resistance approaches to that of a bulk material (represented in FIG. 16 by a dotted line).

Figure 17:
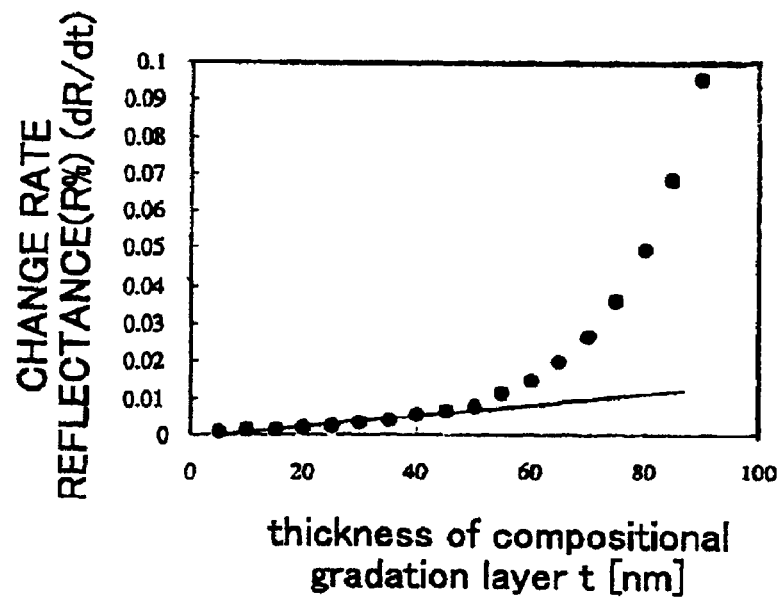
FIG. 17 is a diagram showing the relationship between the resistivity change rate of the distributed Bragg reflector and the thickness of a compositional gradation layer.

FIG. 17 shows the change of reflectance of the distributed Bragg reflector having the GaAs/AlAs structure tuned to the wavelength band of 1.3 μm, as a function of the thickness of the compositional gradation layer.

Referring to FIG. 17, it can be seen that there occurs a sharp change of reflectance when the thickness of the compositional gradation layer has exceeded 50 nm as can be seen when compared with a tangential line drawn in FIG. 17. Associated with this, there occurs a sharp rise of the threshold current of laser oscillation.

From the results of FIG. 16 and FIG. 17, it is concluded that a low-resistance distributed Bragg reflector having a high reflectance is obtained by setting the thickness of the compositional gradation layer in the range of 30-50 nm.

Another advantage of providing such a compositional gradation layer is that the notch formation at the interface between the high refractive index layer and the low refractive index layer is suppressed and the capacitance of the distributed Bragg reflector is reduced.

Thus, the integrated semiconductor light-emitting device of the present mode of invention can perform successfully even at very high modulation frequencies.

[Fifteenth Mode of Invention]

In a fifteenth mode, the present invention provides a tunable laser apparatus, comprising: an ASE (amplitude spontaneous emission) optical radiation source provided in an optical cavity having a pair of reflectors; an wavelength divide filter splitting an optical radiation produced by the ASE optical source into optical radiation components having respective wavelengths; an optical gate array for selectively amplifying an optical radiation component; and a semiconductor optical modulator modulating an intensity of said optical radiation component passed through said optical gate array, wherein a semiconductor optical modulator of any of the first and second modes of the present invention is used for the semiconductor optical modulator.

Here, the ASE optical source may be constructed by using a semiconductor optical amplifier constructed on a GaAs substrate such as a single crystal GaAs substrate on which a gain region is provided together with a p-side electrode and an n-side electrode for injecting a current into the gain region. For the gain region, it is possible to use a semiconductor layer of any of GaNAs, GaInNAs, GaNAsSb and GaInNAsSb.

It should be noted that the mixed crystal containing As and N such as GaNAs, GaInNAs, GaNAsSb, GaInNAsSb, can be grown on the GaAs substrate in the form of a single-crystal film and has a bandgap wavelength of 1.2-1.6 μm corresponding to the minimum optical loss of a quartz optical fiber. Thus, the semiconductor optical amplifier has a gain with regard to the laser beam having the wavelength of 1.3-1.55 μm.

In addition, it is known that the conduction band discontinuity can be reduced when a mixed crystal layer containing As and N as the group. V element is used to form a heterojunction with an AlGaAs material or an AlGaInP material. Further, associated with the fact that the mixed crystal containing N and As for the group V element can be grown on a GaAs substrate, it is possible in the semiconductor optical amplifier to use a widegap material such as AlGaAs or AlGaInP for the cladding layer. Thereby, it becomes possible to secure a conduction band discontinuity of 200 meV or more between the gain region formed of any of GaNAs, GaInNAs, GaNAsSb, GaInNAsSb and the cladding layer.

Because of the large conduction band discontinuity, the problem of overflowing of electrons from the gain region to the cladding layer is suppressed effectively even when the environmental temperature is increased, and the decrease of gain with temperature rise is effectively suppressed. Thus, in the semiconductor optical modulator having a gain region formed of any of GaNAs, GaInNAs, GaNAsSb, GaInNAsSb, it is possible to reduce the change of optical amplification factor with regard to the change of the environmental temperature.

In the conventional material system using an InP substrate, it is known that the gain coefficient of the InGaAsP layer has a low value of about 500 cm$^{-1}$ (IEEE J. Quantum Electron., vol. 27, pp. 1804-1811). In the case of a GaInNAs layer (1.2 μm) formed on a GaAs substrate, on the other hand, a very large value of 2243 cm$^{-1}$ is reported (Jpn. J. Appl. Phys vol. 35, pp. 206-209).

Figure 7:
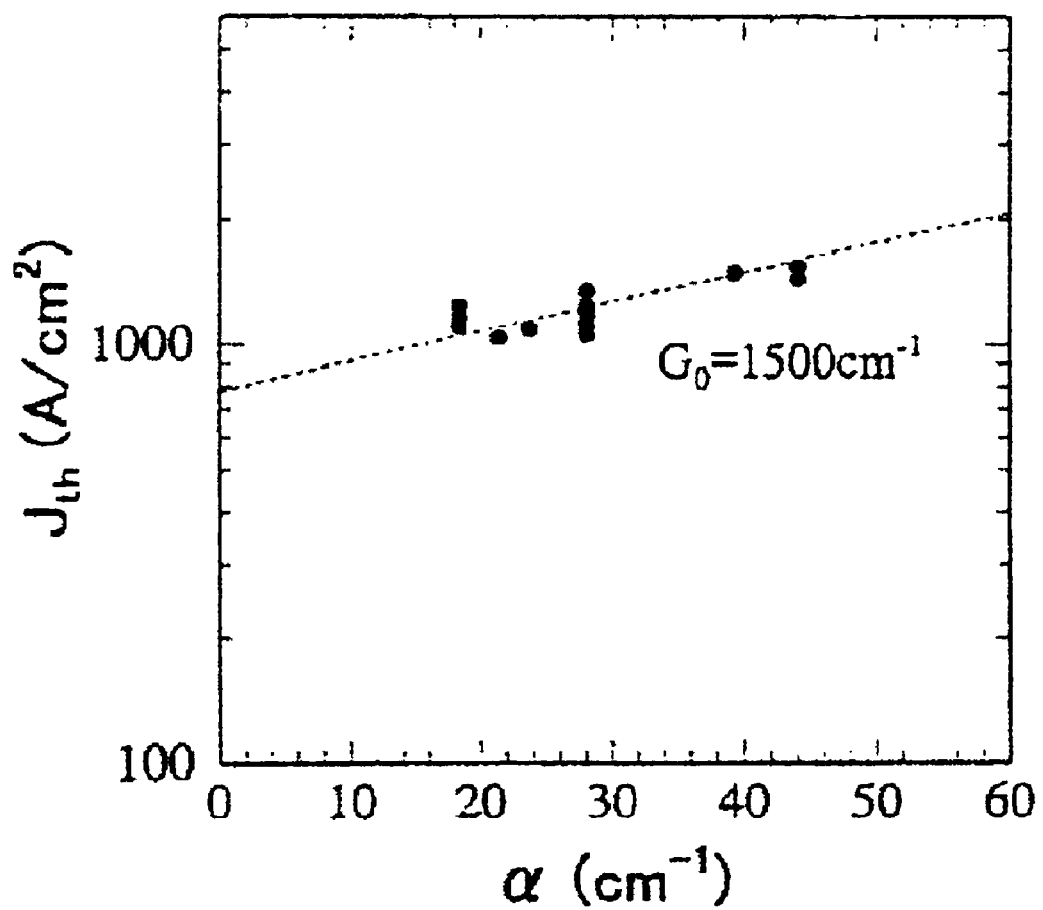
FIG. 7 is a diagram showing the relationship between a threshold current and an optical loss obtained for an edge-emission type laser diode having an active layer of GaInNAs.

FIG. 7 shows the relationship between the threshold current density Jth and the total loss a for an edge-emission laser diode having a GaInNAs active layer with a wavelength of 1.3 μm band.

From FIG. 7, it can be seen that a large value of 1500 cm−1 is obtained for the gain coefficient Go of the GaInNAs layer even at the wavelength of 1.3 μm band. Thus, it is concluded that a GaInNAs layer formed on a GaAs substrate has a much larger gain coefficient as compared with an InGaAsP material formed on an InP substrate and is suitable for constructing a gain region of a semiconductor optical amplifier operable in the wavelength band of 1.2-1.3 μm.

In the foregoing semiconductor optical amplifier, it should be noted that the gain region has a multiple quantum well structure characterized by a multiple stacking of a quantum well layer of any of GaNAs, GaInNAs, GaNAsSb and GaInNAsSb In the multiple quantum well structure, a plurality, of quantum well layer having different bandgaps are stacked.

Thus, in such a semiconductor optical amplifier, it is possible to reduce the change of the optical amplification factor by forming the gain region by the quantum well layer of any of GaNAs, GaInNAs, GaNAsSb, and GaInNAsSb.

Further, it is also possible to change the energy bandgap of the quantum well layer by changing the mixed crystal composition or thickness (well width) of each quantum well layer. In this case, each of the quantum well layer has a corresponding, mutually different wavelength bands, and thus, the multiple quantum well structure provides a gain over a broad wavelength band as a result of superposition of the gain characteristics of various quantum wells. The broadband optical amplifier of such a construction can be used conveniently in a wavelength-division multiplexing optical transmission system that uses a relatively large wavelength interval between the wavelength channels.

It is important, in the case of increasing the bandwidth by using plural quantum well layers of different bandgaps, to control the gain of each quantum well layer as uniform as possible. However, the use of different bandgaps generally results in different gain coefficients between different quantum well layers. Thereby, the barrier height of carrier confinement is changed also in each quantum well.

In the case of the semiconductor optical amplifier noted above that uses the quantum well layer of any of GaNAs, GaInNAs, GaNAsSb and GaInNAsSb for the gain region, on the other hand, it is possible to change the gain coefficient while maintaining the same energy bandgap, by controlling the strain or N content of the quantum well layer.

By increasing the N content, the conduction band edge of the quantum well layer is shifted in the lower energy side in the band diagram, while by increasing the Sb content, the conduction band edge is shifted to the higher energy side. Thus, it is possible to arrange the electron confinement barrier height for each of the quantum well layers. With this, it is possible to achieve uniformity of gain coefficients of various quantum well layers.

Figure 8A:
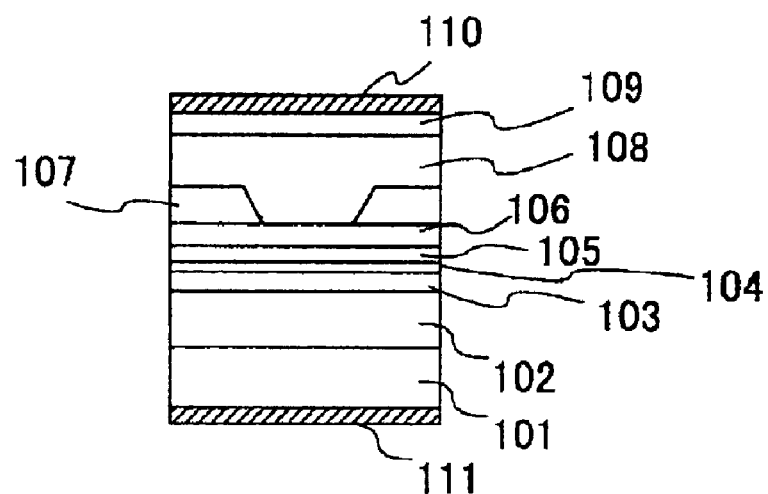
FIGS. 8A and 8B are diagrams showing the construction of an optical amplifier according to another embodiment of the present invention.
Figure 8B:
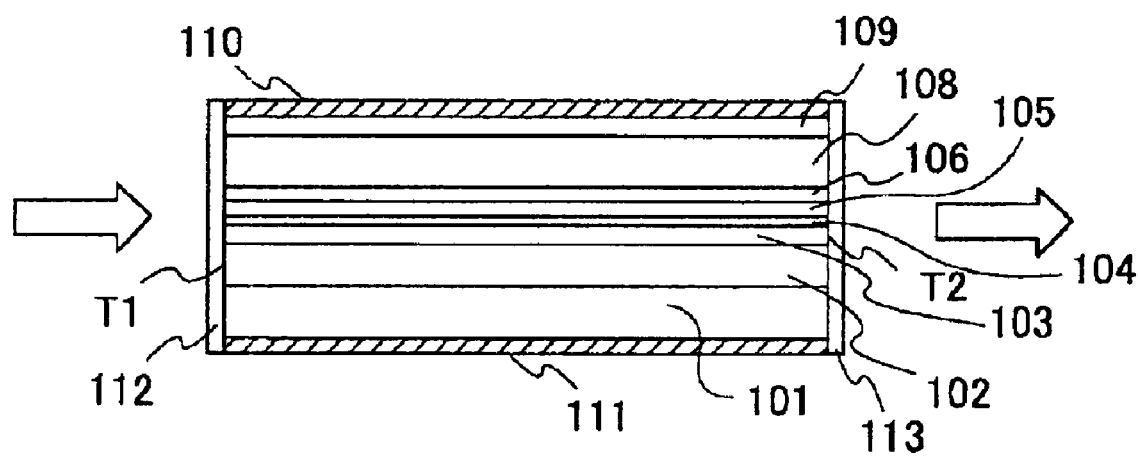

FIGS. 8A and 8B show the construction of a semiconductor optical amplifier of the present mode of the invention, wherein FIG. 8A shows the optical amplifier in a front view while FIG. 8B shows the optical amplifier in a longitudinal cross sectional view.

Referring to FIGS. 8A and 8B, the semiconductor optical amplifier is constructed on the n-type GaAs substrate 101 and includes an n-type cladding layer 102 of $Al_{0.4}Ga_{0.6}As$ formed on the GaAs substrate 101, the lower optical waveguide layer 103 of GaAs formed on the n-type cladding layer 102, and the multiple quantum well active layer 104 of the GaInNAs/GaAs structure is formed on the lower optical waveguide layer 103.

The multiple quantum well active layer 104 carries thereon the upper optical waveguide layer 105 of GaAs, and the first p-type cladding layer 106 of $Ga_{0.5}In_{0.5}P$ is formed on the upper optical waveguide layer 105.

In one example, the GaInNAs/GaAs multiple quantum well layer 104 is formed by repeating a GaInNAs quantum well layer having a thickness of 7 nm and a GaAs barrier layer having a thickens of 10 nm three times.

On the foregoing first p-type cladding layer 106 of $Ga_{0.5}In_{0.5}P$, it can be seen that there is formed a current blocking layer 107 of n-type $Al_{0.5}In_{0.5}P$ at both lateral sides of the stripe region in which current injection is made. Such a current blocking layer 107 is easily formed by applying chemical etching process to the n-type $Al_{0.5}Al_{0.5}P$ layer grown for the current blocking layer 107 along the stripe region by using a sulfuric etchant. By using such a sulfuric etchant, only the AlInP layer is etched while no etching is made in the GaInP layer. Thus, only the current blocking layer 107 of n-type $Al_{0.5}In_{0.5}P$ is etched as a result of such a chemical etching process.

In the structure of FIGS. 8A and 8B, a second p-type cladding layer 108 of $Al_{0.4}Ga_{0.6}As$ is grown on the current blocking layer 107 in contact with the first p-type cladding layer 106 of $Ga_{0.5}In_{0.5}P$ along the stripe region, and the cap layer 109 of p-type. GaAs is grown on the second p-type cladding layer 108.

Further, the p-side electrode 110 is formed on the p-type GaAs cap layer 109 and the n-side electrode 111 is provided on the bottom surface of the n-type GaAs substrate 101.

Further, the cleaved end surfaces T1 and T2 are covered with the anti-reflection coatings 112 and 113 having a reflectance of 0.2% or less.

It should be noted that the semiconductor optical modulator of FIGS. 8A and 8B is designed to have a device of the traveling-wave type. Thus, the laser beam incident from the rear end surface T1 is amplified as it is guided along the waveguide including the GaInNAs/GaAs multiple quantum well active layer 104 that has an optical gain, and the laser beam thus amplified is emitted from the front end surface T2. In the direction perpendicular to the substrate 101, there is formed an SCH structure by sandwiching the GaAs optical waveguide layers 103 and 105 with the cladding layers 102 and 106 as well as by the cladding layer 108 having a lower refractive index.

In the direction parallel to the substrate 101, there is also formed an optical waveguide structure that confines the optical radiation in the stripe region. It should be noted that the current blocking layer 107 of n-type $Al_{0.5}In_{0.5}P$ located at both lateral sides of the stripe region has a refractive index smaller than the refractive index of the p-type cladding layers 106 and 108. In addition, it should be noted that the current blocking layer 107 of n-type $Al_{0.5}Ga_{0.5}P$ is transparent to the optical beam guided through the optical waveguide. Thus, there occurs no optical absorption when the optical beam is guided through the optical waveguide from the end surface T1 to the end surface T2.

In the semiconductor optical amplifier of FIG. 8, there occurs injection of holes and electrons respectively from the p-side electrode 110 and the n-side electrode 111 into the GaInNAs/GaAs multiple quantum well active layer 104 upon application of a forward bias voltage across the electrodes 110 and 111, and there is induced a population inversion of carriers in the active layer 104. Thus, there occurs stimulated emission in response to the incident optical beam, and the incident optical beam is amplified as it travels from the end surface T1 to the end surface T2.

In the construction of FIGS. 8A and 8B, it should be noted that the anti-reflection coatings 112 and 113 on the end surfaces T1 and T2 function so as to suppress the laser oscillation in the Fabry-Perot mode. While the anti-reflecting coatings 112 and 113 are used in the embodiment of FIGS. 8A and 8B for suppressing the Fabry-Perot mode laser oscillation, other means such as forming stripe region obliquely to the end surfaces T1 and T2 or forming a window structure in the vicinity of the optical emission surface may be used for suppressing the Fabry-Perot mode laser oscillation. Further, it is also possible to provide an optical absorption region in the vicinity of the optical emission surface. Further, it is possible to use any of these means with the anti-reflection coatings 112 and 113.

It should be noted that the semiconductor optical modulator of FIGS. 8A and 8B includes the GaInNAs gain region (quantum well layer) on the GaAs substrate 101, wherein the GaInNAs crystal layer grown on a GaAs substrate has a bandgap wavelength of 1.2-1.6 μm. Thus, the gain region shows an optical gain with regard to the optical radiation having a wavelength of 1.3 μm or 1.55 μm used for optical fiber telecommunication. Further, GaInNAs is known as a material that can achieve a large conduction band discontinuity as compared with the valence band when used to form a heterojunction with a material of AlGaAs system or AlGaInP system.

Further, it is possible to form such a GaInNAs layer on a GaAs substrate, and thus it becomes possible to use a widegap material such as GaInP or AlGaAs as the cladding layer in combination with the GaInNAs layer. Thereby, it becomes possible to secure a large conductive band discontinuity of about 200 meV between the GaInNAs gain region and the cladding layer. Thus, the proportion of the electrons causing overflowing from the gain region to the cladding layer is reduced significantly even in the case the environmental temperature is increased, and the decrease of gain associated with the temperature rise is effectively suppressed. Thereby, the change of optical amplification factor with the environmental temperature is minimized.

In the construction of FIGS. 8A and 8B, the material system of GaInNAs has been used for the material capable of being formed on the GaAs substrate 101 and simultaneously capable of providing a gain in the long wavelength band. However, it is also possible to use any of GaNAs, GaNAsSb or GaInNAsSb for the same purpose with similar results.

Further, the construction of FIGS. 8A and 8B can be modified so as to form a plurality of stripe regions on the same substrate 101. With this, it is possible to form a one-dimensional array of semiconductor optical amplifier monolithically on a common substrate.

Figure 9:
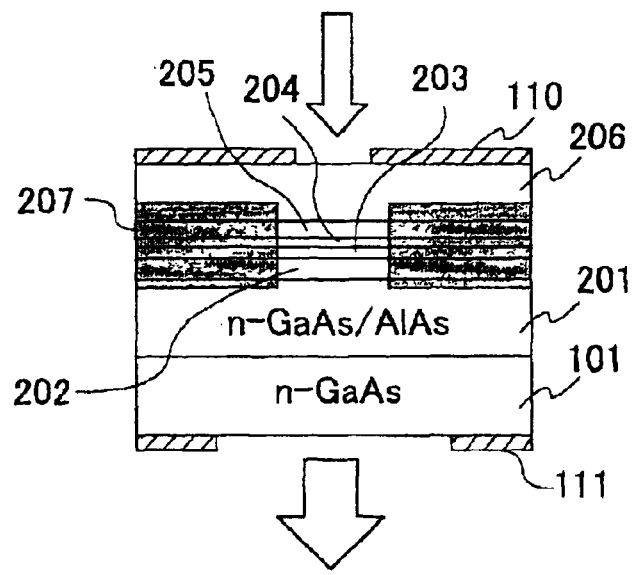
FIG. 9 is a diagram showing the construction of an optical modulator according to another embodiment of the present invention.

FIG. 9 shows another example of the semiconductor optical amplifier constructed in the form of a surface-emission type device.

Referring to FIG. 9, the semiconductor optical amplifier is constructed on the n-type GaAs substrate 101 and includes the n-type distributed. Bragg reflector 201 of the GaAs/$Al_{0.8}Ga_{0.2}As$ structure formed on the substrate 101, the lower spacer layer 202 is formed on the distributed Bragg reflector 201 and the multiple quantum well active layer 203 having the GaInNAs/GaAs structure is formed on the lower spacer layer 202. On the multiple quantum well layer 203, the carrier blocking layer 204 of p-type AlGaAs is formed with the composition of $Al_{0.2}Ga_{0.8}As$, and the p-type GaAs upper spacer layer 205 is grown on the carrier blocking layer 204. Further, the p-type distributed Bragg reflector 206 of the GaAs/$Al_{0.8}Ga_{0.2}As$ structure is formed on the upper spacer layer 205.

Here it should be noted that the n-type distributed Bragg reflector 201R and the p-type distributed Bragg reflector are formed by the alternate stacking of a high refractive index layer of GaAs and a low refractive index layer of $Al_{0.8}Ga_{0.2}As$ with the optical thickness of one-quarter of the operational wavelength.

Further, it should be noted that the total optical thickness of the n-type GaAs lower spacer layer 202, the GaInNAs/GaAs multiple quantum well active layer 203, the p-type $Al_{0.4}Ga_{0.6}As$ carrier blocking layer 204 and the p-type GaAs upper spacer layer 205 is set so as to become an integer multiple of one-half of the operational wavelength.

In the semiconductor optical modulator of FIG. 9, there is formed a high-resistance region 207 excluding a circular current injection region, by conducting an ion implantation process of protons as a current confinement region.

Further, the p-side electrode 110 is formed on the p-type distributed Bragg reflector 206, and the n-side electrode 111 is formed on the bottom surface of the n-type GaAs substrate 101. In any of the electrodes 110 and 111, the electrode is removed at the part corresponding to the optical window so as to allow incidence and exit of the laser beam.

Thus, the semiconductor optical amplifier of FIG. 9 has a surface-emission type structure; and thus, the laser beam incident through the p-side electrode 110 is amplified as it is reflected back and forth between the p-type distributed Bragg reflector 206 and the n-type distributed Bragg reflector 201 by the GaInNAs/GaAs multiple quantum well active layer 230 that has a gain with regard to the wavelength of the incident optical beam. The optical beam thus amplified is then emitted from the bottom surface of the n-type GaAs substrate 101 through the optical window formed in the n-side electrode 111.

Thus, the semiconductor optical modulator of the present mode of invention is a resonant-type optical amplifier having a high gain for the optical wavelength that causes resonance with the distributed Bragg reflectors 206 and 201. Thereby, the reflectance of the distributed Bragg reflector 201 is reduced to 70-90% so as to avoid laser oscillation caused in the optical amplifier.

It should be noted that the surface emission type optical amplifier of FIG. 9 includes the GaInNAs gain region on the GaAs substrate similarly to the semiconductor optical modulator of FIG. 8. Thus, the optical amplifier of FIG. 9 is also suitable for the optical amplification of the long-wavelength optical beam of 1.3 µm or 1.55 µm used for optical fiber telecommunication. Thus, it is possible to secure a large conduction band discontinuity of 200 meV or more between the GaInNAs quantum well layer and the p-type $Al_{0.4}Ga_{0.6}As$ carrier blocking layer 204.

Thus, there occurs no sudden overflowing of electrons from the GaInNAs quantum well layer even when the environmental temperature has increased, and the decrease of gain with increasing temperature is effectively suppressed. Thereby, the change of optical amplification factor with the change of environmental temperature is also suppressed.

In view of the fact that the semiconductor optical modulator has a surface-emission type construction, it is not necessary to form the optical input/output surfaces by a cleaving process. Thus, it is possible to construct a two-dimensional array of semiconductor optical amplifiers by using the optical semiconductor amplifier of the present mode of the invention. Thus, the present invention is advantageous for realizing parallel integration of the optical telecommunication lines.

In the device of FIG. 9, it is also possible to use construct the semiconductor optical amplifier in the form of a reflection type device by providing a high reflectance of 99% or more for the n-type distributed Bragg reflector 201. In this case, the optical beam incident to the optical window formed in the electrode 110 is emitted also from the same optical window in the reversed direction.

It should be noted that the semiconductor optical amplifier noted above can be used for the ASE (amplitude spontaneous emission) optical source. Thus, in the semiconductor optical amplifier, there is formed a population inversion by injecting electric current into the gain region while avoiding laser oscillation by reducing the reflectance of the edge surface, to which the incoming optical beam is injected, to the level of 1% or less.

Thus, the spontaneous optical emission caused in the gain region is amplified by the stimulated emission and a high power ASW is obtained. In other words, the semiconductor optical amplifier of the present invention can be used as the optical source emitting ASE, by driving the semiconductor optical amplifier device in a highly injected state while interrupting incidence of optical beam and simultaneously suppressing the occurrence of laser oscillation.

Because the foregoing semiconductor optical amplifier has the gain region formed of any of the materials of GaNAs, GaInNAs, GaNAsSb and GaInNAsSb, it is possible to secure a conduction band discontinuity of 200 meV or more between the gain region and the cladding layer. Thereby, there occurs no overflowing of electrons from the gain region into the cladding layer even in the case the environmental, temperature is increased. Thus, the device can maintain high optical output even in the case the device is driven at elevated temperatures.

It should be noted that the tunable laser apparatus according to the present mode of invention can be constructed on a GaAs substrate (GaAs single crystal substrate) in the form of array.

Thus, in the case no bias current is injected in the semiconductor optical amplifier, the gain region absorbs the incident optical beam. In the case a bias current is injected and an optical beam is supplied to the semiconductor optical amplifier, there occurs an optical amplification with a gain of 10-20 dB. Thereby, the semiconductor optical amplifier functions as an optical gate that controls transmission/interruption of the incident optical beam in response to the bias current. By arraying a number of such semiconductor optical modulators on a substrate, it becomes possible to construct an optical gate array for selecting a transmission channel of parallel optical signals.

The gain region of the semiconductor optical amplifier constituting the optical gate array is constituted by any of the materials of GaNAs, GaInNAs, GaNAsSb and GaInNAsSb in the case the optical semiconductor amplifier described before is used. Thus, it becomes possible to increase the conduction band discontinuity between the gain region and the cladding layer to 200 mV or more. Thereby, overflowing of electrons from the gain region to the cladding layer is effectively suppressed even in the case the environmental temperature is increased and a high optical amplification factor is maintained even in the elevated temperature environment. Thus, it becomes possible to construct an optical gate array capable of operating without causing degradation of the S/N ratio of the optical signals passed therethrough and capable of operating stably with respect to the environmental temperature.

In the tunable laser diode apparatus of such a construction, the optical beam produced by the ASE optical source is an ASE beam characterized by a broad spectrum. Thus, the optical beam thus produced by the ASE optical source is divided spatially into respective optical beam components having different wavelengths as it is guided through a wavelength divide filter. For such a wavelength divide filter, an arrayed waveguide device may be used.

The optical beam components thus passed through the wavelength divide filter is then directed to the optical gate array, wherein it should be noted that each optical beam component incident to the semiconductor optical amplifier has a wavelength different from the wavelength of other optical beam components and characterized by a narrow spectrum as a result of the wavelength selection in the wavelength divide filter. Thus, by selectively applying a bias current to a selected semiconductor optical amplifier tuned to a desired wavelength, the optical signal component of desired wavelength is selectively amplified. The optical beams other than this selected wavelength are absorbed as they are guided through the unbiased optical amplifier.

The optical beam component thus selected by the optical gate array then causes a resonance in the optical cavity constructed by the reflectors disposed at the rear edge surface and the front edge surface of the optical gate array, and thus, there occurs a laser oscillation. Thus, the original optical beam is divided into discrete optical beam components in correspondence to the number of the semiconductor optical amplifiers constituting the optical gate array.

The ASE optical that uses the semiconductor optical amplifiers noted above is operable with high output power at high temperatures, and thus, the optical gate array described above operates stably with regard to the environmental temperature. Thus, by constructing the tunable laser apparatus by using the ASE optical source and the optical gate array, in which the semiconductor optical amplifiers are used, it becomes possible to provide an optical source stable with regard to the change of the environmental temperature. As such an optical source does not require exact temperature regulation such as the one achieved by an electronic cooling system, it is possible to construct the optical source with low cost.

<Embodiment 9>

Figure 10:
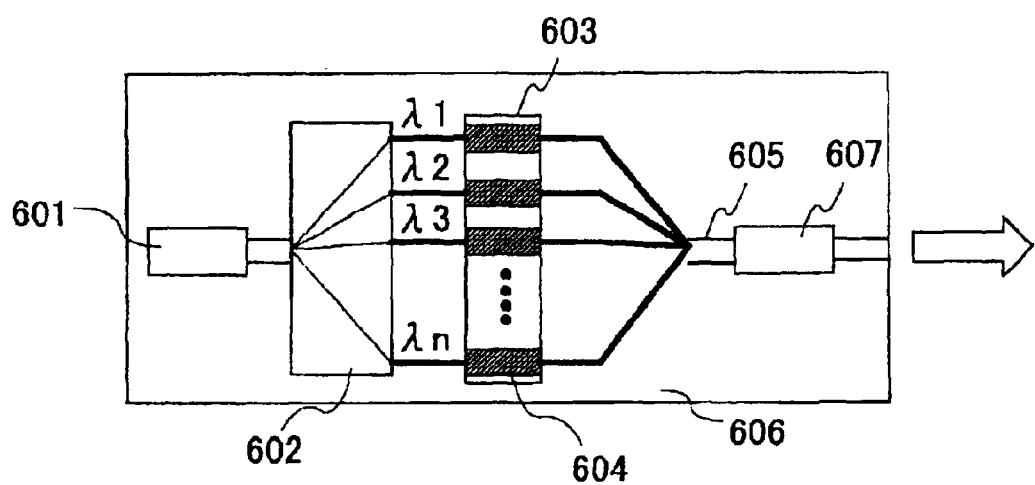
FIG. 10 is a diagram showing the construction of a tunable laser apparatus according to another embodiment of the present invention.

FIG. 10 is a diagram showing an embodiment of the tunable laser diode apparatus.

Referring to FIG. 10, the tunable laser apparatus is constructed on a Si Substrate 606 and includes an ASE radiation source 601 provided on the Si substrate 606 for producing an optical beam, wherein there is provided a wavelength divide filter 602 also on the Si substrate 602 for dividing the optical beam produced by the ASE radiation source 601 into respective optical beam components. Further, there is provided an optical gate array 603 in the form of a monolithic array of semiconductor optical amplifiers 604 and an optical combiner 605 for combining the optical beams passed through the optical gate array 603 into a single optical waveguide. The optical beam emitted from the optical combiner 605 is then modulated by the semiconductor optical modulator 607.

The tunable laser diode device thus constructed operates as follows.

As noted previously, the optical radiation is produced by the ASE radiation source 601 in the form of an ASE characterized by a broad optical emission spectrum. During the process of guiding through the wavelength divide filter 601, the optical beam components of respective wavelengths are spatially separated. For the wavelength divide filter 602, it is possible to use an arrayed waveguide device. The optical beams thus passed through the wavelength divide filter 602 is then guided to the optical gate array 603 in which n-channel traveling-wave type semiconductor optical amplifiers 604 are in the form of an monolithic array.

The optical beam injected into each of the semiconductor optical amplifier 604 has a wavelength selected by the wavelength divide filter 602, and there are optical beam having wavelengths of λ1-λn. Thus, by injecting a bias-current selectively in the optical gate array 603 in correspondence to one of the wavelengths λ1-λn, the optical beam component of the selected wavelength is amplified selectively. The optical beam components of other wavelengths are absorbed.

The optical beam component thus selected by the optical gate array 603 then causes resonance in the optical cavity formed by the rear edge surface of the ASE radiation source 601 and the front edge surface of the semiconductor optical amplifier 604 and there is caused a laser oscillation. Thereby; the optical beam component of the selected wavelength is divided as a discrete optical beam in correspondence to the number of the semiconductor optical modulators 604 constituting the optical gate array 603. The optical beams emitted from the optical gate array are combined into a common optical waveguide by the optical combiner 605 and is subjected to an optical modulation by the semiconductor optical modulator 607.

Figure 11A:
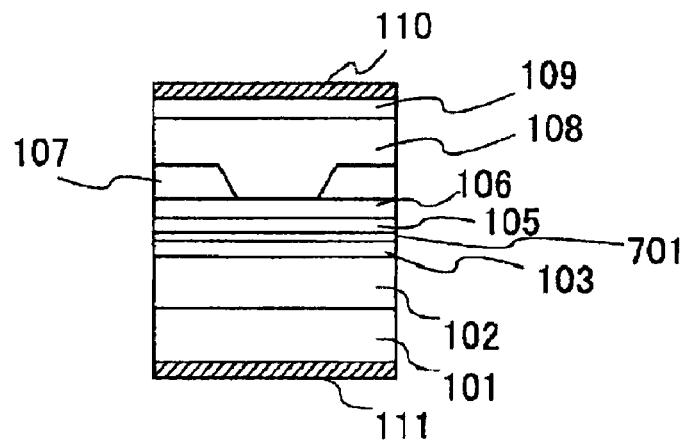
FIG. 11 is a diagram showing the construction of an ASE optical radiation source used in the tunable laser apparatus of FIG. 10.
Figure 11B:
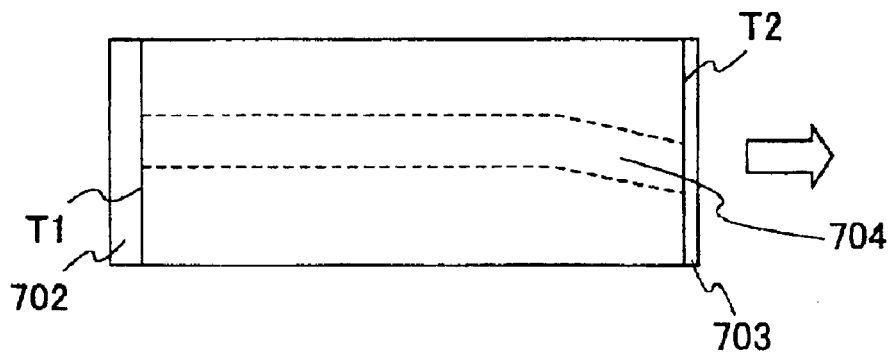

FIGS. 11A and 11B show an embodiment of the ASE radiation source 601 used in the tunable laser apparatus of FIG. 10, wherein FIG. 11A shows the ASE radiation source 601 in a front view while FIG. 11B shows the ASE radiation source in a longitudinal cross sectional view.

Referring to FIG. 11A, it can be seen that the ASE radiation source 601 has a layered structure similar to the one shown in FIG. 8A with regard to the semiconductor optical amplifier.

At the front end surface T1 formed by a cleaving process, there is provided an anti-reflection coating 703 having a reflectance of 0.2% or less, and a high reflection film 702 having a reflectance of 99% is provided on the rear end surface T1.

Further, there is formed a stripe region 702, in which the current injection is made, such that the stripe region 704 has a front end part bent by an angle of about 10° with respect to the device end surface in the vicinity of the front end surface T2.

Figure 11C:
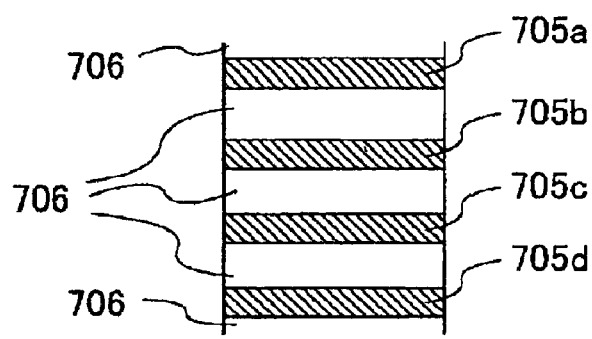

FIG. 11C shows the construction of the GaInNAs/GaAs multiple quantum well structure 701 used for the active layer in the construction of FIG. 11A.

Referring to FIG. 11C, the GaInNAs/GaAs multiple quantum well structure 701 includes four GaInNAs quantum well layers 705a, 705b, 705c and 705d stacked with intervening GaAs barrier layers 706 such that each quantum well layer is vertically sandwiched by a pair of GaAs barrier layers 706.

It should be noted that each of the GaInNAs quantum well layers 705a-705d has a bandgap wavelength different from that of other GaInNAs quantum well layers. For example, the quantum well layer 705a may have a bandgap wavelength of 1.20 μm, the quantum well layer 705b may have a bandgap wavelength of 1.24 μm, the quantum well layer 705c may have a bandgap wavelength of 1.28 μm, and the quantum well layer 705d may have a bandgap wavelength of 1.32 μm.

The ASE radiation source of FIG. 11 uses the semiconductor optical amplifier explained with reference to FIGS. 8A and 8B.

Thus, in FIG. 11, there is caused spontaneous emission and also stimulated emission as a result of recombination of holes and electrons in the multiple quantum well active layer 701 in response to injection of forward bias current from the p-side electrode 110 and the n-side electrode 111.

Because the anti-reflection coating 703 is formed on the front end surface T1, the resonance of the optical radiation produced in the multiple quantum well active layer 70 as a result of multiple reflection is suppressed, and the optical beams is obtained from the front end surface T1 without causing laser oscillation. Thereby, the spontaneous optical radiation is amplified by the population inversion in the gain region and is emitted as ASE.

In the case of using a semiconductor optical amplifier as an ASE radiation source, it is not necessary to inject a signal optical beam from the rear end surface T1. Thus, the construction of FIG. 11 uses the high-reflectance film 702 of 99% reflectance at the rear edge surface T1 such that the ASE is obtained efficiently at the front end surface T2.

As indicated in FIG. 11B, the stripe region 704 for current injection is formed such that the front end part thereof is tilted by 10° from the normal direction of the end surface T2 in the vicinity of the end surface T2 used for the optical emission surface. Thereby, the optical feedback of the optical beam to the gain region after reflection at the end surface T2 is successfully minimized and the occurrence of laser oscillation in the optical cavity between the end surfaces T1 and T2 is suppressed.

In the ASE optical radiation source of FIG. 11, it should be noted that the gain region is formed of a GaInNAs quantum well layer. Thus, a large conduction band discontinuity of 200 meV or more is secured between the gain region and the $Al_{0.4}Ga_{0.6}As$ cladding layer. Thus, the problem of overflowing of electrons from the gain region to the cladding layer is suppressed even when the environmental temperature has increased, and the population inversion is maintained also in the case the device is operated in an elevated temperature environment and a high power ASE is obtained.

In the ASE optical radiation source of FIG. 11, the four GaInNAs quantum well layers 705a-705d constituting the multiple quantum well active layer 701 are formed to have respective, mutually different bandgap energies. Thus, each of the quantum well layers 705a-705d has a gain for respective, mutually different wavelengths.

By combining GaInNAs quantum well layers of different energy bandgaps, the multiple quantum well active layer 701 provides a broad gain band at the wavelength of 1.20-1.32 μm. As the ASE optical radiation source of FIG. 11 can thus produce the ASE over the broad wavelength band, the magnitude of wavelength change attainable in the tunable laser apparatus of FIG. 10 is increased.

In the tunable laser apparatus of FIG. 10, it should be noted that the optical gate array 603 is constructed by integrating the traveling-wave type semiconductor optical amplifiers 604 shown in FIGS. 8A and 8B on a GaAs substrate in the form of array. The number n of the array may be set to 8, for Embodiment.

In this case, it is possible to select eight wavelengths from the range of 1.20-1.32 μm. As the optical cavity is formed by the rear end surface of the ASE radiation source 601 and the front end surface of the semiconductor optical amplifier 604, there is provided a low reflection film having a reflectance of about 10% on the front end surface of the semiconductor optical amplifier 604.

In the optical gate array 603, the gain region of the semiconductor optical amplifier 604 is formed of GaInNAs, and thus, there is secured a large conduction band discontinuity of 200 meV or more at the interface between the gain region and the $Al_{0.4}Ga_{0.6}As$ cladding layer, and the problem of overflowing of the electrons from the gain region to the cladding layer is suppressed even in the case the environmental temperature is increased. Thereby, a high optical amplification factor is maintained and the degradation of S/N ratio of the optical signals passing through the optical gate array is prevented even in high environmental temperatures.

Thus, as noted previously, the tunable laser apparatus of FIG. 10, using the ASE radiation optical source 601 operable with high output power in high temperature environments and the optical gate array 603 operable stably with regard to environmental temperature change, for the active device can form an optical source stable with regard to environmental temperature change. As there is no need of providing exact temperature control by way of an electronic cooling system and the like, the optical source of the present embodiment can be produced with low cost.

In the tunable laser apparatus of the present invention, it should further be noted that the optical beam thus separated by the wavelength divide filter is modulated by using the EA-type semiconductor optical modulator. As the optical modulation is thus achieved by application of electric field rather than injection of electric current, it is possible to increase the modulation frequency and the laser apparatus can be operated with very high modulation frequency.

By using the EA-type-semiconductor optical modulator of the first mode or second mode of the invention in the tunable-laser apparatus, the degradation of the S/N ratio is suppressed even in high temperature environment and a high-speed modulation exceeding 10 GHz becomes possible.

[Sixteenth Mode of Invention]

According to a sixteenth mode, the present invention provides a multi-wavelength laser apparatus, comprising: an optical cavity defined by a pair of reflectors; a wavelength divide filter provided in said optical cavity; a semiconductor optical amplifier provided in said optical cavity, said semiconductor optical amplifier selectively amplifying respective optical beam components of respective wavelengths divided out by said wavelength divide filter; and a semiconductor optical modulator modulating an intensity of said optical beam components amplified by said semiconductor optical amplifier, wherein a semiconductor optical modulator of any of first and second modes of the present invention is used for said semiconductor optical modulator.

Here, the semiconductor optical amplifier of FIGS. 8A and 8B or FIG. 9 can be used for the foregoing optical amplifier.

The optical beam produced by the semiconductor optical amplifier provided in an optical cavity defined by a pair of reflectors takes the form of ASE characterized by a broad spectrum width. The optical beam thus produced is supplied to the wavelength divide filter and is fed back to the semiconductor optical amplifier after being guided through the wavelength divide filter. Here, the optical beam fed back to the semiconductor optical amplifier is divided spatially into the optical beam components each having a narrow spectrum. Thus, the optical beam component of a specific wavelength is amplified selectively.

By repeating the foregoing, the selected optical beam component selected by the wavelength divide filter causes a laser oscillation in the optical cavity. Thus, by providing the optical semiconductor amplifiers in plural number at the locations where optical beam components of various wavelengths are obtained, it becomes possible to construct a multi-wavelength laser apparatus that oscillates at different wavelengths.

It is possible to minimize the change of optical amplification factor with regard to environmental temperature by using the semiconductor optical amplifier and the semiconductor optical amplifier maintains a large optical amplification factor at high temperatures. Thus, it becomes possible to construct a multi-wavelength laser apparatus stable with regard to the change of environmental temperature by using the semiconductor laser amplifier noted before. Such a multi-wavelength laser apparatus can be constructed with low cost as it can omit the exact temperature control achievable by way of an expensive electronic cooling system.

In the multi-wavelength laser apparatus of the present invention, it should further be noted that the optical beam thus separated by the wavelength divide filter is modulated by using the EA-type semiconductor optical modulator. As the optical modulation is thus achieved by application of electric field rather than injection of electric current, it is possible to increase the modulation frequency and the laser apparatus can be operated with very high modulation frequency.

By using the EA-type semiconductor optical modulator of the first mode or second mode of the invention in the multi-wavelength laser apparatus, the degradation of the S/N ratio is suppressed even in high temperature environment and a high-speed modulation exceeding 10 GHz becomes possible.

[Seventeenth Mode of Invention]

In a seventeenth mode, the present invention provides a wavelength-division multiplex optical transmission system comprising: an optical transmission module transmitting optical signals of plural wavelengths; an optical fiber transmitting said optical signals; and an optical receiver module detecting said optical signals, wherein the multi-wavelength laser apparatus described before is used for said Optical transmission module.

The art of wavelength-division multiplexing is the technology of increasing the transmission capacity of an optical transmission line by transmitting optical signals of different wavelengths through a single optical fiber. In order to implement the wavelength-division multiplexing, it is necessary to provide a multi-wavelength optical source and that it is necessary to provide such a multi-wavelength optical source with low cost. Thus, the multi-wavelength laser apparatus explained before is most suitable for such a multi-wavelength optical source.

As noted already, the multi-wavelength laser apparatus of the present invention operates stably in terms of optical output and modulation characteristics with the change of environmental temperature. Thus, it does not require exact temperature control achievable by an expensive electronic cooling system. Thereby, the multi-wavelength laser apparatus of the present invention can be produced with low cost. Associated therewith, the optical transmission system using such a low-cost multi-wavelength laser apparatus can be constructed with low cost.

<Embodiment 10>

Figure 12:
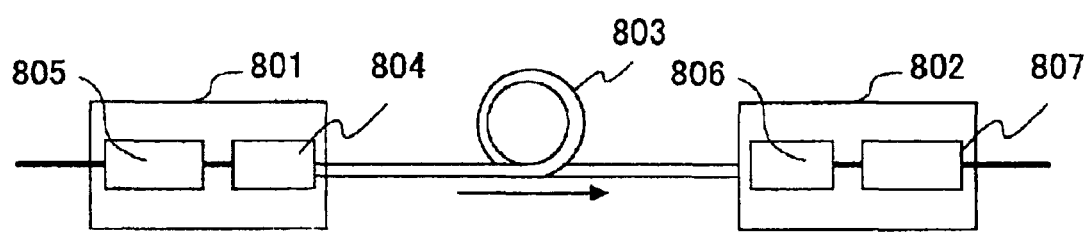
FIG. 12 is a diagram showing the construction of an optical transmission system according to an embodiment of the present invention.

FIG. 12 shows the construction of an optical transmission system of the present invention.

Referring to FIG. 12, the optical transmission system is formed of an optical transmission module 801, an optical receiver module 802 and an optical fiber cable 803 connecting the optical transmission module 801 and the optical receiver module 802.

Here, the optical fiber cable 803 may be formed of a single-mode optical fiber having a quartz core and a quartz cladding, while the optical transmission module 801 may include a drive control circuit 805 and a multi-wavelength laser apparatus 804. In such a system, optical signals of different wavelengths are transmitted through the single optical fiber in the form of wavelength-multiplexed signal. Further, the optical receiver module 802 includes a receiver unit 806 and a receiver circuit 807.

In the optical transmission system of such a construction, the electric signal incident to the optical transmission module 801 is supplied first to the drive control circuit 805, and the drive control circuit 805 causes the multi-wavelength laser apparatus 804 to oscillate at the respective wavelengths by injecting a drive current to respective laser diodes. Further, the laser beam intensity is modulated in response to the electrical signal. The multi-wavelength laser apparatus thus modulates the laser beams of different optical wavelengths independently and the optical signals thus modulated are injected into the single optical fiber cable 803.

The wavelength-division multiplexed optical signal thus injected into the optical fiber cable 803 is then guided to the optical receiver 806, wherein the optical signal is divided into respective optical signal components of respective wavelengths by a wavelength divide filter provided therein, and the optical signal components thus obtained are converted into electrical signals by a photodiode or an avalanche photodiode. Thereafter, the optical signals thus obtained are amplified and shaped in the receiver circuit 807.

Figure 13:
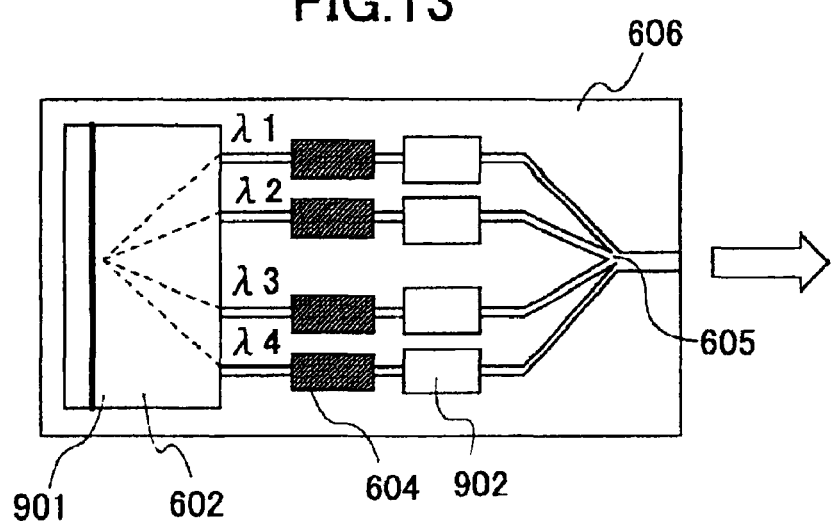
FIG. 13 is a diagram showing the construction of a multi-wavelength laser apparatus used in the optical transmission system of FIG. 12.

FIG. 13 shows the construction of a multi-wavelength laser apparatus 804 used in the optical transmission system of FIG. 12.

Referring to FIG. 13, there is provided a semiconductor optical amplifier 604 that produces and amplifies ASE. As can be seen, a number of semiconductor optical amplifiers are integrated on a common substrate monolithically.

Further, the multi-wavelength laser apparatus 804 includes a wavelength divide filter 602 for dividing the optical beam produced by the semiconductor optical amplifier 604, wherein it can be seen that there is provided a high reflectance film 901 on the wavelength divide filter 602 at the side far from the semiconductor optical amplifier 604. Further, there are provided EA-type semiconductor optical modulators 902 in correspondence to each of the semiconductor optical amplifiers 604 for modulating the optical signal amplified by the semiconductor optical amplifier 604. The optical signals thus modulated by the optical modulators 902 are merged at an optical combiner 605 in which the optical signals of the respective channels are combined into a single optical waveguide.

In operation, the ASE produced by the semiconductor amplifier 604 and having a broad optical spectrum is supplied to the wavelength divide filter 602 and is reflected back by the high reflectance film 901 at the other side of the waveguide divider 602. The optical signals are then fed back to the semiconductor optical amplifier 604 after being guided through the wavelength divide filter 602.

Thereby, it should be noted that the optical signals fed back to the semiconductor optical amplifier 604 are already divided spatially by the wavelength divide filter 602 and has a narrow spectrum. Thus, an optical signal of specific wavelength is amplified selectively in the optical amplifier 604. Because the front end surface of the semiconductor optical amplifier 604 is covered with a low reflection film having a reflectance of 10%, the high reflectance film 901 and the front end surface of the semiconductor optical amplifier 604 constitutes the optical cavity in which the laser oscillation takes place.

The semiconductor optical amplifiers 604 are provided at locations of the wavelength divide filter 602 wherein the optical signals of respective wavelengths are obtained. Thus, by causing a laser oscillation of the optical signals of different wavelengths by way of optical amplification, the desired multi-wavelength laser apparatus is obtained. In the Embodiment of FIG. 13, four such semiconductor optical amplifiers are used and there occurs a laser oscillation at the wavelengths of 1.20 µm, 1.24 µm, 1.28 µm and 1.32 µm.

In the multi-wavelength laser apparatus of FIG. 13, the semiconductor optical amplifier shown in FIGS. 8A and 8B is used for the optical semiconductor amplifier 604. Thereby, the gain region is formed of the GaInNAs quantum well layer and a large conduction band discontinuity of 200 meV or more is achieved between the gain region and the $Al_{0.4}Ga_{0.6}As$ cladding layer. Thus, there occurs no substantial overflow of electrons from the gain region to the cladding layer even when the environmental temperature is increased. Thus, a high optical amplification factor is maintained also in the case of operating in high temperature environment, and the laser apparatus operates stably even when there is caused a change of environmental temperature.

In the multi-wavelength laser apparatus of FIG. 13, it should further be noted that the optical beam is modulated by using the EA-type semiconductor optical modulator 902. As the optical modulation is thus achieved by application of electric field rather than injection of electric current, it is possible to increase the modulation frequency and the laser apparatus can be operated with very high modulation frequency.

By using the EA-type semiconductor optical modulator of FIG. 1 operable with the speed of 10-50 GHz in the multi-wavelength laser apparatus, a very large capacity transmission up to the rate of 100 Gbit/s is achieved in the optical telecommunication system of FIG. 12 by modulating the four laser beams of the respective wavelengths with the speed of 25 GHz.

The optical telecommunication system of FIG. 12 thus formed is stable with regard to the change of environmental temperature. Further, it uses a low-cost construction. Thereby, it is possible to construct a very large capacity optical transmission-system capable of achieving the bit rate of 100 Gbit/s with a low cost and high reliability.

[Eighteenth Mode of Invention]

Next, the fabrication process of the integrated semiconductor light-emitting device of the present invention will be explained.

Before starting detailed description, a brief review will be made on the discovery made by the inventor of the present invention in the investigation that constitutes the foundation of the present mode of the invention.

Figure 18:
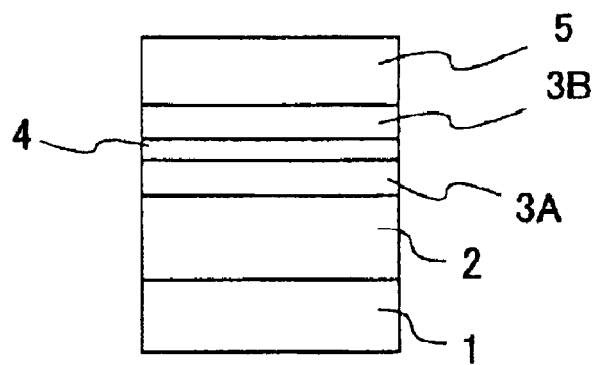
FIG. 18 is a diagram showing the construction of a test specimen used in the present invention.

FIG. 18 shows the structure of the sample used by the inventor in the foregoing investigation.

Referring to FIG. 18, a first semiconductor layer 2 containing Al such as AlAs, AlP, AlGaAs, AlInP, AlGaInP, AlInAs, AlInAsP, AlGaInAsP, and the like, is formed on a compound semiconductor substrate 1 of GaAs, InP, or GaP, and a first intermediate layer 3A free from Al and N is formed on the first semiconductor layer 2. Further, an active layer 4 containing N such as GaNAs, GaPN, GaInNAs, GaInNAs is formed on the first intermediate layer 3A, and a second intermediate layer 3B identical in composition with the intermediate layer 3A is formed on the active layer 4. Further, a second semiconductor layer 5 containing Al similar to the first semiconductor layer 2 is formed on the intermediate layer 3B. The intermediate layers 3A and 3B may be formed of GaAs, GaP, InP, GaInP, GaInAs, GaInAsP, and the like. The active layer 4 includes a multiple quantum well structure formed of quantum well layers containing N.

The sample of FIG. 18 was formed by an MOCVD process in an epitaxial growth apparatus that uses a metal organic Al source such as TMA (trimethyl aluminum) or TEA (trimethyl aluminum) and a nitrogen compound source such as DMHy (dimethyl hydrazine) or MMHy (monomethyl hydrazine)or NH$_3$.

Figure 19:
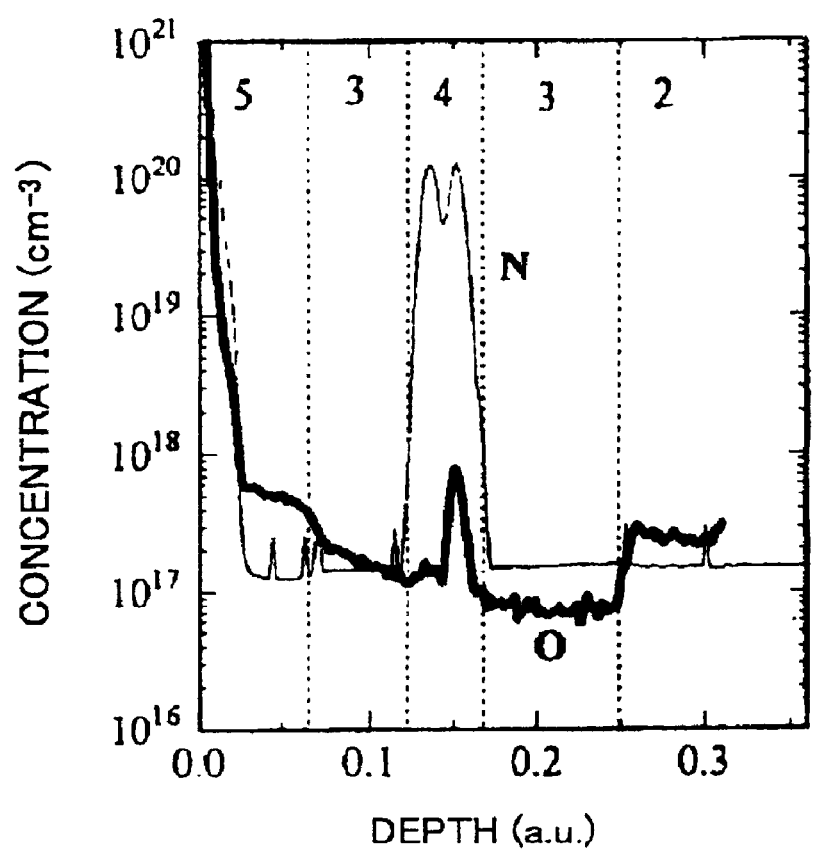
FIG. 19 is a diagram showing the depth profile of nitrogen and oxygen in the specimen of FIG. 18.

FIG. 19 shows the depth profile of nitrogen and oxygen in the device for the case the cladding layers 2 and 5 are formed by an AlGaAs layer, the intermediate layers 3A and 3B are formed of GaAs, and the active layer 4 is formed of the GaInNAs/GaAs double quantum well structure and that the structure is farmed by using a single MOCVD apparatus. It should be noted that the measurement of FIG. 19 was conducted under the measurement condition summarized in Table 1 below by secondary ion mass spectrometry.

TABLE 1

| first ion specie | Cs+ |
| first acceleration voltage | 3.0 kV |
| sputter rate | 0.5 nm/s |
| measurement area | 160 × 256 μm$^2$ |
| degree of vacuum | <3E−7 Pa |
| polarity of measured ion | − |

FIG. 19 is referred to.

It can be seen that there appear two nitrogen peaks in the active layer 4 in correspondence to the GaInNAs/GaAs double quantum well structure. Further, it is also noted that an oxygen peak is detected in the active layer 4. On the other hand, the oxygen concentration in the intermediate layers 3A and 3B, which are free from N and Al, is lower in terms of one order as compared with the oxygen concentration in the active layer 4.

Further, the depth profile of oxygen measured about the sample having the construction in which the active layer 4 including therein the GaInNAs/GaAs double quantum well structure is formed on the cladding layer of GaInP together with the GaAs intermediate layers 3A and 3B, has revealed that the oxygen concentration in the active layer 4 is in the background level.

Figure 20:
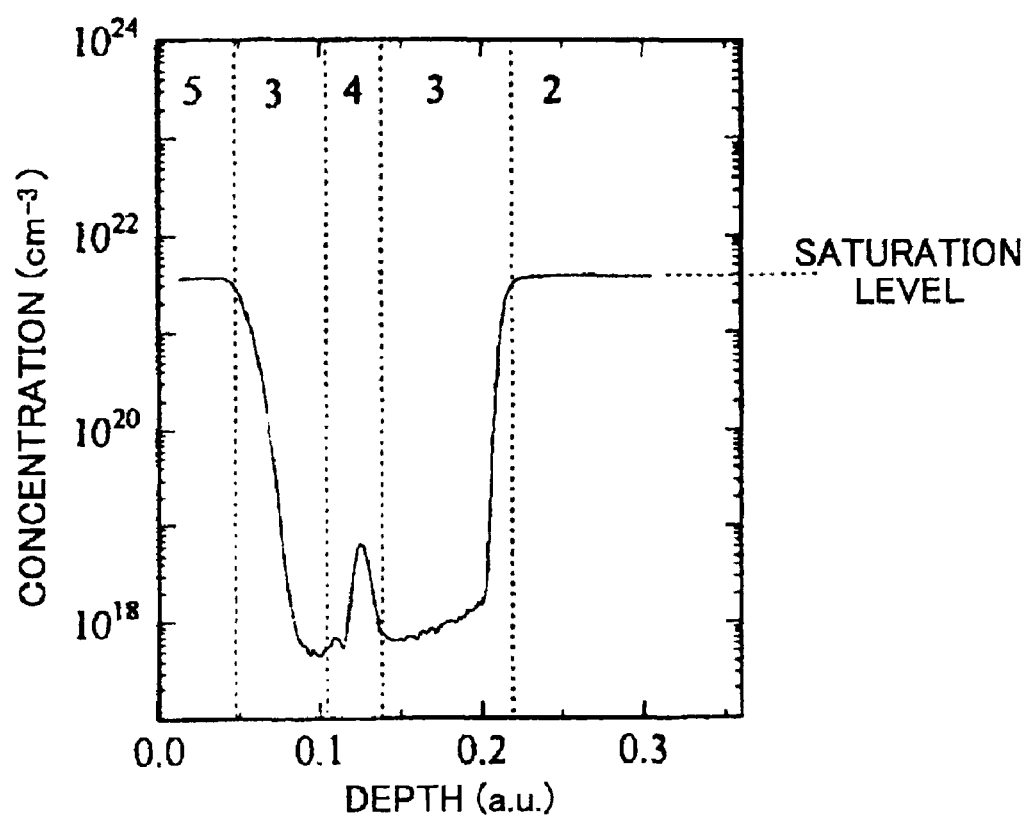
FIG. 20 is a diagram showing the depth profile of Al in the specimen of FIG. 18.

FIG. 20 shows the depth profile of Al obtained for the same sample of FIG. 19. The measurement was conducted by the secondary ion mass spectroscopy similarly to the case of FIG. 19 under the measurement condition shown in Table 2.

TABLE 2

| first ion specie | O2+ |
| first acceleration voltage | 5.5 kV |
| sputter rate | 0.3 nm/s |
| measurement area | 60 μmφ |
| degree of vacuum | <3E−7 Pa |
| polarity of measured ion | + |

FIG. 20 is referred to.

It can be seen that Al is detected in the active layer 4, which was formed without introducing an Al source material. Further, it is noted that the Al concentration in the GaAs intermediate layer 3A or 3B formed adjacent to the Al-containing cladding layer 2 or 5 is lower than the Al concentration in the active layer 4 by factor of ten. This indicates that Al in the active layer 4 has not caused diffusion from the Al-containing cladding layer 2 or 5 and has substituted Ga in the active layer 4.

On the other hand, Al was not detected in the active layer in the case that the N-containing active layer was grown on a semiconductor layer free from Al such as GaInP.

By comparing FIG. 20 with FIG. 19, it is noted further that the two oxygen peaks in FIG. 19 corresponding to the double quantum well do not coincide with the nitrogen peak but do coincide with the peak profile of Al shown in FIG. 20. This results indicates that oxygen in the GaInNAs quantum well layer has been incorporated into the active layer not with the nitrogen source but with Al in the form coupled with residual Al that has been incorporated into the quantum well layer.

More specifically, the residual Al source material or residual Al reactant, or residual Al compound or residual Al in the MOCVD chamber is thought to cause a coupling with an impurity such as water contained in the nitrogen source compound or oxygen-containing material remaining in the gas line or reaction chamber and has been incorporated into the active layer 4 in the form coupled with oxygen or water.

Thus, when a semiconductor structure having an Al-containing semiconductor layer, such as the semiconductor layer 2, is provided between a substrate and an N-containing active layer as in the case of FIG. 18 by a continuous MOCVD process using a single epitaxial apparatus, it is inevitable to avoid incorporation of Al into the N-containing active layer.

As Al is incorporated into the active layer 4 in the form coupled with water contained in the nitrogen compound source or in the form coupled with oxygen remaining in the gas line or reaction chamber, such incorporation of Al results simultaneously in incorporation of oxygen into the active layer 4. Thereby, oxygen thus incorporated form non-optical recombination levels in the active layer, and there is caused a decrease of efficiency of optical emission in the active layer 4.

<Embodiment 11>

Figure 21:
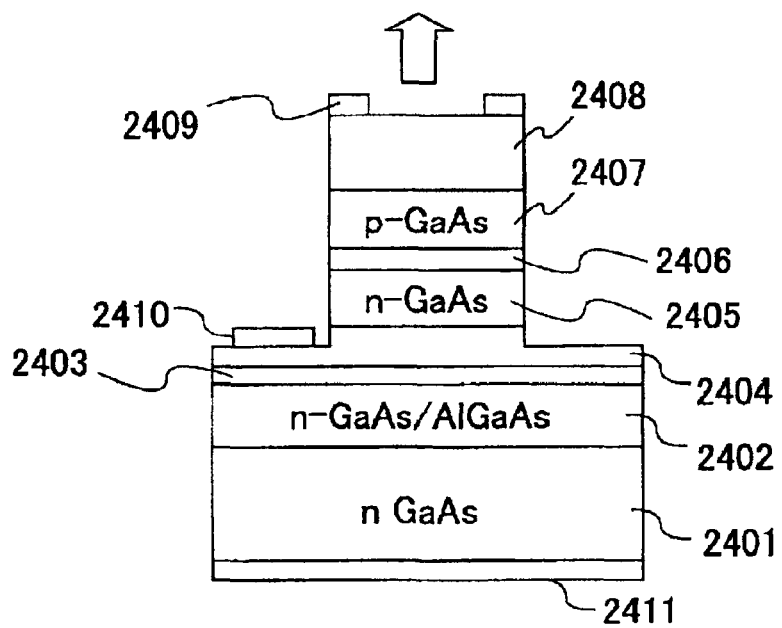
FIG. 21 is a diagram showing the construction of an integrated semiconductor light-emitting device according to another embodiment of the present invention.

FIG. 21 shows the construction of an integrated semiconductor light-emitting device of the present mode of the invention.

Referring to FIG. 21, the integrated semiconductor light-emitting device is constructed on an n-type GaAs substrate 2401 and includes a lower distributed Bragg reflector 2402 of the n-type GaAs/Al$_{0.1}$Ga$_{0.2}$As structure formed on the GaAs substrate 2401.

After the distributed Bragg reflector 2402 is thus formed, the growth of the semiconductor layer is interrupted and an Al-removal process is conducted by conducting a purging process of the growth chamber, for example such that residual Al source, residual Al reactance, residual Al compound or residual Al is removed from the growth chamber or any of the locations in which there is a chance that these residual materials may contact with the N compound source material or the impurity contained in the N compound source material.

Further, an optical absorption layer 2403 of GaInNAs is formed on the growth interruption surface of the distributed Bragg reflector 2402.

Further, a p-type distributed Bragg reflector 2404 is formed on the GaInNAs optical absorption layer 2403 and a p-type GaAs spacer layer 2405 is formed on the p-type distributed Bragg reflector 2404, and an active layer 2406 of GaInNAs/GaAs multiple quantum well structure is formed further on the GaAs spacer layer 2405. It should be noted that the multiple quantum well structure of the active layer 2406 does not contain Al in any of the quantum well layer or barrier layer.

On the active layer 2406, an upper spacer layer 2407 of p-type GaAs is formed, and an upper distributed Bragg reflector 2502 of p-type is formed on the GaAs spacer layer 2407. Further, an upper distributed Bragg reflector 2408 of n-type is formed on the spacer layer 2407.

The layered structure thus formed is subjected to a mesa etching process and there is formed a pillar shaped mesa structure such that the mesa structure includes the distributed Bragg reflector 2408, the active layer 2406 and a part of the distributed Bragg reflector 2404, and an n-side electrode 2409 having an optical window is provided on the upper distributed Bragg reflector 2408 forming the top surface of the mesa structure. Further, a p-side electrode 2410 is formed on the exposed surface of the distributed Bragg reflector 2502 formed as a result of the mesa etching process. Further, an n-side bottom electrode 2411 is provided on the bottom surface of the GaAs substrate 2401.

Thus, by applying a forward bias across the electrodes 2410 and 2409 in the state no reverse bias voltage is applied across the electrodes 2410 and 2411, the optical absorption layer 2403 is transparent and there occurs a laser oscillation at the wavelength band of 1.3 μm as a result of the optical feedback taking place between the distributed Bragg reflector 2402 and the distributed Bragg reflector 2404 as well as the distributed Bragg reflector 2408.

Thereby, it should be noted that, because of the Al-removal process conducted after the growth of the GaAs/AlGaAs distributed Bragg reflector 2402, there occurs no substantial incorporation of Al, and hence O, into the active layer 2406. Thereby, the laser diode oscillates efficiently with small threshold of laser oscillation.

When a reverse bias voltage is applied across the electrodes 2410 and 2411, on the other hand, the optical absorption caused in the optical absorption layer 2403 as a result of the quantum confinement Stark effect effectively reduces the reflectance of the upper distributed Bragg reflectors 2402, and because of the reduced optical feedback associated with such a reduction of the reflectance, there occurs an increase of threshold current, and the oscillation of the laser diode is stopped.

In the example of FIG. 21, it can be seen that the optical absorption-layer 403 is provided at the far side from the optical window in the electrode 2409 with regard to the active layer 2406. Thus, in the case of integrating the optical modulator with the surface-emission laser diode, it is not necessary to provide the optical modulator at the exit side of the optical beam, contrary to the conventional optical modulator that has to be provided on the exit path of the optical beam of the laser diode.

[Nineteenth Mode of Invention]

In a nineteenth mode, the present invention provides a surface-emission type integrated semiconductor light-emitting device, comprising:

a GaAs substrate; a surface-emission laser diode, having an optical cavity sandwiched by a lower distributed semiconductor optical reflector and an upper distributed semiconductor Bragg reflector in a direction perpendicular to said GaAs substrate, said optical cavity including an active layer formed of any of GaNAs, GaInNAs, GaNAsSb and GaInNAsSb, and an optical modulator comprising an optical absorption layer formed of any of GaNAs, GaInNAs, GaNAsSb and GaInNAsSb, said surface-emission laser diode and said optical modulator being integrated monolithically on said GaAs substrate in a direction perpendicular to said substrate, said optical Modulator being provided in said optical cavity at a location above said active layer or inside said upper optical reflector, wherein there is provided a non-optical recombination elimination layer of a GaInAsP system between said lower semiconductor distributed reflector and said optical cavity.

Here, the non-optical recombination layer is free from Al and is typically formed of a material such as GaInAsP, GaInP, GaAsP, and the like. The non-optical recombination layer may contain other III or V elements such as B, N, Sb, and the like, except for Al.

By providing such a non-optical recombination elimination layer in combination with the Al-removal process noted in the previous mode of the invention, the problem of non-optical recombination of carriers, which tends to occur at the surface formed as a result of the interruption of epitaxial growth associated with the Al-removal process, due to impurities such as O, Si, C; and the like segregated to such a growth interruption surface, is effectively suppressed by blocking the flow of carriers to such a growth interruption surface by the non-optical recombination elimination layer. It should be noted that the non-optical recombination elimination layer has an increased bandgap as compared with the semiconductor layer constituting the optical cavity such as the GaAs spacer layer, and the overflow of the carriers from the optical cavity is effectively blocked before they reach the growth interruption surface. Thereby, the present invention can suppress the leakage current and improve the efficiency of optical emission.

As such a non-optical recombination layer is free from Al, there occurs no increase of residual Al concentration even when the process of formation of the non-optical recombination layer is conducted after the Al-removal process.

<Embodiment 12>

Figure 22:
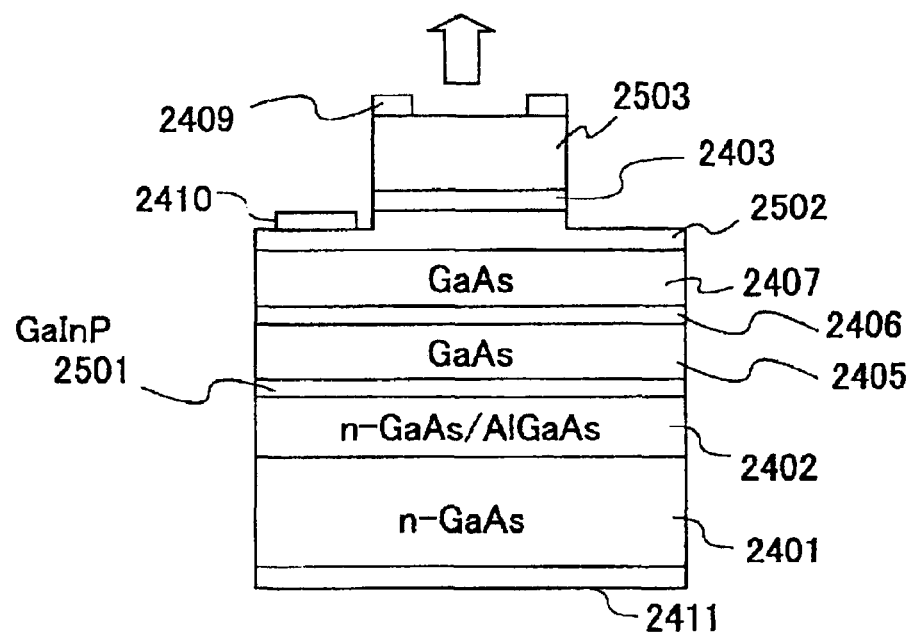
FIG. 22 is a diagram showing the construction of an integrated semiconductor light-emitting device according to another embodiment of the present invention.

FIG. 22 shows the construction of an integrated semiconductor light-emitting device according to an embodiment of the present invention, wherein those parts corresponding to the parts described previously are designated by the same reference numerals and the description thereof will be omitted.

Referring to FIG. 22, the integrated semiconductor light-emitting device is constructed on the n-type GaAs substrate 2401 and includes the lower distributed Bragg reflector 2402 of the GaAs/Al$_{0.8}$Ga$_{0.2}$As structure formed on the GaAs substrate 2401.

It should be noted that the process of removing the residual Al source or Al reactance or Al compound or Al remaining in the site of the growth chamber that may cause a contact with any of the nitrogen compound source or the impurity contained in the nitrogen compound source may be conducted in any of the timing between the step of forming the lower distributed Bragg reflector containing Al and the step of forming the optical absorption layer and the timing between the step of forming the lower distributed Bragg reflector containing Al and the step of forming the active layer. In the event an Al-free material such as GaAs is used for the spacer layer located adjacent to the active layer or the optical absorption layer, it is possible to provide the foregoing Al-removal process between the step of forming the lower semiconductor distributed Bragg reflector and the step of forming the GaAs spacer layer. Further, in the event an Al-containing material such as AlGaAs is used for the spacer layer adjacent to the active layer or the optical absorption layer, it is possible to provide the Al-removal process between the step of forming the AlGaAs spacer layer and the step of forming the active layer or the optical absorption layer.

As the Al-removal step that removes the residual Al source or Al reactance or Al compound or Al remaining in the site of the growth chamber that may cause a contact with any of the nitrogen compound source or the impurity contained in the nitrogen compound source, it is possible to conduct a carrier gas purging process purging the growth chamber by a carrier gas such as hydrogen or a vacuum evacuation process. Alternatively, it is possible to conduct the Al-removal process by a baking process for heating the susceptor. In this Al-removal process, it is possible to retain the substrate in the growth chamber, while such an Al-removal process may be conducted also in the state the substrate is removed from the growth chamber.

It should be noted that the foregoing Al-removal process may be conducted at plural timings during the growth process of the integrated semiconductor light-emitting device.

After the distributed Bragg reflector 2402 is thus formed, the growth of the semiconductor layer is interrupted and an Al-removal process is conducted by conducting a purging process of the growth chamber, for example such that residual Al source, residual Al reactance, residual Al compound or residual Al is removed from the growth chamber or any of the locations in which there is a chance that these residual materials may contact with the N compound source material or the impurity contained in the N compound source material.

After the residual Al concentration level is sufficiently lowered, an n-type GaInP layer 2501 is formed on the distributed Bragg reflector 2402, and the n-type GaAs spacer layer 2405 is grown on the growth interruption surface of the distributed Bragg reflector 2402. Further, the active layer 2406 of GaInNAs/GaAs multiple quantum well structure is formed on the GaAs spacer layer 2405. It should be noted that the multiple quantum well structure of the active layer 2406 does not contain Al in any of the quantum well layer or barrier layer.

On the active layer 2406, the upper spacer layer 2407 of p-type GaAs is formed, and an upper distributed Bragg reflector 2502 of p-type is formed on the GaAs spacer layer 2407. Further, the optical absorption layer 2403 of GaInNAs is formed on the upper reflector 2502 and a second upper distributed Bragg reflector 2503 of n-type is formed further on the optical absorption layer 2403.

The layered structure thus formed is subjected to a mesa etching process and there is formed a pillar shaped mesa structure such that the mesa structure includes the distributed Bragg reflector 2503, the optical absorption layer 2403 and a part of the distributed Bragg reflector 2502, and an n-side electrode 2409 having an optical window is provided on the distributed Bragg reflector 2503 forming the top surface of the mesa structure and a p-side electrode 2410 is formed on the exposed surface of the distributed Bragg reflector 2502 formed as a result of the mesa etching process. Further, an n-side bottom electrode 2411 is provided on the bottom surface of the GaAs substrate 2401.

Thus, by applying a forward bias across the electrodes 2410 and 2411 in the state no reverse bias voltage is applied across the electrodes 2409 and 2410, the optical absorption layer 2403 is transparent and there occurs a laser oscillation as a result of the optical feedback taking place between the distributed Bragg reflector 2402 and the distributed Bragg reflector 2502 as well as the distributed Bragg reflector 2503.

Thereby, it should be noted that, because of the Al-removal process conducted after the growth of the GaAs/AlGaAs distributed Bragg reflector 2402, there occurs no substantial incorporation of Al, and hence O, into the active layer 2406. Further, existence of the non-optical recombination elimination layer 2501 on such a growth interruption surface successfully blocks the carriers to overflow to the growth interruption surface, and the leakage current caused by the non-optical recombination of the carriers at such a growth interruption surface is effectively eliminated. Thereby, the laser diode oscillates efficiently with small threshold of laser oscillation.

When a reverse bias voltage is applied across the electrodes 2409 and 2410, on the other hand, the optical absorption caused in the optical absorption layer 2403 as a result of the quantum confinement Stark effect effectively reduces the reflectance of the upper distributed Bragg reflectors 2502 and 2503, and because of the reduced optical feedback associated with such a reduction of the reflectance, there occurs an increase of threshold current, and the oscillation of the laser diode is stopped.

[Twentieth Mode of Invention]

In a twentieth mode, the present invention provides a surface-emission type integrated semiconductor light-emitting device, comprising: a GaAs substrate; a surface-emission laser diode having an optical cavity sandwiched by a lower distributed semiconductor optical reflector and an upper distributed semiconductor Bragg reflector in a direction perpendicular to said GaAs substrate, said optical cavity including an active layer formed of any of GaNAs, GaInNAs, GaNAsSb and GaInNAsSb, and an optical modulator comprising an optical absorption layer formed of any of GaNAs, GaInNAs, GaNAsSb and GaInNAsSb, said surface-emission laser diode and said optical modulator being integrated monolithically on said GaAs substrate in a direction perpendicular to said substrate, said optical modulator being provided in said optical cavity at a location below said active layer or inside said lower optical reflector, wherein there is provided a non-optical recombination elimination layer of a GaInAsP system between said lower semiconductor distributed reflector and said optical absorption layer.

Similarly as before, the non-optical recombination layer is free from Al and may be formed by any of GaInAsP, GaInP or GaAsP.

In this mode of the invention, too, the non-optical recombination elimination layer effectively blocks the non-optical recombination of overflowing carriers from the active layer 2406.

By providing the optical absorption layer 2403 at the side of the lower reflector, which is far from the optical window from which the optical beam is emitted, with respect to the active layer, a large magnitude of optical modulation becomes possible with a small change of optical absorption coefficient, in view of the fact that the reflector used at the opposite side of the optical window is designed to have a larger reflectance as compared with the distributed Bragg reflector located at the side of the optical window. Thereby, the integrated semiconductor optical device provides an improved S/N ratio of optical modulation.

<Embodiment 13>

Figure 23:
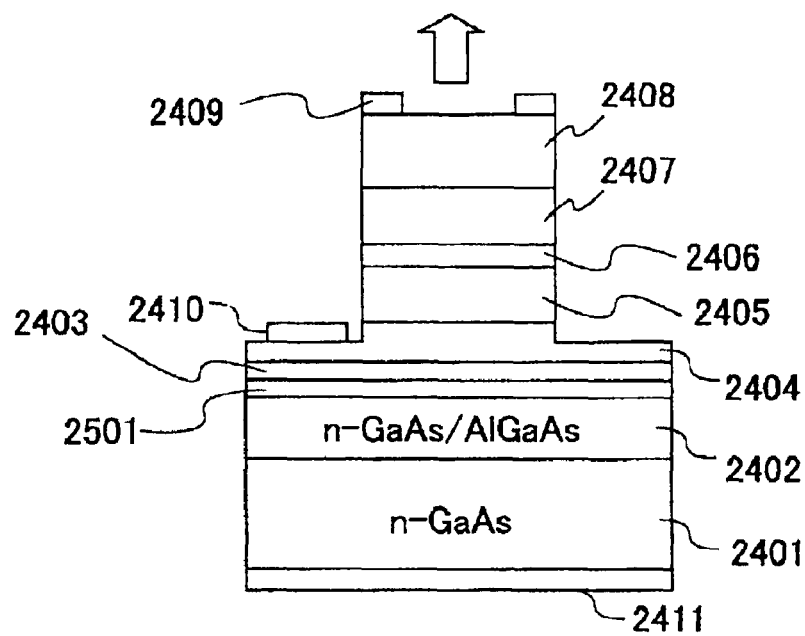
FIG. 23 is a diagram showing the construction of an integrated semiconductor light-emitting device according to another embodiment of the present invention.

FIG. 23 shows an example of the integrated semiconductor optical modulator of the present mode of the invention, wherein those parts corresponding to the parts described previously are designated by the same reference numerals and the description thereof will be omitted.

Referring to FIG. 23, it can be seen that the active layer 2406 is now provided in the pillar-shaped mesa structure between the GaAs spacer layers 2405 and 2406, and the optical absorption layer 2403 forming the optical modulator is located near the lower distributed Bragg reflector 2402 at the far side of the optical window formed in the electrode 2409 with regard to the active layer 2406. Further, the non-optical recombination layer 2501 is provided between the lower distributed Bragg reflector 2402 and the optical absorption layer 2403.

Similarly as before, there is conducted an Al-removal process after the lower distributed Bragg reflector 2402 is formed by conducting a purging process or evacuation process, and a growth interruption surface is formed on the top surface of the lower distributed Bragg reflector 2402. Thus, by providing the widegap, Al-free non-optical recombination elimination layer 2501 of GaInP on such a growth interruption surface, the carriers overflowing from the active layer 2406 to the lower distributed Bragg reflector 2402 is effectively blocked and the problem of increased leakage current caused by the non-optical recombination of overflowing carriers is effectively eliminated.

Further, by conducting the Al-removal process after the growth of the lower distributed Bragg reflector 2402 and further forming the non-optical recombination layer 2501 before the growth of the GaInNAs optical absorption layer 2403, the quality of the optical absorption layer 2403 is improved and the problem of breakdown upon application of a large reverse bias voltage is eliminated successfully. Thereby, the integrated semiconductor light-emitting device of FIG. 23 shows improved reliability.

[Twenty-First Mode of Invention]

In a twenty-first mode, the present invention provides an integrated semiconductor optical modulator similar to the device of the nineteenth mode or twentieth mode of the invention except that all the semiconductor layers provided between the active layer and the optical absorption layer is formed of a material of the GaInAsP system. Here, it should be noted that the GaInAsP system includes Al-free materials such as GaAs, GaInP, GaInAsP, GaAsP, GaInAs, and the like. The material of the GaInAsP may further contain elements such as B, N, Sb or a dopant element.

According to the present mode of the invention, there occurs no increase of Al concentration level in the growth chamber after the Al-removal process is conducted. Thereby, no Al-removal process is necessary between the step of forming the optical absorption layer and the active layer, and thus, no growth interruption surface is formed. Thus, the efficiency of optical emission is improved and simultaneously the leakage current of the optical modulator is suppressed.

<Embodiment 14>

Figure 24:
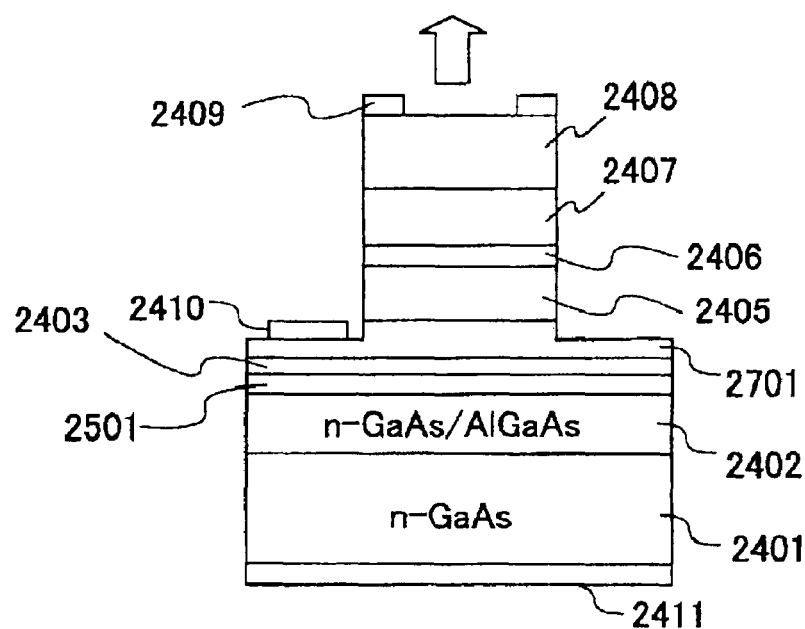
FIG. 24 is a diagram showing the construction of an integrated semiconductor light-emitting device according to another embodiment of the present invention.

FIG. 24 shows the construction of the integrated semiconductor light-emitting device according to an embodiment of the present invention, wherein those parts corresponding to the parts described previously are designated by the same reference numerals and the description thereof will be omitted.

Referring to FIG. 24, the integrated semiconductor light-emitting device has a construction similar to that of FIG. 23 except that the n-type distributed Bragg reflector 2404 of FIG. 23 is formed of an n-type distributed Bragg reflector 2701 having an alternate repetition of a GaAs high refractive index layer and a GaInP low refractive index layer having a lattice matching composition to GaAs.

In such a structure, there occurs no change of increase of Al concentration level in the growth chamber after the Al-removal process is conducted when the lower distributed Bragg reflector 2402 is formed. Therefore, there is no need of conducting another Al-removal process between the step of forming the optical absorption layer 2403 and the step of forming the active layer 2406. Thereby, there is no possibility of formation of growth interruption surface between the optical absorption layer 2403 and the active layer 2406, and the efficiency of optical emission in the active layer 2406 is improved, while simultaneously minimizing the leakage current.

[Twenty-Second Embodiment]

In a twenty-second mode, the present invention provides an integrated semiconductor light-emitting device similar to that of the twenty-first mode of the invention, except that the semiconductor layer provided between the active layer and the optical absorption layer has n-type conductivity.

In a surface-emission laser diode, it is practiced to provide a current confinement structure by selectively oxidizing an AlAs layer. By oxidizing the AlAs layer selectively from a lateral direction, there is formed an insulating AlOx region so as to surround a non-oxidized AlAs core region, and the electric current is concentrated to the non-oxidized AlAs core region thus formed.

Generally, such an AlAs/AlOx current confinement structure is provided at the p-type side of the surface-emission laser diode in view of smaller mobility of holes. More specifically, by providing such an AlAs/AlOx current confinement structure in the path of the holes, the lateral spreading of the holes that may take place after being confined by the current confinement structure but before being injected into the active layer is minimized as compared with the case of providing such a current confinement structure in the path of electrons. In the case of electrons, there occurs an extensive spreading of electrons once confined by the AlAs/AlOx current confinement structure as a result of the very large mobility of electron. Thus, it is necessary to provide the current confinement structure, and hence the AlAs layer, in the p-type side of the surface-emission laser diode.

In the present mode of the invention, the semiconductor layer provided between the active layer and the optical absorption layer has the n-type conductivity. Thus, the AlAs layer used for the current confinement structure is provided at the outer side of the active layer. With this, the process of forming such an AlAs layer does not cause the problem of increase of the Al concentration level at the time of the step of forming the active layer, as the active layer is formed before the step of forming the AlAs layer. Thereby, the problem of degradation of the light-emission efficiency of the active layer is eliminated, in addition to the feature of forming the current confinement structure.

It should be noted that the selective oxidation layer used for the selective oxidation process for forming the AlOx layer is not limited to AlAs but an AlGaAs layer may be used as long as the Al content in the AlGaAs layer is 90% or more.

<Example 15>

Figure 25:
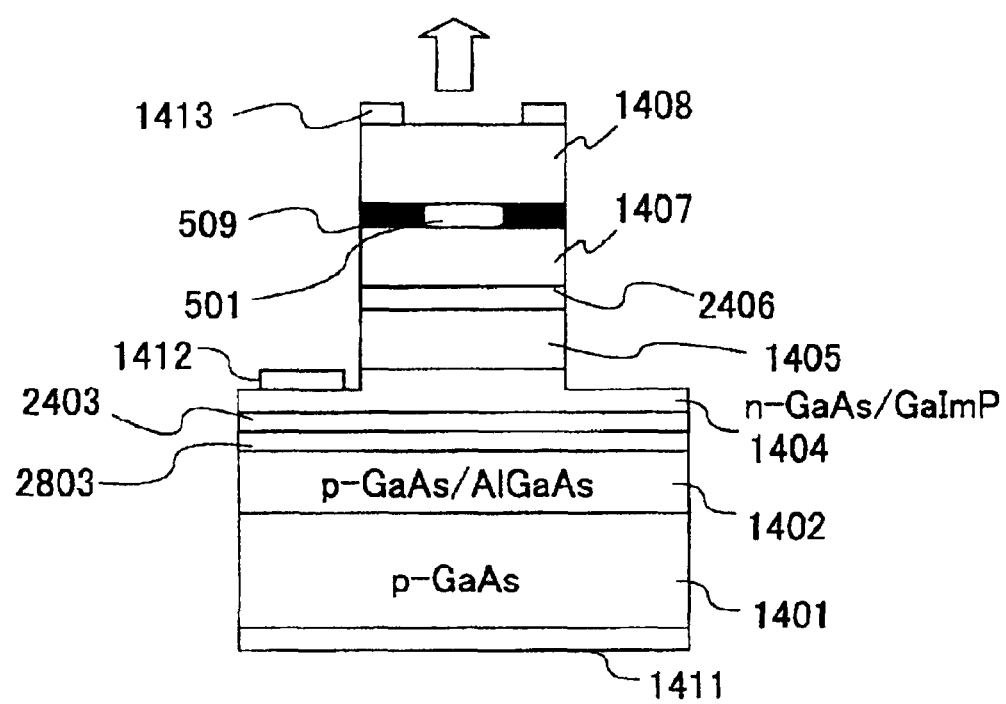
FIG. 25 is a diagram showing the construction of an integrated semiconductor light-emitting device according to another embodiment of the present invention.

FIG. 25 shows the construction of the integrated semiconductor light-emitting device according to an embodiment of the present invention, wherein those parts corresponding to the parts described previously are designated by the same reference numerals and the description thereof will be omitted.

Referring to FIG. 25, the device is substantially identical with the device of FIG. 14 explained before except that there is provided an optical recombination elimination layer 2803 of p-type GaInP and that the active layer 1406 of the GaAs/AlGaAs multiple quantum well structure is replaced with the active layer 2406 having the GaInNAs/GaAs multiple quantum well structure.

Thus, after the formation of the p-type lower distributed Bragg reflector-1402 of the GaAs/AlGaAs structure, the growth of the semiconductor layers is interrupted and the Al-removal process is conducted.

After the Al-removal process, the p-type GaInP non-optical recombination elimination layer 2803 is formed on the growth interruption surface of the lower distributed Bragg reflector 1402 thus formed, and the GaInNAs optical absorption layer 1403 is formed on the non-optical recombination elimination layer 2803.

As already noted, the AlAs layer 501 is formed after the GaInNAs active layer 2406 is formed.

As other aspect of the device of FIG. 25 are already explained with reference to FIG. 14, further description thereof will be omitted.

[Twenty-Third Mode of Invention]

In a twenty-third mode, the present invention provides an integrated semiconductor light-emitting device as set forth in the previous mode of the present invention, wherein the semiconductor optical modulator is disposed inside the distributed Bragg reflector of the surface-emission laser diode such that the optical absorption layer is provided in a high refractive index layer of the distributed Bragg reflector having an optical thickness of ¾ wavelength at a location offset by a distance of ¼ wavelength from the surface of the high refractive index layer at the side of the active layer.

When integrating an optical modulator with a surface-emission laser diode, it is necessary to form the optical modulator such that the phase matching condition of the laser diode is not disturbed. In order to satisfy this requirement, the present mode of the invention forms the optical absorption layer inside a high refractive index layer having a ¾ wavelength optical thickness with an offset from the end surface thereof located at the side of the active layer.

By doing so, it should further be noted that the optical absorption layer is located at the anti-node of the optical standing wave formed in the distributed Bragg reflector. Thereby, the reflectance of the distributed Bragg reflector is modulated efficiently and the optical modulator can be driven with a small drive voltage.

In the distributed Bragg reflector forming a λ-cavity, the anti-node of the optical standing wave is located at the interface of the high refractive index layer and the low refractive index layer. Thus, when an optical absorption layer is formed in such an interface, the optical standing wave is disturbed in view of the fact that the optical absorption layer has a refractive index larger than the high refractive index layer of the distributed Bragg reflector.

Because of the situation noted above, the present invention provides the optical absorption layer in the high refractive index layer having the optical thickness of ¾ wavelength. In this case, the phase matching condition is easily satisfied.

<Embodiment 16>

Figure 26:
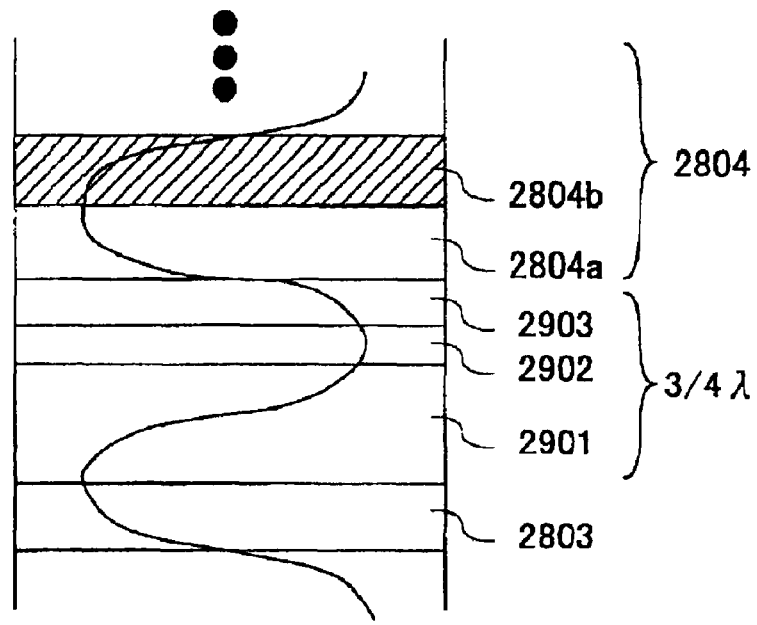
FIG. 26 is a diagram showing the construction of an integrated semiconductor light-emitting device according to another embodiment of the present invention in an enlarged scale.

FIG. 26 shows a part of the n-type GaAs/GaInP distributed Bragg reflector 2804 used in the present invention, wherein the distributed Bragg reflector 2804 corresponds to the distributed Bragg reflector 1404 of FIG. 25.

Referring to FIG. 26 it can be seen that there is provided a non-optical recombination elimination layer 2803 of p-type GaInP in correspondence to the layer 2803 of FIG. 25, and a GaAs layer 2901 is formed as a lower intermediate layer. Further, a GaInNAs/GaAs multiple quantum well optical absorption layer 2902 is formed on the intermediate layer 2901 and upper intermediate layer 2903 of GaAs is formed further on the optical absorption layer 2902. On the upper intermediate layer 2903, there are formed a low refractive index layer 2804a of n-type GaInP and a high refractive index layer 2804b of n-type GaAs alternately, each with an optical thickness of one-quarter of the laser oscillation wavelength. Thereby, it should be noted that the low-refractive index layer 2804a makes a direct contact with the intermediate layer 2903.

Here, it should be noted that the GaInP non-optical recombination elimination layer 2803 has an optical thickness of one quarter of the laser oscillation wavelength, and the total thickness of the layers 2901, 2902 and 2903 is set to be equal to three quarter of the laser oscillation wavelength. Further, the optical absorption layer 2902 is located with an offset from the surface of the layer 2903 contacting with the GaInP layer 2804a, which is a surface defining a "¾ wavelength structure" including the layers 2901, 2902 and 2903 at the side of the active layer, with a distance of one quarter of the laser oscillation wavelength.

In such a construction of FIG. 26, it should be noted that the foregoing ¾ wavelength structure, formed of the layers 2901-2903, in fact has an optical thickness of an integer multiple of one quarter of the laser oscillation wavelength and functions as a part of the lower distributed Bragg reflector. Thus, thereby there is no disturbance on the function of the distributed Bragg reflector.

As noted previously, the optical absorption layer 2901 thus formed is located at the anti-node of the optical standing wave formed in the distributed Bragg reflector and can modulate the reflectance of the reflector efficiently with a minimum driving voltage.

[Twenty-Fourth Mode of Invention]

In a twenty-fourth mode, the present invention provides an integrated semiconductor light-emitting device as set forth in the twenty-third mode of the present invention, wherein there are provided two repetitions of the low refractive index layer and the high refractive index layer in the distributed. Bragg reflector between the optical absorption layer and the optical cavity.

Here, it should be noted that the low refractive index layer (having a large bandgap) in the foregoing two-period reflector structure located at the side of the optical cavity functions so as to block the leakage of carriers overflowing from the GaAs spacer layer. Thereby, the efficiency of carrier confinement is improved and the temperature characteristics of the laser diode are improved.

On the other hand, the low refractive index layer in the foregoing two-period reflector structure located at the side of the optical absorption layer functions so as to block the minority carriers formed in the optical absorption layer, and thus suppressing the breakdown.

In the present mode of the invention, it should further be noted that an ohmic electrode is provided on the high refractive index layer sandwiched by a pair of the low refractive index layers, wherein it should be noted that this ohmic electrode is used commonly by the surface-emission laser diode for injecting the drive current and by the optical modulator for applying a modulation signal. Thus, it will be understood that there are provided low refractive index layers of widegap material respectively between the ohmic contact layer and the active layer and between the ohmic contact layer and the optical absorption layer, and thus, there is no problem such as the leakage current flowing directly to the electrode.

In addition, it can be seen that the optical absorption layer is provided closest to the optical cavity in the distributed Bragg reflector in correspondence to the anti-node of the optical standing wave formed in the distributed Bragg reflector. Thus, it is possible to absorb the optical radiation efficiently by the optical absorption layer.

From the viewpoint of the periodical optical distribution, the efficiency of optical modulation becomes maximum when the optical absorption layer is provided in the vicinity of the optical cavity in correspondence to the anti-node of the optical distribution. It is preferable to provide the optical absorption layer within the distance of 5 pairs from the optical cavity and most preferable to provide within the distance of 2 pairs.

It is preferable that the two-period distributed Bragg reflector provided between the optical absorption layer and the optical cavity is formed of the material system free from Al such as the GaInAsP system. By using such an Al-free materials, there occurs no problem of residual Al in the growth chamber and the Al-removal process can be omitted before the growth of the optical absorption layer or the active layer.
<Embodiment 17>

Figure 27:
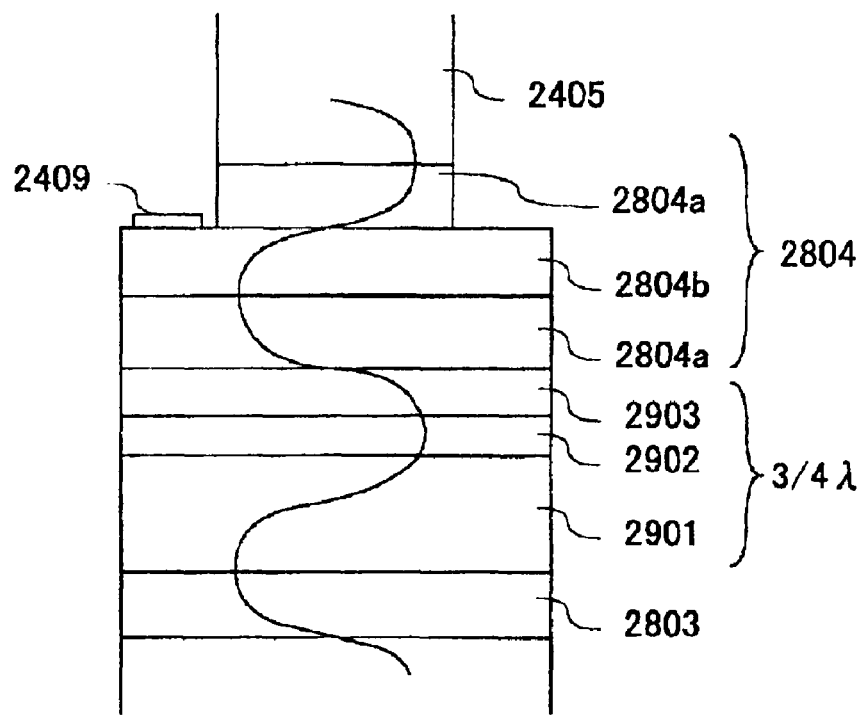
FIG. 27 is a diagram showing the construction of an integrated semiconductor light-emitting device according to another embodiment of the present invention in an enlarged scale.

FIG. 27 shows a part of the integrated semiconductor light-emitting device of the present mode of the invention in detail, wherein those parts corresponding to the parts described previously are designated by the same reference numerals and the description thereof will be omitted.

Referring to FIG. 27 showing a layered structure similar to that of FIG. 26, it should be noted that the p-type lower distributed Bragg reflector 2804 is formed of a consecutive stacking of a low refractive index layer 2804a of n-type GaInP having the one-quarter optical thickness, a high refractive index layer 2804b of n-type GaAs also having the one-quarter optical thickness, and a low refractive index layer of n-type GaInP having the one-quarter optical thickness, thus, there is formed a distributed Bragg reflector of about two periods, including the upper intermediate layer 2903 of GaAs in addition to the foregoing layers 2804a and 2804b, between the optical absorption layer 2902 and the lower GaAs spacer layer 2405.

In such a structure, the low refractive index layer 2804a of widegap n-type GaInP located closer to the GaAs spacer layer 2405 effectively blocks the carriers (minority carriers) from causing overflowing out of the lower GaAs spacer layer 2405, and the efficiency of carrier confinement into the active layer is improved. Thereby, the temperature characteristics of the integrated semiconductor light-emitting device are improved.

On the other hand, the GaInP low refractive index layer 9804a of the two-period distributed Bragg reflector located closer to the optical absorption layer 902 effectively blocks the minority carriers produced in the optical absorption layer 902 and suppresses the occurrence of breakdown in the optical absorption layer 902, which is applied with reverse biasing.

Further, it should be noted the electrode 2409 is formed on the n-type GaAs high refractive index layer 2804b as the common electrode for the surface-emission laser diode and the optical modulator. In such a construction, the active region of the laser diode such as the layer 2405 is separated from the layer 2804b carrying the common electrode 2409 by the widegap low refractive index layer 2804a. Similarly, the optical absorption layer 2902 is separated from the layer 2804b by the widegap low refractive index layer 2804a. Thus, the problem of leakage current flowing directly to the common electrode 2409 is eliminated.

In the construction of FIG. 27, too, the optical absorption layer 2902 is provided in correspondence to the anti-node (third anti-node from the active layer 2406) of the optical standing wave formed in the distributed Bragg reflector. Thus, it is possible to achieve an effective optical modulation by a small change of optical absorption coefficient in the optical absorption layer 2902, and the integrated light-emitting semiconductor device can be driven with a low modulation voltage.

[Twenty-Fifth Mode of Invention]

In a twenty-fifth mode, the present invention provides a modification of the twenty second mode in which there are provided upper and lower selective-oxidation layers above the active layer and below the optical absorption layer, excluding the region between the optical absorption layer and the active layer.

The selective oxidation layer provided in the p-type region adjacent to the active layer confines the electric current injected into the active layer and suppresses the threshold current of the surface-emission laser diode.

On the other hand, the selective oxidation layer proved in the p-type region adjacent to the optical absorption layer confines the electric field to the part of the optical absorption layer, corresponding to the region of the active layer to which the injection of the electric current is made as a result of the current confinement.

Thus, in such a construction, it is possible to reduce the bandgap of the optical absorption layer in correspondence to the part where there is formed a strong lateral intensity distribution in the surface-emission laser diode, and an efficient optical absorption is realized.
<Embodiment 18>

Figure 28:
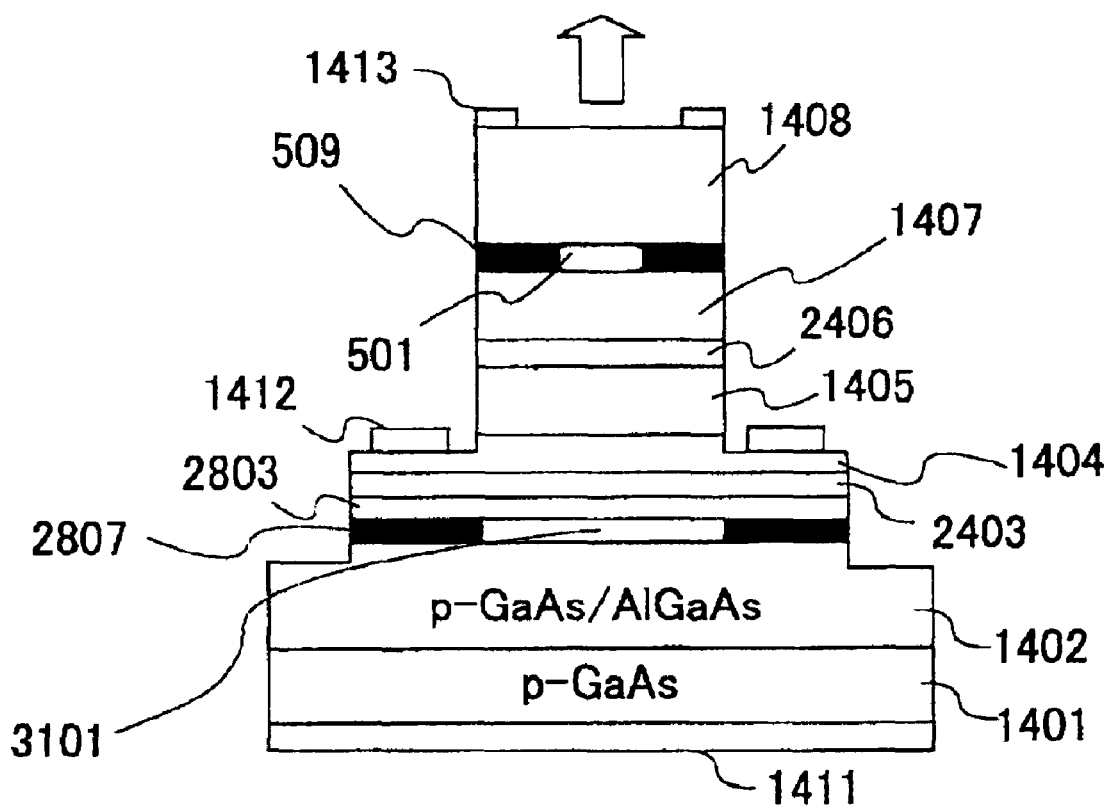
FIG. 28 is a diagram showing the construction of an integrated semiconductor light-emitting device according to another embodiment of the present invention.

FIG. 28 shows the construction of an integrated semiconductor light-emitting device according to the present mode of the invention, wherein those parts corresponding to the parts described previously are designated by the same reference numerals and the description thereof will be omitted.

Referring to FIG. 28, the semiconductor device has a layered structure similar to that of the device of FIG. 25 except that there is formed a selective oxidation layer 3101 of AlAs between the p-type GaAs/AlGaAs distributed Bragg reflector 1402 and the non-optical recombination elimination layer 2803 of GaInP.

The layered structure thus formed is subjected to a mesa etching process to form a structure two-step pillar structure including a first pillar in which the layers 1404-501 are included and a second, larger pillar in which the layers 1402-1404 are included.

In the first pillar, the lateral surface of the AlAs selective oxidation layer 501 is exposed and the AlOx insulation region 509 is formed in the layer 501 so as to surround a core part of the AlAs layer 501 by applying a selective oxidation process such that the oxidation process proceeds from the exposed lateral surface toward the interior of the AlAs selective oxidation layer 501.

In the second pillar, on the other hand, the lateral surface of the AlAs selective oxidation layer 3101 is exposed and an AlOx insulation region 2807 is formed in the AlAs layer 3101 by applying a selective oxidation process such that the oxidation process proceeds laterally from the foregoing exposed lateral surface toward the central core region of the AlAs layer 3101.

When forming the integrated semiconductor light-emitting device, it is preferable to conduct the lateral oxidation process for forming the AlOx regions 509 and 2807 simultaneously.

In the construction of FIG. 28, it should be noted that the growth of the semiconductor layer is stopped after the AlAs layer 3101 is formed and the Al-removal process explained before is conducted for reducing residual Al from the growth chamber. Further, by providing the GaInP non-optical recombination elimination layer 2803 on the growth interruption surface thus formed, the carriers are blocked from escaping to the growth interruption surface and the problem of non-optical recombination of carriers is suppressed effectively.

Further, the present invention is not limited to the embodiments described heretofore, but various variations and modifications may be made without departing from the scope of the invention.

For example, it is possible to construct an optical transmission system by using the integrated semiconductor light-emitting device of the eighteenth through twenty-fifth mode of the present invention similarly to the construction of FIG. 12 explained before.

The present invention is based on Japanese priority patent applications 2001-069816 filed on Mar. 13, 2001, 2001-070289 filed on Mar. 13, 2001, 2001-323209 filed on Oct. 22, 2001, 2002-009834 filed on Jan. 18, 2002 and 2002-044303 filed on Feb. 21, 2002, the entire contents thereof are incorporated herein as reference.

What is claimed is:

1. A semiconductor optical amplifier, comprising:
a GaAs substrate;
a gain region formed on said GaAs substrate; and
p-side and an n-side electrodes for injecting electric current into said gain region,
said gain region comprising a semiconductor layer selected from the group consisting of: GaNAs, GaInNAs, GaNAsSb and GaInNAsSb,
said gain region having an incident end and an exit end, said semiconductor optical amplifier amplifying a laser beam incident to said incident end and emitting said laser beam from said exit end after amplification, and
wherein said gain region has a multiple quantum well structure including a stack of a plurality of quantum well layers, said quantum well layers having a composition selected from the group consisting of GaNAs, GaInNAs, GaNAsSb and GaInNAsSb, said quantum well layers each having a respective bandgap that is different from that of the other quantum well layers.

2. A semiconductor optical amplifier as claimed in claim 1, wherein said semiconductor optical amplifier further comprises means for suppressing laser oscillation in a Fabry-Perot mode.

3. A semiconductor optical amplifier as claimed in claim 1, wherein said semiconductor optical amplifier further comprises anti-reflecting coatings provided to said incident end and exit end for suppressing laser oscillation in a Fabry-Perot mode.

4. A semiconductor optical amplifier as claimed in claim 1, wherein said semiconductor optical amplifier further comprises an optical window provided in the vicinity of said exit end for suppressing laser oscillation in a Fabry-Perot mode.

* * * * *